(12) United States Patent  
Osada

(10) Patent No.: US 9,270,229 B2
(45) Date of Patent: *Feb. 23, 2016

(54) POWER STORAGE DEVICE AND SEMICONDUCTOR DEVICE PROVIDED WITH THE POWER STORAGE DEVICE

(71) Applicant: Semiconductor Energy Laboratory Co., Ltd., Atsugi-shi, Kanagawa-ken (JP)

(72) Inventor: Takeshi Osada, Isehara (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/489,935

(22) Filed: Sep. 18, 2014

(65) Prior Publication Data

US 2015/0002093 A1    Jan. 1, 2015

Related U.S. Application Data

(60) Continuation of application No. 13/106,261, filed on May 12, 2011, now Pat. No. 8,847,556, which is a division of application No. 12/840,373, filed on Jul. 21, 2010, now Pat. No. 7,944,172, which is a division of application No. 11/889,449, filed on Aug. 13, 2007, now Pat. No. 7,764,046.

(30) Foreign Application Priority Data

Aug. 31, 2006 (JP) ................................. 2006-236229

(51) Int. Cl.
*H02J 7/00* (2006.01)
*H03D 9/00* (2006.01)
(Continued)

(52) U.S. Cl.
CPC ................ *H03D 9/00* (2013.01); *H01F 38/14* (2013.01); *H01M 10/0436* (2013.01);
(Continued)

(58) Field of Classification Search
CPC ... H01M 10/0436; H01M 10/44; H02J 7/042; H02J 17/00; H02J 7/025; H02J 7/045; H01F 38/14; H03D 9/00; H04B 5/0037
USPC .......................... 320/108, 137; 235/487, 492
See application file for complete search history.

(56) References Cited

U.S. PATENT DOCUMENTS 5,172,045 A    12/1992  Takeyasu
5,604,928 A    2/1997   Hamano et al.
(Continued)

FOREIGN PATENT DOCUMENTS

CN    001384547 A    12/2002
EP    0673103 A      9/1995
(Continued)

OTHER PUBLICATIONS

Chinese Office Action (Application No. 201210146119.0) Dated Jan. 2, 2014.

*Primary Examiner* — M'Baye Diao
(74) *Attorney, Agent, or Firm* — Robinson Intellectual Property Law Office; Eric J. Robinson

(57) ABSTRACT

An object is to provide a power storage device provided with a battery that is a power storage means, for safe and accurate supply of electric power in a short period of time for drive power supply voltage without checking remaining capacity of the battery or changing batteries with deterioration over time of the battery for drive power supply voltage. The power storage device is provided with a battery that is a power storage means as a power supply for supplying electric power and a counter circuit for counting charging time of the power storage means. An electromagnetic wave with electric field intensity, magnetic field intensity, and power flux density per unit time which are transmitted from a power feeder are controlled, and the power storage means is efficiently charged using the electromagnetic wave in a short period of time.

16 Claims, 29 Drawing Sheets

(51) Int. Cl.
*H02J 7/04* (2006.01)
*H01M 10/04* (2006.01)
*H01M 10/44* (2006.01)
*H02J 17/00* (2006.01)
*H01F 38/14* (2006.01)
*H02J 7/02* (2006.01)
*H04B 5/00* (2006.01)

(52) U.S. Cl.
CPC ............. *H01M 10/44* (2013.01); *H02J 7/025* (2013.01); *H02J 7/042* (2013.01); *H02J 7/045* (2013.01); *H02J 17/00* (2013.01); *H04B 5/0037* (2013.01); *Y02B 40/90* (2013.01); *Y02E 60/12* (2013.01); *Y10T 307/625* (2015.04)

(56) References Cited

U.S. PATENT DOCUMENTS

| | | | |
|---|---|---|---|
| 5,608,306 A | | 3/1997 | Rydbeck et al. |
| 5,864,220 A | | 1/1999 | Reipur et al. |
| 5,965,997 A | * | 10/1999 | Alwardi .............. G01R 31/3606 320/132 |
| 6,097,296 A | | 8/2000 | Garza et al. |
| 6,291,973 B1 | | 9/2001 | Lee |
| 6,369,712 B2 | * | 4/2002 | Letkomiller ............ B60C 23/20 340/425.5 |
| 6,447,448 B1 | | 9/2002 | Ishikawa et al. |
| 6,740,939 B2 | | 5/2004 | Sayama et al. |
| 6,809,952 B2 | | 10/2004 | Masui |
| 7,121,472 B2 | | 10/2006 | Shimizu et al. |
| 7,260,371 B1 | * | 8/2007 | Yones .................. H04W 52/42 340/10.1 |
| 7,394,382 B2 | | 7/2008 | Nitzan et al. |
| 7,466,208 B2 | * | 12/2008 | Osada .................... H03K 5/133 331/177 R |
| 7,510,950 B2 | * | 3/2009 | Tsurume .......... G06K 19/07749 235/492 |
| 7,737,658 B2 | | 6/2010 | Sennami et al. |
| 7,822,383 B2 | | 10/2010 | Miyagawa et al. |
| 8,013,568 B2 | | 9/2011 | Park et al. |
| 2004/0080474 A1 | | 4/2004 | Kimura |
| 2005/0156560 A1 | | 7/2005 | Shimaoka et al. |
| 2007/0057073 A1 | | 3/2007 | Mamba et al. |
| 2009/0065588 A1 | * | 3/2009 | Aoki ................ G06K 19/07749 235/492 |

FOREIGN PATENT DOCUMENTS

| | | |
|---|---|---|
| EP | 0984540 A | 3/2000 |
| EP | 0984541 A | 3/2000 |
| EP | 0984542 A | 3/2000 |
| JP | 63-168964 A | 7/1988 |
| JP | 05-137274 A | 6/1993 |
| JP | 06-203876 A | 7/1994 |
| JP | 09-500520 | 1/1997 |
| JP | 10-174298 A | 6/1998 |
| JP | 10-295047 A | 11/1998 |
| JP | 2000-060010 A | 2/2000 |
| JP | 2000-090220 A | 3/2000 |
| JP | 2000-224775 A | 8/2000 |
| JP | 2003-111301 A | 4/2003 |
| JP | 2003-299255 A | 10/2003 |
| JP | 2004-007851 A | 1/2004 |
| JP | 2005-150022 A | 6/2005 |
| JP | 2005-250545 A | 9/2005 |
| JP | 2006-004015 A | 1/2006 |
| KR | 10-0543779 | 1/2006 |
| KR | 2007-0014949 A | 2/2007 |
| WO | WO-95/25375 | 9/1995 |
| WO | WO-2007/013726 | 2/2007 |

* cited by examiner

FIG. 16A
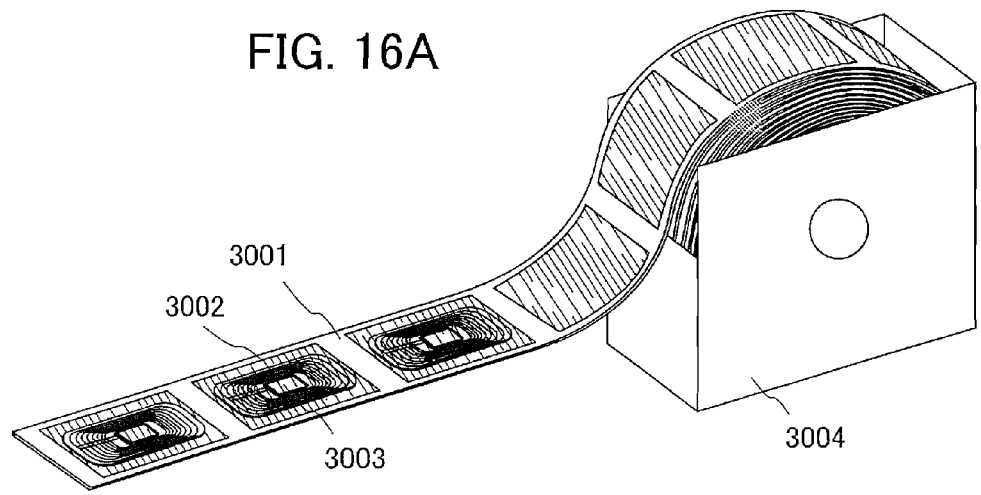
FIG. 16B
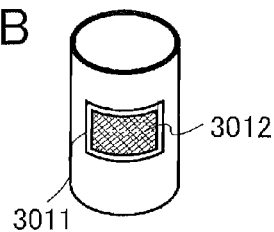
FIG. 16C
FIG. 16D
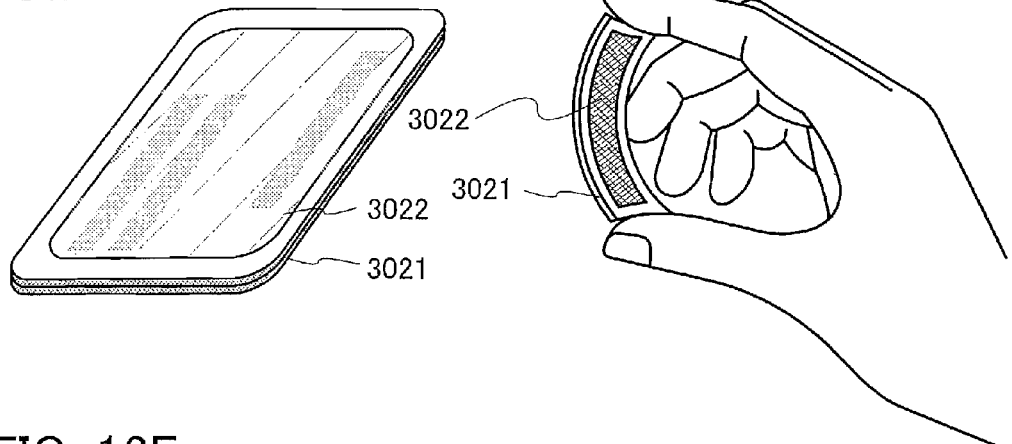
FIG. 16E
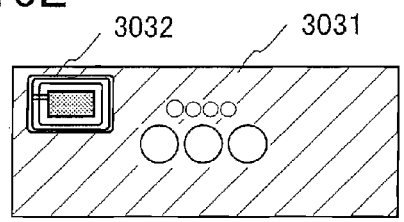

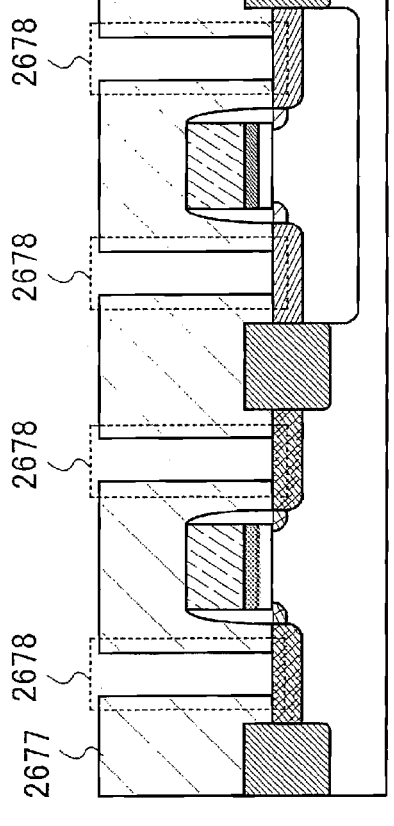
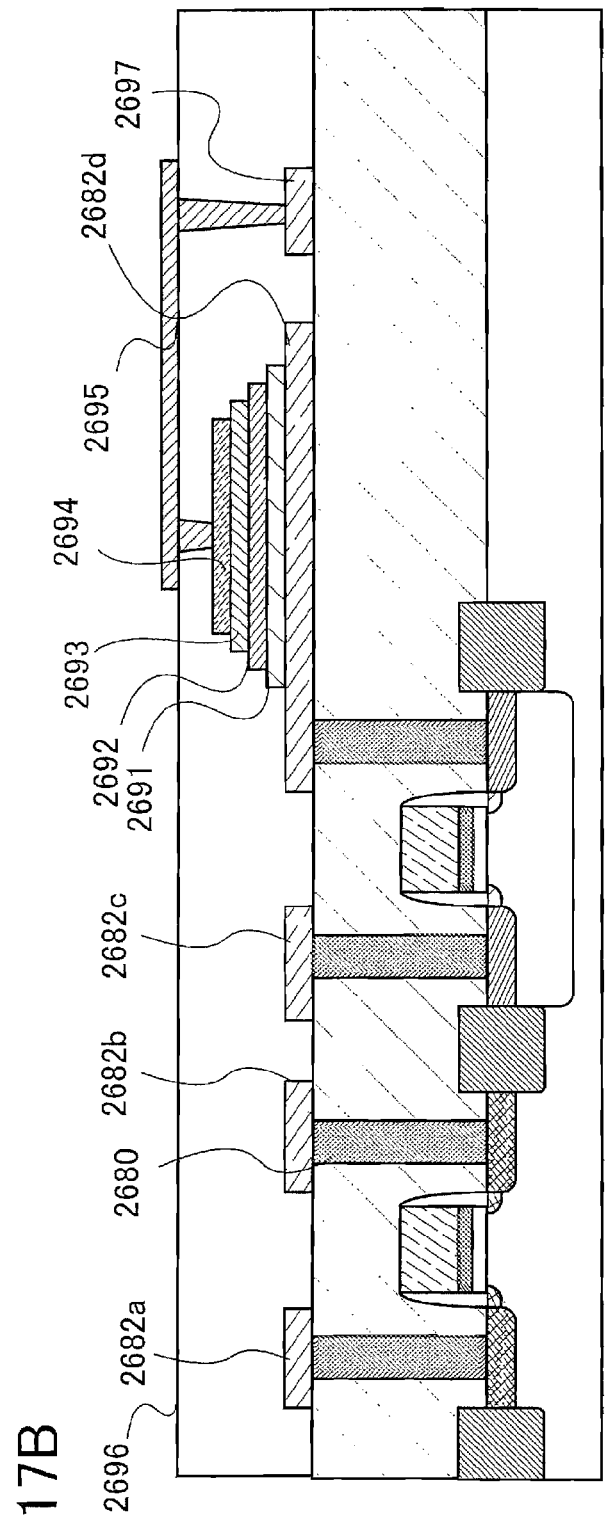
FIG. 17A
FIG. 17B

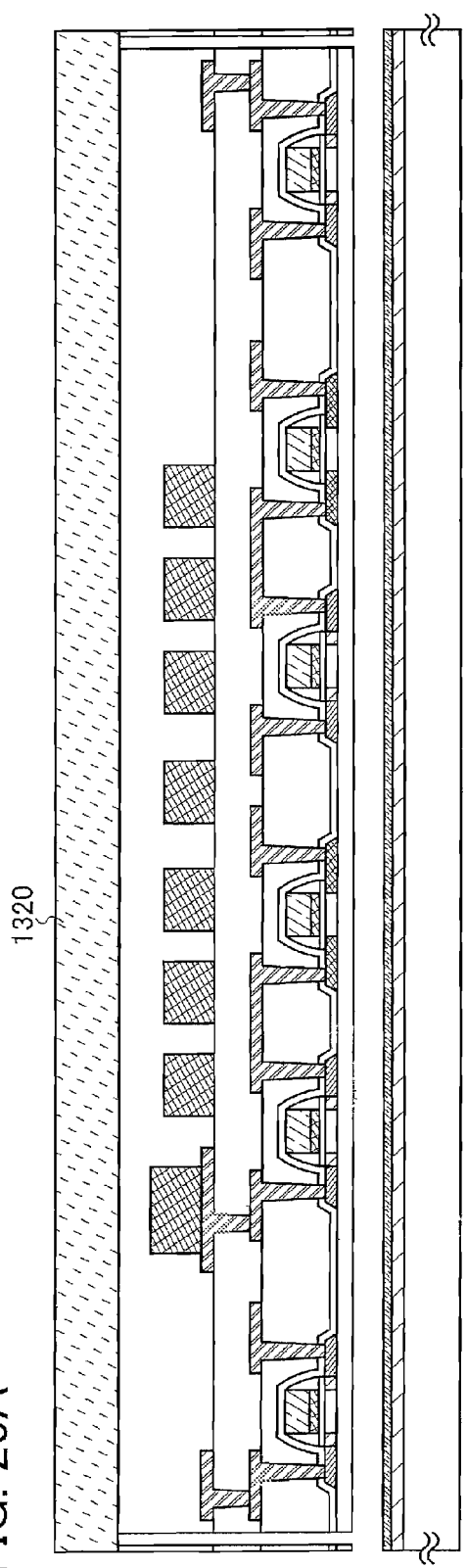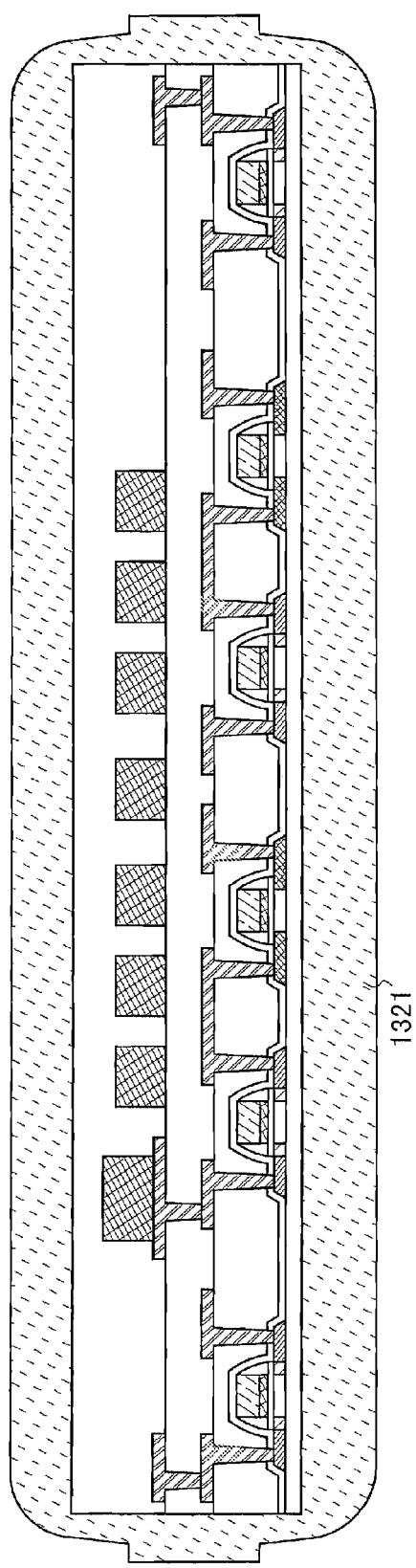
FIG. 20A
FIG. 20B

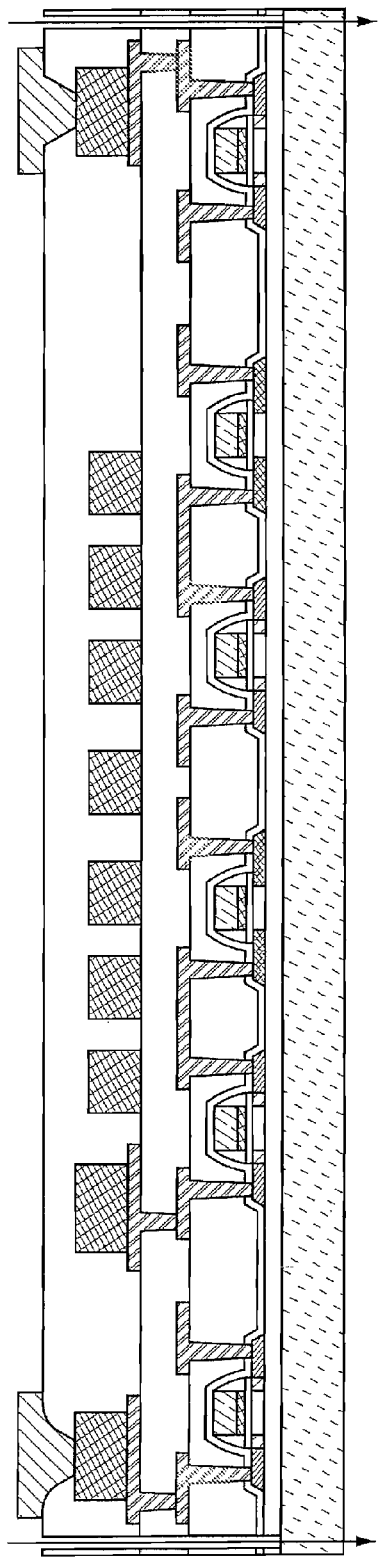
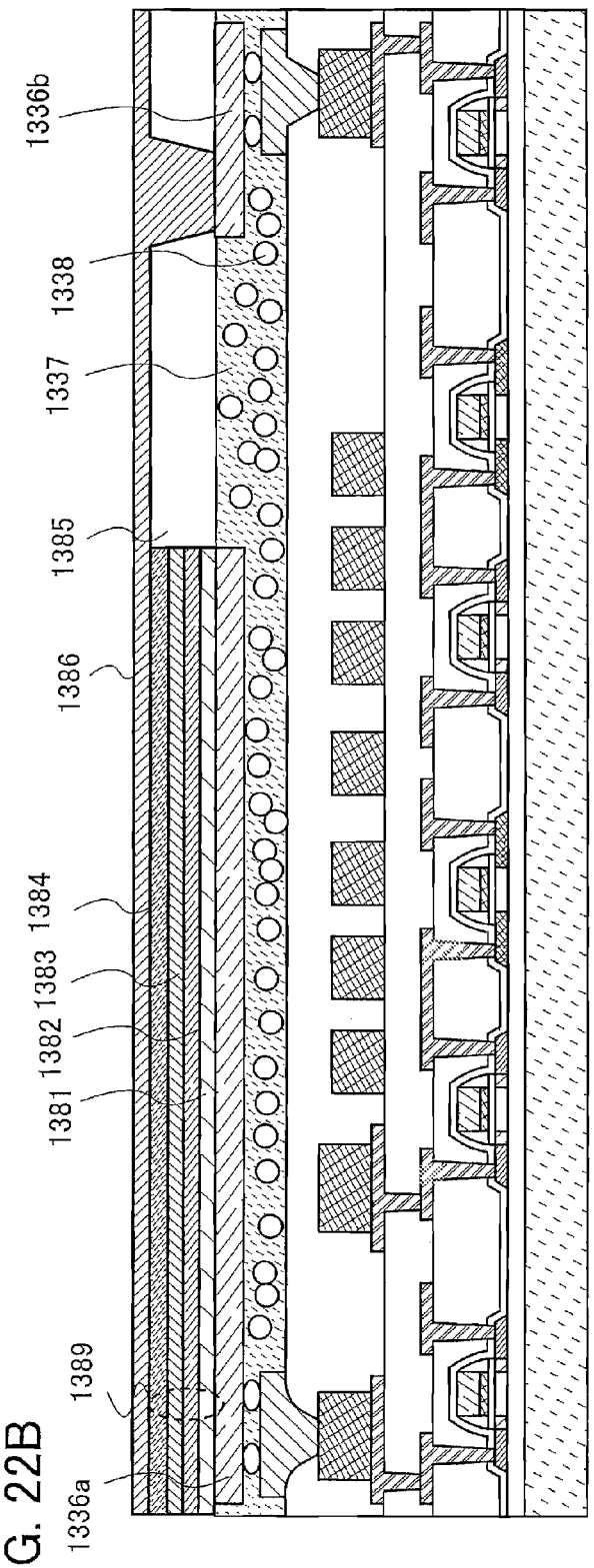

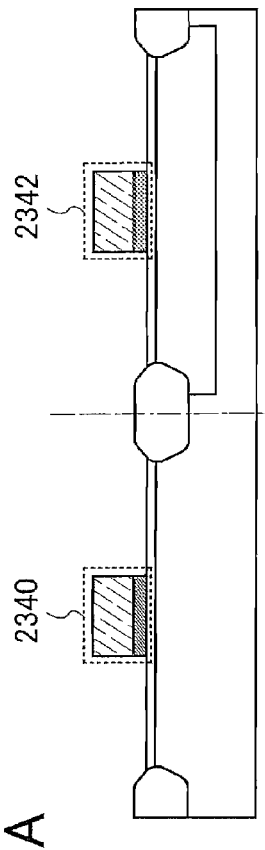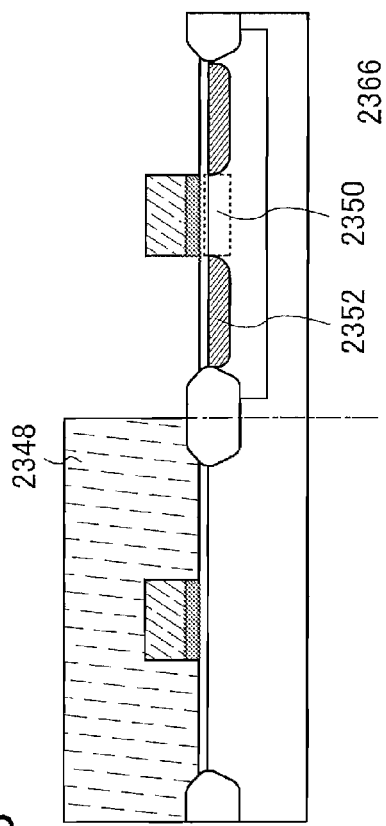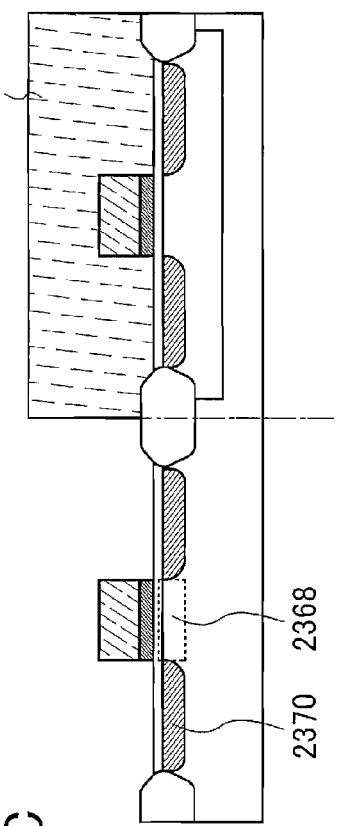

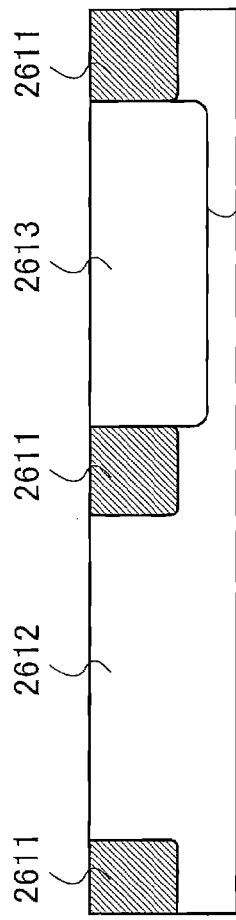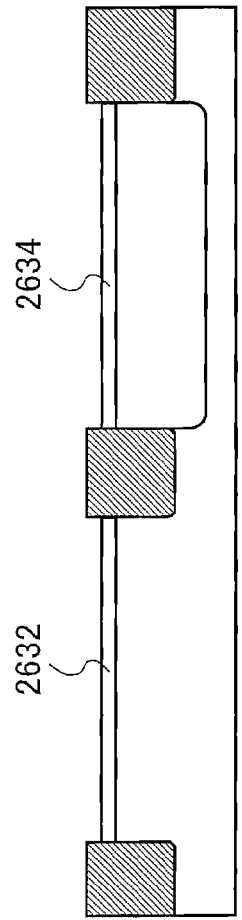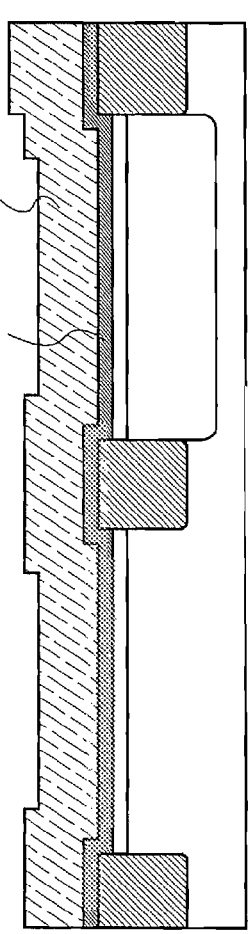

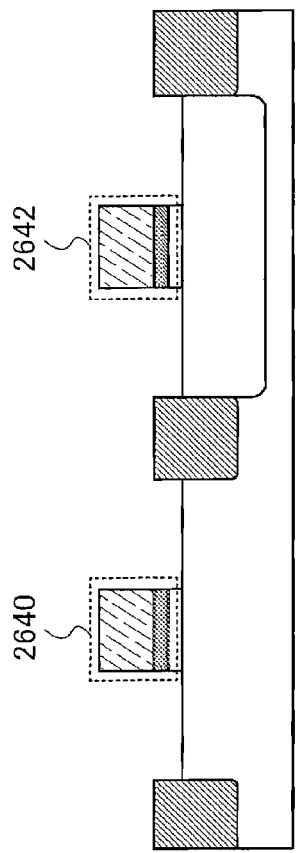
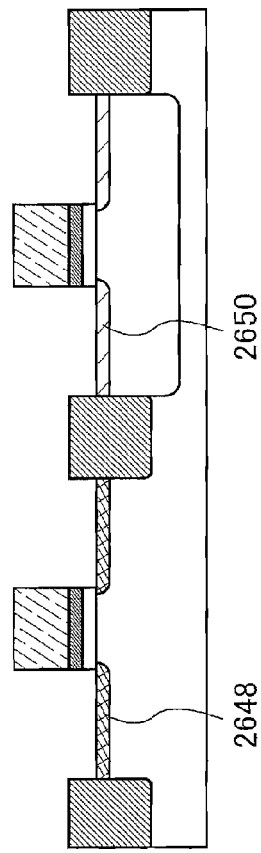
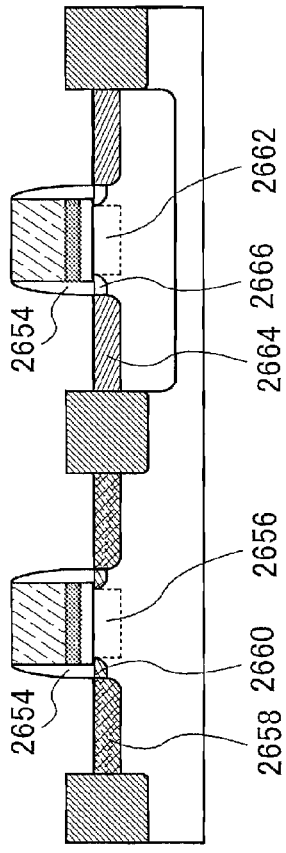
FIG. 28A
FIG. 28B
FIG. 28C 2901 chip
2902B antenna
2902A antenna 2901 chip
2902D antenna
2902E antenna
2902C antenna

POWER STORAGE DEVICE AND SEMICONDUCTOR DEVICE PROVIDED WITH THE POWER STORAGE DEVICE

BACKGROUND OF THE INVENTION

1. Field of the Invention

The present invention relates to a power storage device. In particular, the present invention relates to a power storage device which is charged with electric power through an electromagnetic wave. Furthermore, the present invention relates to a charging system using a power storage device provided with an antenna and a power feeder which supplies electric power to the power storage device through an electromagnetic wave.

A "power storage device" mentioned in this specification refers to a general device which stores electric power by an electromagnetic wave transmitted from an external power supply device (power feeder). In addition, a battery which stores power by wireless reception of an electromagnetic wave is referred to as a wireless battery (RF battery: Radio Frequency Battery).

2. Description of the Related Art

Various electronic appliances are coming into wide use, and a wide variety of products are on the market. In particular, in recent years, the spread of portable electronic appliances has been marked. For example, mobile phones, digital video cameras, and the like have become very convenient because of high-definition display portions, increased durability of batteries, and further reduction in power consumption of the batteries. A portable electronic appliance has a structure in which a battery that is a power storage means is built in. Thus, a power supply for driving the portable electronic appliance is secured by the battery. As matters now stand, as the battery, a battery such as a lithium ion battery is used, and the battery is directly charged from an AC adaptor which is plugged into a household AC power supply that is a power supply means.

Moreover, in recent years, development of a power storage device which stores electric energy wirelessly so that a portable appliance can be charged also in a place without a commercial power supply has been advanced (e.g., see Patent Document 1: Japanese Published Patent Application No. 2003-299255).

SUMMARY OF THE INVENTION

However, in an example of a power storage device described in Patent Document 1, when an electromagnetic wave with high electric field intensity is supplied to the power storage device for supplying high electric power in a short period of time, effects on the human body are concerned. In addition, as for supply of an electromagnetic wave with high electric field intensity to a power storage device for supplying high electric power in a short period of time, there is a regal regulation on transmission of an electromagnetic wave with a certain amount or more of electric field intensity, magnetic field intensity, or power flux density per unit time.

Moreover, when a power storage device is charged, especially when a plurality of power storage devices is charged, they might not be sufficiently charged with electromagnetic wave attenuation. For example, there has been a problem in that if voltage applied to a battery included in the power storage device is not higher than a certain value, charging is not performed in some cases, and accordingly, it is hard to charge the plurality of power storage devices.

There has been a problem in that when charging of a power storage device is completed or interrupted for some cause, measures such as prevention measures against overcharging and stop of supply of unnecessary electric power through an electromagnetic wave are taken on a power feeder, under a condition that electric power is intermittently supplied from the power feeder through the electromagnetic wave.

It is an object of the present invention to provide a power storage device provided with a battery that is a power storage means, for safe and accurate supply of electric power in a short period of time for drive power supply voltage without checking remaining capacity of the battery or changing batteries with deterioration over time of the battery for drive power supply voltage.

In order to solve the above-described problems, it is a feature of the present invention that a power storage device is provided with a battery that is a power storage means as a power supply for supplying electric power and a counter circuit for counting storage time of the power storage means. According to another feature of the present invention, an electromagnetic wave with electric field intensity, magnetic field intensity, and power flux density per unit time, which is transmitted from a power feeder, is controlled and the power storage means is efficiently charged using the electromagnetic wave in a short period of time. Hereinafter, a specific structure of the present invention is described.

According to one feature of the present invention, a power storage device includes an antenna; a battery; a power supply portion including a rectifier circuit connected to the antenna, a charging control circuit that is connected to the rectifier circuit and controls charging of the battery, and a power supply circuit that is connected to the battery and controls electric power supplied to a load; and a charging determination portion including a demodulation circuit that demodulates a signal inputted to the antenna, a determination circuit that determines whether the battery is in a charging state or a non-charging state in accordance with the signal and outputs a signal that switches the charging state and the non-charging state, a counter circuit that counts charging time of the battery and outputs the counted time to the determination circuit, and a modulation circuit that modulates a signal to be outputted to an external portion in accordance with the charging state or the non-charging state determined by the determination circuit.

According to another feature of the present invention, a power storage device includes an antenna; a battery; a charging management circuit connected to the battery; a power supply portion including a rectifier circuit connected to the antenna, a charging control circuit that is connected to the rectifier circuit and controls charging of the battery, and a power supply circuit that is connected to the battery and controls electric power supplied to a load; and a charging determination portion including a demodulation circuit that demodulates a signal inputted to the antenna, a determination circuit that determines whether the battery is in a charging state or a non-charging state in accordance with the signal and outputs a signal that switches the charging state and the non-charging state, a counter circuit that counts charging time of the battery and outputs the counted time to the determination circuit, and a modulation circuit that modulates a signal to be outputted to an external portion in accordance with the charging state or the non-charging state determined by the determination circuit, or a signal from the charging management circuit.

The battery of the present invention may be a lithium battery, a nickel metal hydride battery, a nickel cadmium battery, an organic radical battery, or a double-layer electrolytic capacitor.

The battery of the present invention may be formed of a negative electrode active material layer, a solid electrolyte layer over the negative electrode active material layer, a positive electrode active material layer over the solid electrolyte layer, and a current-collecting thin film over the positive electrode active material layer.

The charging control circuit of the present invention may have a regulator and a diode.

The charging control circuit of the present invention may have a structure including a regulator and a switch, in which the switch is in a conductive state when the determination circuit determines that the switch is in a charging state and is in a nonconductive state when the determination circuit determines that the switch is in a non-charging state.

The power supply circuit of the present invention may have a structure including a regulator and a switch, in which the switch is in a nonconductive state when the determination circuit determines that the switch is in a charging state and is in a conductive state when the determination circuit determines that the switch is in a non-charging state.

In the present invention, the power supply circuit may include a Schmitt trigger.

The present invention includes a semiconductor device in which a load is a signal processing circuit which includes an amplifier, a modulation circuit, a demodulation circuit, a logic circuit, a memory control circuit, and a memory circuit.

The semiconductor device of the present invention is an IC label, an IC tag, or an IC card.

It is to be noted that description "being connected" in the present invention includes electrical connection and direct connection. Therefore, in structures disclosed in the present invention, another element capable of electrical connection (e.g., a switch, a transistor, a capacitor, an inductor, a resistor, a diode, or the like) may be interposed between elements having a predetermined connection relation. Alternatively, the elements may be directly connected without another element interposed therebetween. It is to be noted that the case where the connection is directly performed without any element capable of electrical connection interposed therebetween, which is the case including only the state of direct connection except for the case where the connection is electrically performed, is described as "being directly connected". It is to be noted that description "being electrically connected" includes either the state where the connection is electrically performed or the state where the connection is directly performed.

Since the power storage device of the present invention employs a structure having a power storage means, electric power can be supplied to a load without checking remaining capacity of the battery or changing batteries with deterioration over time of the battery for drive power supply voltage.

In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted for some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged.

Moreover, since the power storage device of the present invention is provided with the counter circuit inside, the power storage device can receive an electromagnetic wave with a certain amount or more of electric field intensity, magnetic field intensity, or power flux density even if the average of electric power is the same.

BRIEF DESCRIPTION OF DRAWINGS

In the accompanying drawings:

FIGS. 16A to 16E are views each explaining a structure of Embodiment 5;

FIGS. 17A and 17B are diagrams each explaining a structure of Embodiment 4;

FIGS. 20A and 20B are diagrams each explaining a structure of Embodiment 2;

FIGS. 22A and 22B are diagrams each explaining a structure of Embodiment 2;

FIGS. 24A to 24C are diagrams each explaining a structure of Embodiment 3;

FIGS. 27A to 27C are diagrams each explaining a structure of Embodiment 4;

FIGS. 28A to 28C are diagrams each explaining a structure of Embodiment 4; and

DETAILED DESCRIPTION OF THE INVENTION

Figure 1:
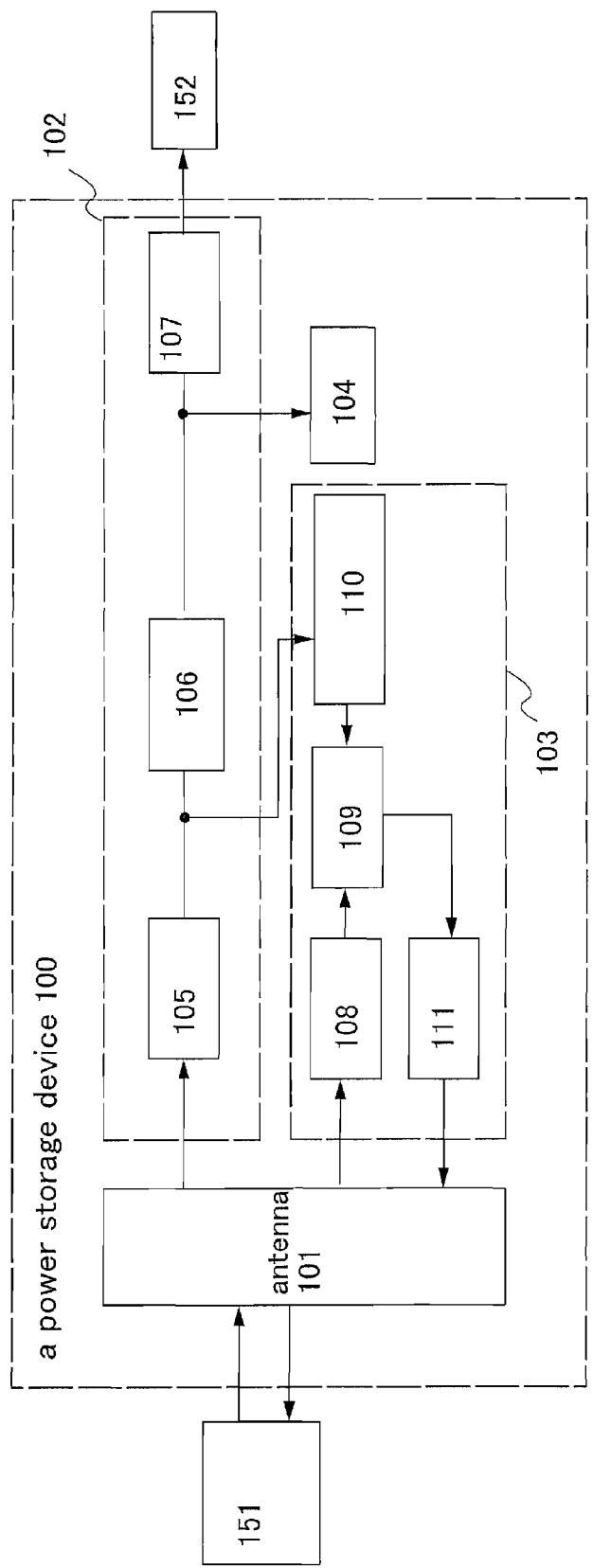
FIG. 1 is a diagram explaining a structure of Embodiment Mode 1.

Embodiment modes of the present invention will be hereinafter explained with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be interpreted as being limited to the description of Embodiment Modes. It is to be noted that, in the drawings hereinafter shown, the same portions or portions having similar functions are denoted by the same reference numerals, and repeated explanation thereof will be omitted.

Embodiment Mode 1

One structural example of a power storage device of the present invention will be explained with reference to block diagrams shown in FIG. 1 and FIGS. 2A and 2B. It is to be noted that the case where the power storage device is charged by a power feeder that is a power supply means will be explained in this embodiment mode.

Figure 2A:
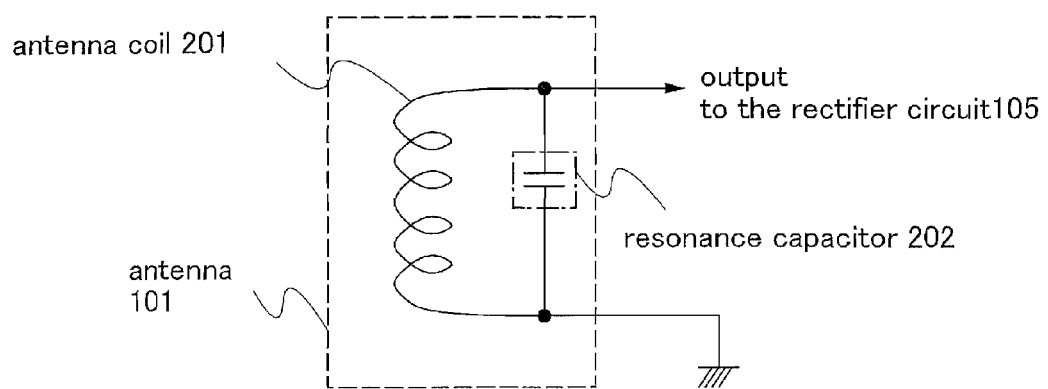
FIGS. 2A and 2B are diagrams each explaining a structure of Embodiment Mode 1.
Figure 2B:
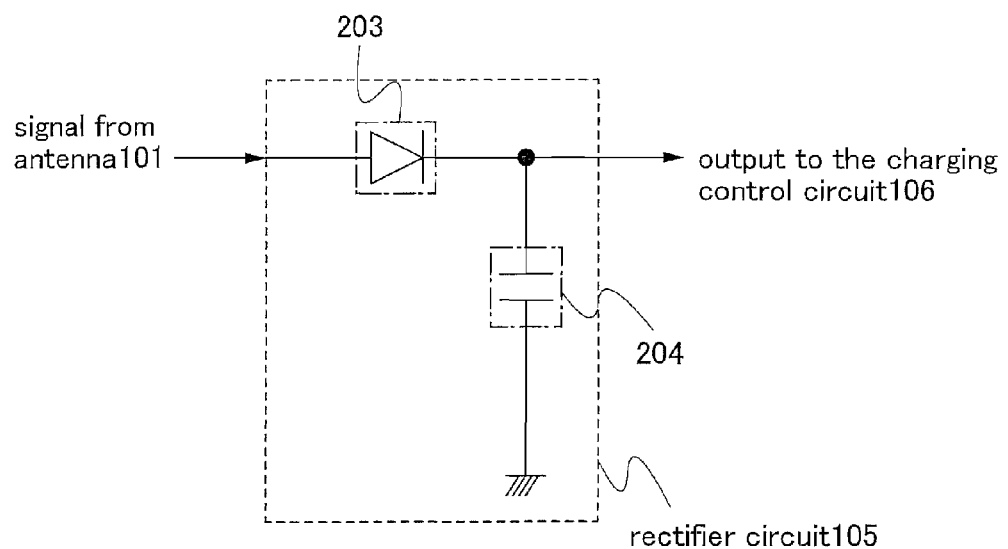

A power storage device 100 shown in FIG. 1 includes an antenna 101, a power supply portion 102, a charging determination portion 103, and a battery 104. Electric power is supplied to the power storage device 100 by a power feeder 151, and the electric power stored in the battery 104 in the power storage device 100 is supplied to a load 152. The power supply portion 102 includes a rectifier circuit 105 that rectifies an electromagnetic wave inputted to the antenna 101, a charging control circuit 106 that controls charging of the battery 104 with electric power from the rectifier circuit 105, and a power supply circuit 107 for controlling supply of the electric power charged by the battery 104 to the load 152. The charging determination portion 103 includes a demodulation circuit 108 for demodulating a signal inputted to the antenna 101, a determination circuit 109 that determines whether the battery 104 is in a charging state or in a non-charging state in accordance with the signal inputted from the antenna 101 and outputs a signal for switching the charging state and the non-charging state, a counter circuit 110 for counting charging time of the battery 104 and outputting the counted time to the determination circuit 109, and a modulation circuit 111 for modulating a signal to be outputted to an external portion in accordance with the charging state or the non-charging state determined by the determination circuit 109.

A structure of the power supply portion 102 is explained in detail.

In the power storage device 100 shown in FIG. 1, the antenna 101 receives an electromagnetic wave from the power feeder 151 and outputs the electromagnetic wave to the rectifier circuit 105. It is to be noted that as an electromagnetic wave transmission method applied between the antenna 101 in the power storage device 100 of the present invention and the power feeder 151, an electromagnetic coupling method, an electromagnetic induction method, a microwave method, and the like can be employed. The transmission method may be appropriately selected by a practitioner in consideration of an intended use. An antenna with optimal length and shape may be provided in accordance with the transmission method.

In the case of employing, for example, an electromagnetic coupling method or an electromagnetic induction method (e.g., a 13.56 MHz band) as the transmission method, electromagnetic induction caused by a change in magnetic field density is used. Therefore, a conductive film functioning as an antenna is formed in an annular shape (e.g., a loop antenna) or a spiral shape (e.g., a spiral antenna). A specific example of an antenna circuit is shown in FIG. 2A. In FIG. 2A, the antenna 101 includes an antenna coil 201 and a resonance capacitor 202. It is to be noted that, in the antenna 101 shown in FIG. 2A, the antenna coil 201 and the resonance capacitor 202 are connected in parallel. In the structure shown in FIG. 2A, a variable capacitor is used as the resonance capacitor 202 and the capacitance value is controlled, so that the frequency of a received electromagnetic wave can be variable.

In the case of employing a microwave method (e.g., a UHF band (860 to 960 MHz band), a 2.45 GHz band, or the like) as the transmission system, a length or a shape of the conductive film functioning as an antenna may be appropriately set in consideration of a wavelength of an electromagnetic wave used for signal transmission. The conductive film functioning as an antenna can be formed in, for example, a linear shape (e.g., a dipole antenna), a flat shape (e.g., a patch antenna), and the like. The shape of the conductive film functioning as an antenna is not limited to a linear shape, and the conductive film functioning as an antenna may be formed in a curved-line shape, a meander shape, or a combination thereof, in consideration of the wavelength of the electromagnetic wave.

Figure 29A:
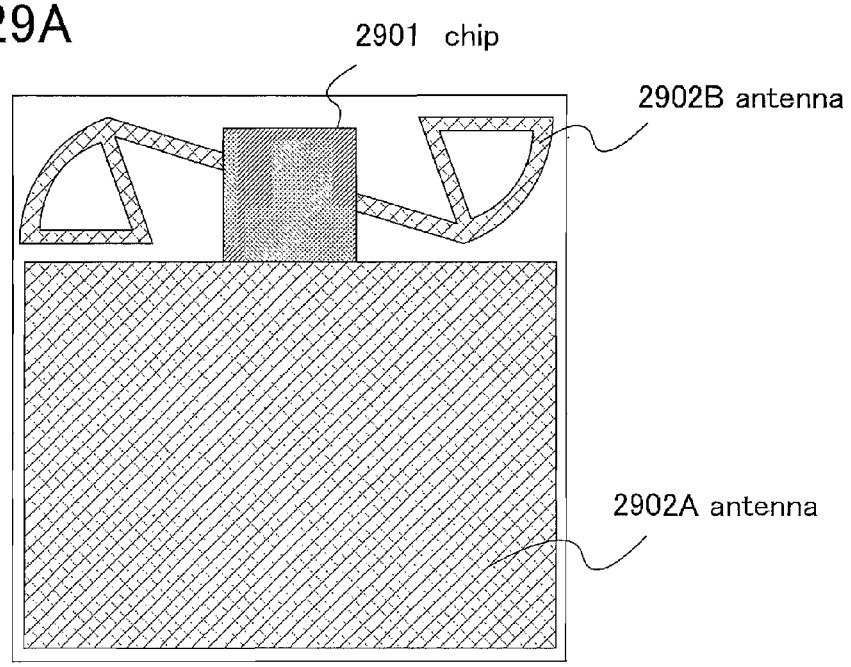
FIGS. 29A and 29B are diagrams each explaining a structure of Embodiment Mode 1.
Figure 29B:
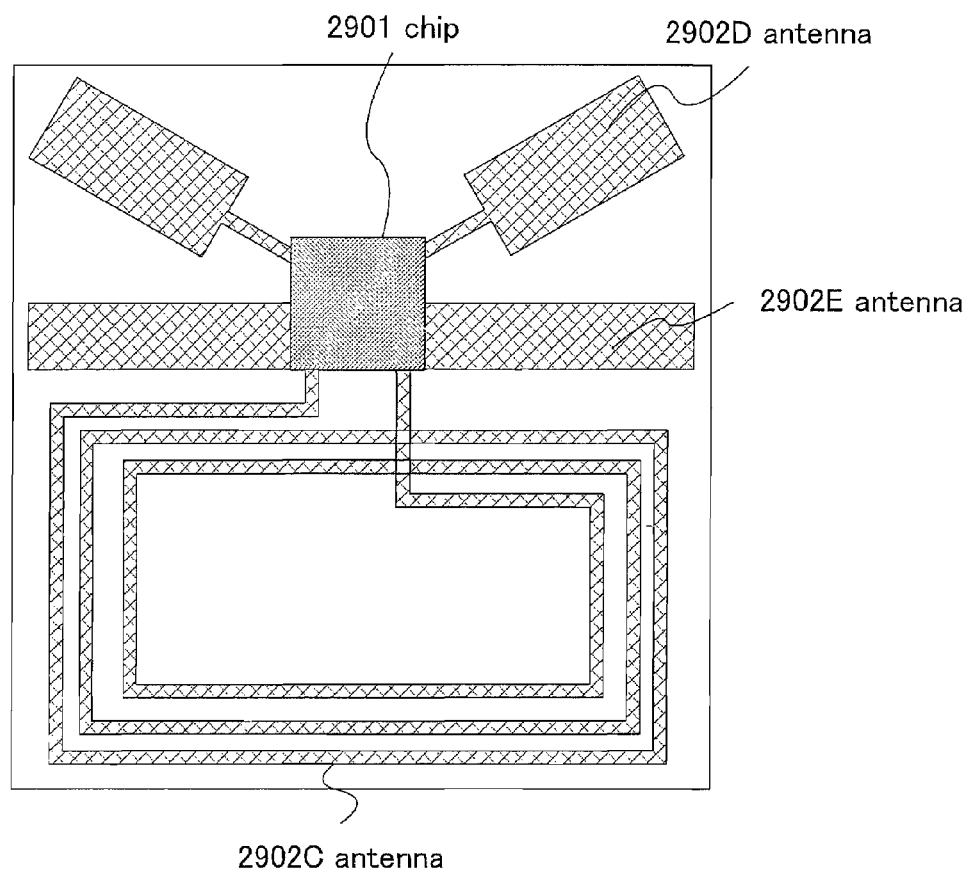

It is to be noted that antennas with a plurality of shapes may be combined to be formed as one antenna and an antenna corresponding to reception of an electromagnetic wave with a plurality of frequency bands may be employed as the antenna 101 in the power storage device 100 of the present invention. A shape of an antenna is shown in FIGS. 29A and 29B as an example. For example, a structure may be employed, as shown in FIG. 29A, in which an antenna 2902A and an antenna 2902B that is 180° omnidirectional (capable of receiving from any direction) are provided all around a chip 2901 provided with a power supply portion, a charging determination portion, and the like. In addition, a structure may also be employed, as shown in FIG. 29B, in which a thin coiled antenna 2902C, an antenna 2902D for receiving an electromagnetic wave with high frequency, and an antenna 2902E that is extended in a stick shape are provided around the chip 2901 provided with the power supply portion, the charging determination portion, and the like. The antennas with a plurality of shapes are provided as shown in FIGS. 29A and 29B, so that a power storage device corresponding to reception of electromagnetic waves with a plurality of frequency bands can be obtained.

The frequency of an electromagnetic wave transmitted from the power feeder 151 to the antenna 101 is not particularly limited. For example, any of the following frequencies can be used: greater than or equal to 300 GHz and less than 3 THz that is a submillimeter wave, greater than or equal to 30 GHz and less than 300 GHz that is a millimeter wave, greater than or equal to 3 GHz and less than 30 GHz that is a microwave, greater than or equal to 300 MHz and less than 3 GHz that is an ultrahigh frequency wave, greater than or equal to 30 MHz and less than 300 MHz that is a very high frequency wave, greater than or equal to 3 MHz and less than 30 MHz that is a high frequency wave, greater than or equal to 300 kHz and less than 3 MHz that is a medium frequency wave, greater than or equal to 30 kHz and less than 300 kHz that is a low frequency wave, and greater than or equal to 3 kHz and less than 30 kHz that is a very low frequency wave.

In addition, in the present invention, a signal indicating to the power feeder 151 whether the power storage device 100 is in a charging state or a non-charging state is transmitted and received between the power feeder 151 and the power storage device 100. An electromagnetic wave transmitted from the power feeder 151 to the antenna 101 at this time is a signal of which a carrier wave is modulated. A modulation method of the carrier wave may be either one of analog modulation or digital modulation, or any of amplitude modulation, phase modulation, frequency modulation, and spread spectrum. Amplitude modulation or frequency modulation is desirably employed.

Figure 3A:
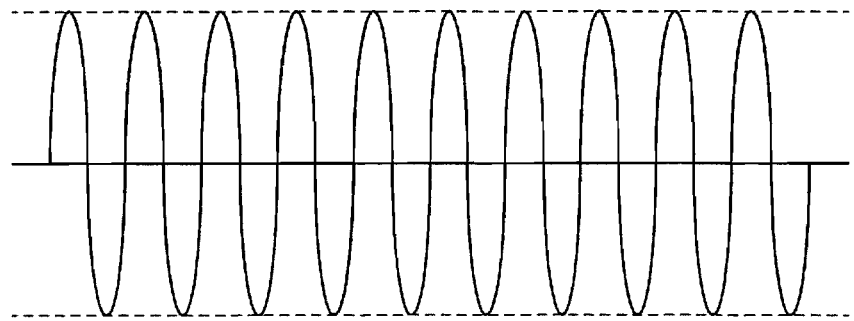
FIGS. 3A to 3C are diagrams each explaining a structure of Embodiment Mode 1.
Figure 3B:
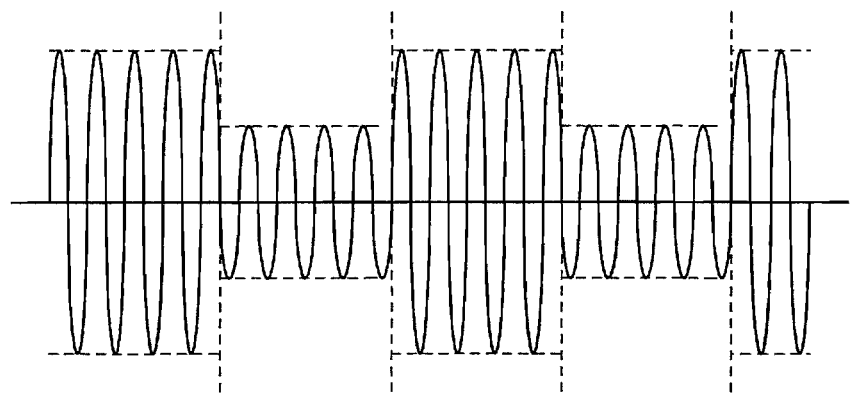
Figure 3C:
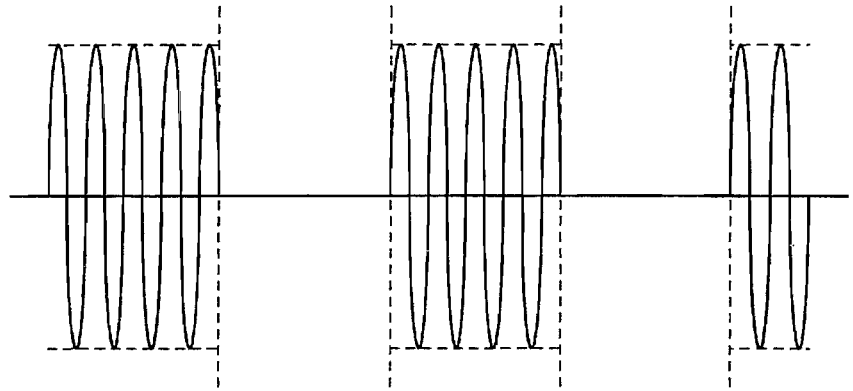

Moreover, the frequency of an electromagnetic wave for charging and the frequency of an electromagnetic wave for communication for starting charging, which are transmitted from the power feeder 151 to the power storage device 100, may be different from each other. In that case, as the electromagnetic wave for charging, an electromagnetic wave with equal amplitude as shown in FIG. 3A can be employed, and as the electromagnetic wave for communication, an electromagnetic wave with different amplitude as shown in FIG. 3B or 3C can be employed. In addition, as the electromagnetic wave for communication, an electromagnetic wave with a different frequency or a different phase can be employed as well.

In the power storage device 100 in FIG. 1, an electromagnetic wave inputted from the power feeder 151 to the antenna 101 is converted into an AC electric signal by the antenna 101 and rectified by the rectifier circuit 105. It is to be noted that the rectifier circuit 105 is acceptable as long as it is a circuit that converts an AC signal induced by an electromagnetic wave received by the antenna 101 into a DC signal by rectification and smoothing. For example, as shown in FIG. 2B, the rectifier circuit 105 may include a diode 203 and a smoothing capacitor 204.

Figure 4A:
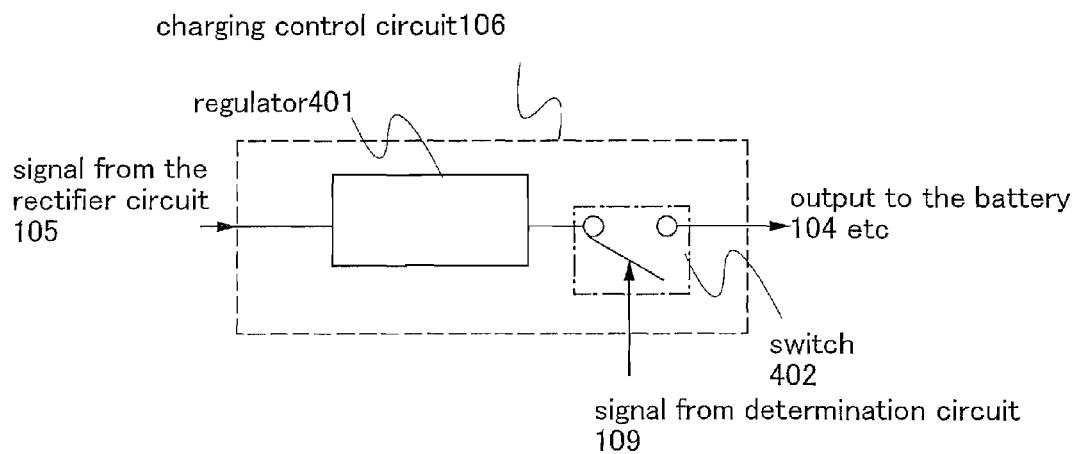
FIGS. 4A and 4B are diagrams each explaining a structure of Embodiment Mode 1.
Figure 4B:
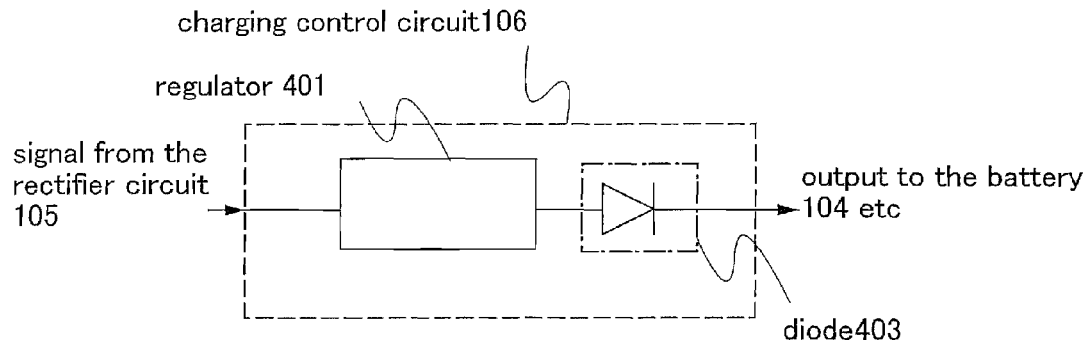

In the power storage device 100 in FIG. 1, the electric signal rectified by the rectifier circuit 105 is inputted to the charging control circuit 106. The charging control circuit 106 controls the voltage level of the electric signal inputted from the rectifier circuit 105 and outputs the electric signal of which the voltage level has been controlled to the battery 104. A specific structure of the charging control circuit 106 is shown in FIG. 4A. The charging control circuit 106 shown in FIG. 4A includes a regulator 401 that is a circuit for controlling voltage and a switch 402. It is to be noted that on and off of the switch 402 is controlled by a determination result by the determination circuit 109, in which whether the power storage device is in a charging state or a non-charging state. It is to be noted that the switch 402 is turned on when the power storage device 100 is in a charging state and turned off when the power storage device 100 is in a non-charging state, so that electric power stored in the battery 104 can be prevented from leaking. Thus, as shown in FIG. 4B, a structure can be employed in which the switch 402 is replaced with a diode 403 with a rectifying property. When the diode 403 is used instead of the switch 402, input of a signal for switching on and off of the switch can be omitted.

In the power storage device 100 shown in FIG. 1, the electric signal of which the voltage level has been controlled by the charging control circuit 106 is inputted to the battery 104, so that the battery 104 is charged. In the present invention, a "battery" refers to a power storage means whose continuous operating time can be restored by charging. It is to be noted that, although a secondary battery, a capacitor, and the like are given as the power storage means, they are referred to as a battery as a collective term in this specification. A battery formed in a sheet-like form is preferably used although depending on an intended use. For example, reduction in size is possible with the use of a lithium battery, preferably a lithium polymer battery that uses a gel electrolyte, a lithium ion battery, or the like. Needless to say, any battery may be used as long as it is chargeable, and a battery that is chargeable and dischargeable, such as a nickel metal hydride battery, a nickel cadmium battery, an organic radical battery, a lead storage battery, an air secondary battery, a nickel zinc battery, or a silver zinc battery may be used. Alternatively, a high-capacity capacitor or the like may be used.

It is to be noted that as a high-capacity capacitor that can be used as a battery of the present invention, it is preferable to use a capacitor having electrodes whose opposed areas are large. It is preferable to use a double-layer electrolytic capacitor formed using an electrode material having a large specific surface area, such as activated carbon, fullerene, or a carbon nanotube. A capacitor has a simple structure and is easily formed to be thin and formed as a stacked layer. A double-layer electrolytic capacitor is preferable because it has a function of storing power, does not deteriorate much even after the number of times of charging and discharging is increased, and has an excellent rapid charging property.

In addition, in this embodiment mode, electric power stored in the battery is not limited to an electromagnetic wave outputted from the power feeder 151, and a structure may be employed in which a power generation element is additionally provided in part of the power storage device. Employing the structure in which a power generation element is additionally provided is advantageous because the amount of electric power supplied to be stored in the battery 104 can be increased and the charging rate can be increased.

It is to be noted that as the power generation element, for example, a power generation element using a solar battery, a power generation element using a piezoelectric element, or a power generation element using a micro electro mechanical system (MEMS) may be used.

Figure 5A:
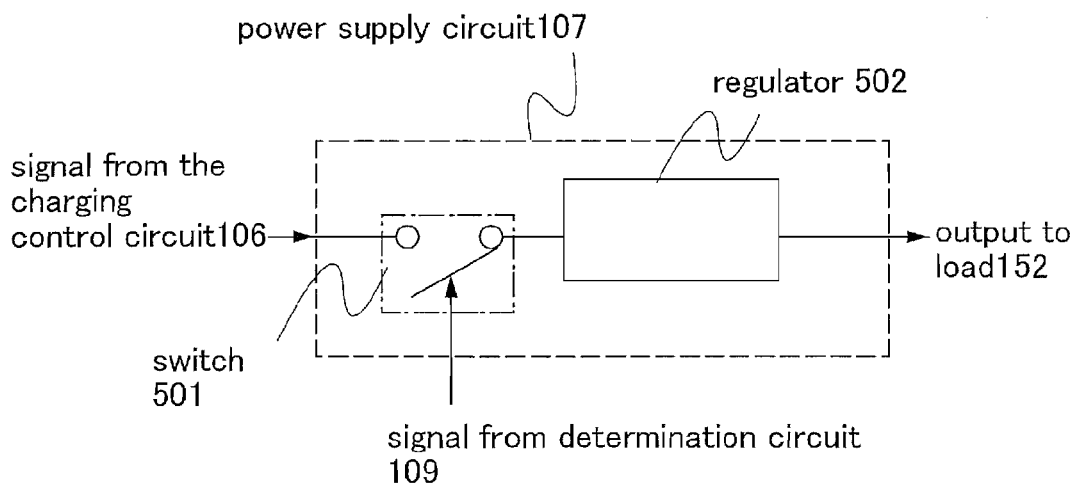
FIGS. 5A and 5B are diagrams each explaining a structure of Embodiment Mode 1.

In the power storage device 100 in FIG. 1, the electric power stored in the battery 104 is inputted to the power supply circuit 107. The power supply circuit 107 controls the voltage level of an electric signal outputted from the battery 104 and controls supply of the electric power stored in the battery 104 to the load 152. A specific structure of the power supply circuit 107 is shown in FIG. 5A. The power supply circuit 107 shown in FIG. 5A includes a switch 501 and a regulator 502 that is a circuit for controlling voltage. It is to be noted that on and off of the switch 501 are controlled by a determination result by the determination circuit 109, in which whether the power storage device 100 is in a charging state or a non-charging state.

Figure 5B:
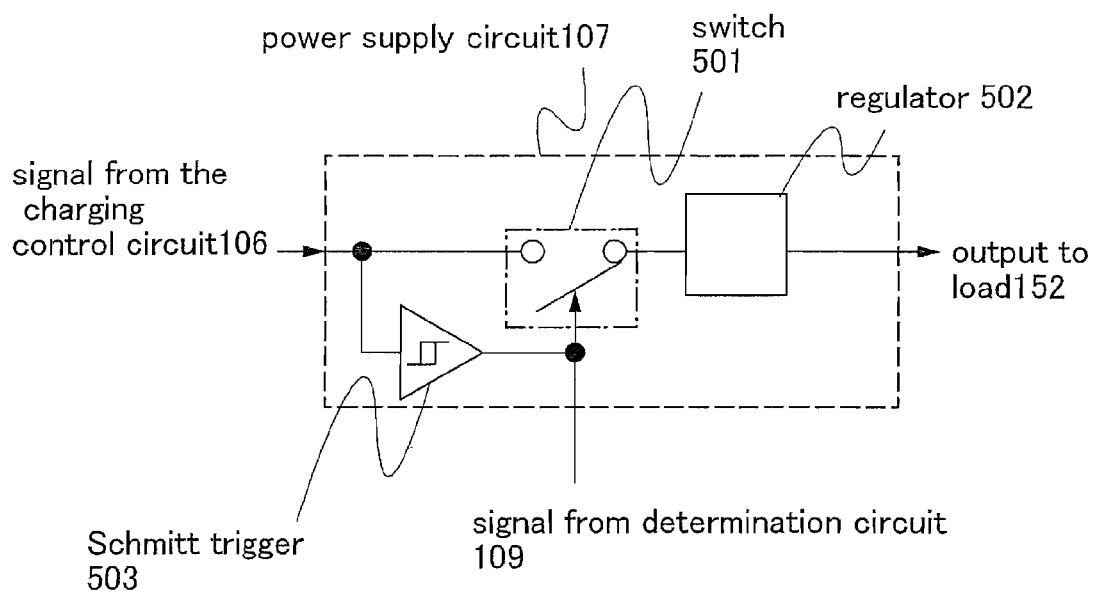

In the power supply circuit 107, a structure may be employed in which a Schmitt trigger is combined in the structure of the switch 501 shown in FIG. 5A. A specific structure provided with a Schmitt trigger is shown in FIG. 5B. In a Schmitt trigger 503 shown in FIG. 5B, a switching element can have hysteresis. Thus, in the power storage device 100, the switch can be kept on even if the capacity of the electric power of the battery is decreased and output voltage is decreased; accordingly, supply of electric power to the load 152 can be kept for a long period of time.

Next, a structure of the power feeder 151 is explained in detail.

Figure 7:
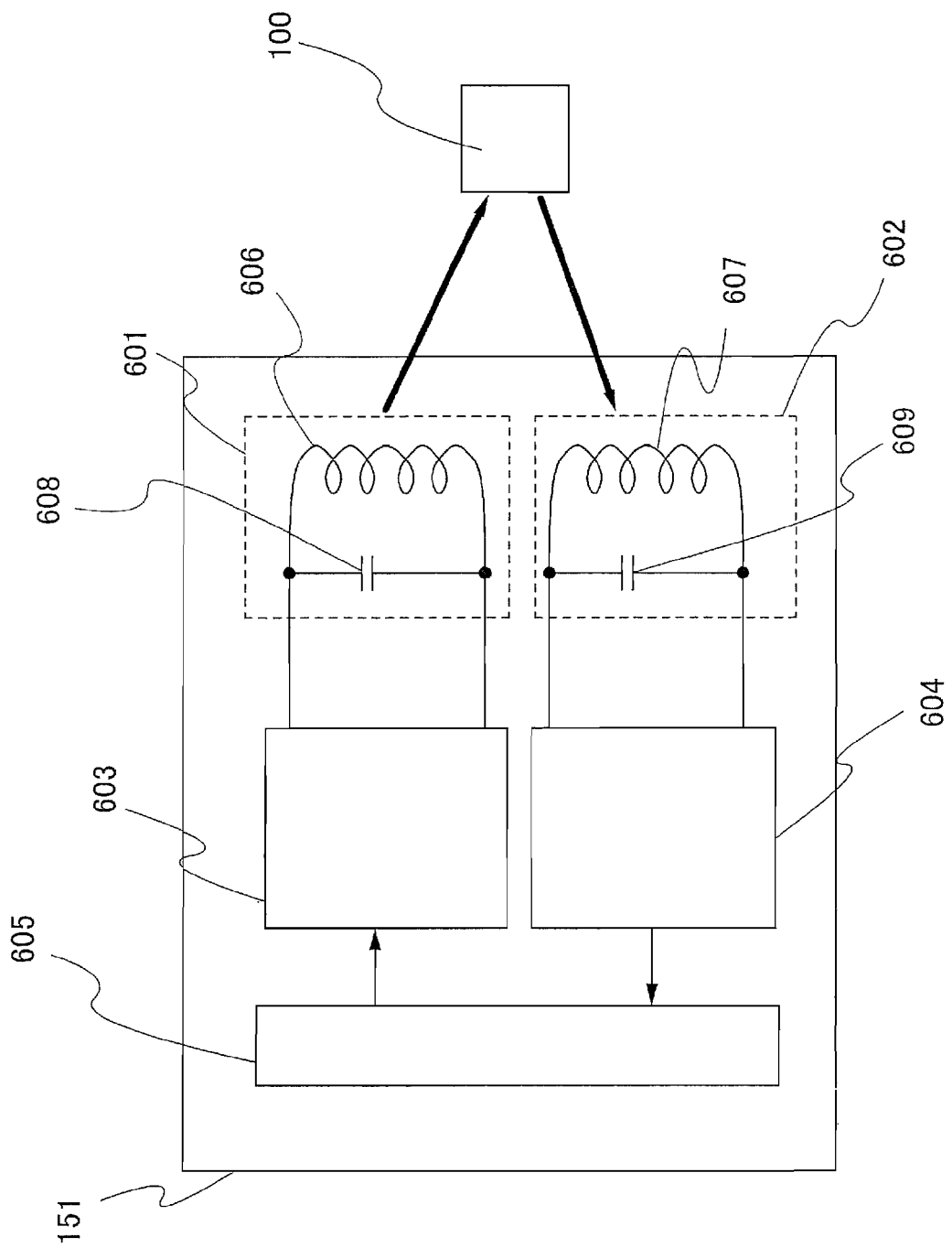
FIG. 7 is a diagram explaining a structure of Embodiment Mode 1.

The power feeder 151 in FIG. 1 outputs to the power storage device 100 an electromagnetic wave for charging the battery 104 in the power storage device 100 and a charging starting signal for starting charging of the power storage device 100. In addition, the power feeder 151 receives a signal indicating whether the power storage device 100 is in a charging state or a non-charging state from the power storage device 100. A specific structure of the power feeder 151 is shown in FIG. 7. The power feeder 151 in FIG. 7 includes a transmitting antenna 601, a receiving antenna 602, a transmitting portion 603, a receiving portion 604, and a control portion 605. The transmitting antenna 601 includes an antenna coil 606 and a resonance capacitor 608. In addition, the receiving antenna 602 includes an antenna coil 607 and a resonance capacitor 609. The control portion 605 controls the receiving portion 604 and the transmitting portion 603 in accordance with each of a charging starting signal output order, a power supply processing order, a receiving signal processing order, and a standby order. The transmitting portion 603 modulates a charging starting signal to be transmitted to the power storage device 100, and outputs the charging starting signal through the antenna 601 as an electromagnetic wave. In addition, the receiving portion 604 demodulates the signal received by the antenna 602 and outputs the demodulated signal to the control portion 605 as a processing result of the received signal.

It is to be noted that in the power feeder 151 in FIG. 7, either one of the transmitting antenna 601 and the receiving antenna 602 is used, whereby one antenna functions as both antennas and one of them may be eliminated. Either one of the transmitting antenna 601 or the receiving antenna 602 functions as both antennas, so that the size of the power supply portion 151 can be reduced.

Next, a structure of the charging determination portion 103 is explained in detail.

In the power storage device 100 in FIG. 1, the demodulation circuit 108 generates a demodulated signal with a frequency lower than that of an AC signal received by the antenna 101, based on an AC signal received by the antenna 101, and outputs the demodulated signal to the determination circuit 109. It is to be noted that the demodulated signal is outputted to the determination circuit 109 as a digital signal based on a signal of which a carrier wave is modulated transmitted from the power feeder 151. In addition, the modulation circuit 111 modulates a high-frequency carrier wave outputted from an antenna circuit based on a signal outputted from the determination circuit 109, and outputs the high-frequency carrier wave to the power feeder 151 through the antenna 101.

It is to be noted that the demodulation circuit 108 has a similar function to that of the rectifier circuit 105 in the power supply portion 102. Therefore, a structure may also be employed in which the rectifier circuit 105 generates a demodulated signal with a frequency lower than that of an AC signal received by the antenna 101, based on the AC signal received by the antenna 101 and outputs the signal to the determination circuit 109. In this case, the power storage device 100 can be formed without the demodulation circuit 108; therefore, reduction in size of the power storage device can be achieved.

In the power storage device 100 in FIG. 1, the determination circuit 109 determines whether the power storage device 100 is in a charging state or a non-charging state to output a signal. As described above, the determination circuit 109 in FIG. 1 monitors (checks) the voltage value of the battery 104, controls on and off of the switch 402 in the charging control circuit 106 and the switch 501 in the power supply circuit 107, processes data of a signal from the modulation circuit 108, and outputs a signal for being outputted to the power feeder 151 to the modulation circuit 111.

Figure 8:
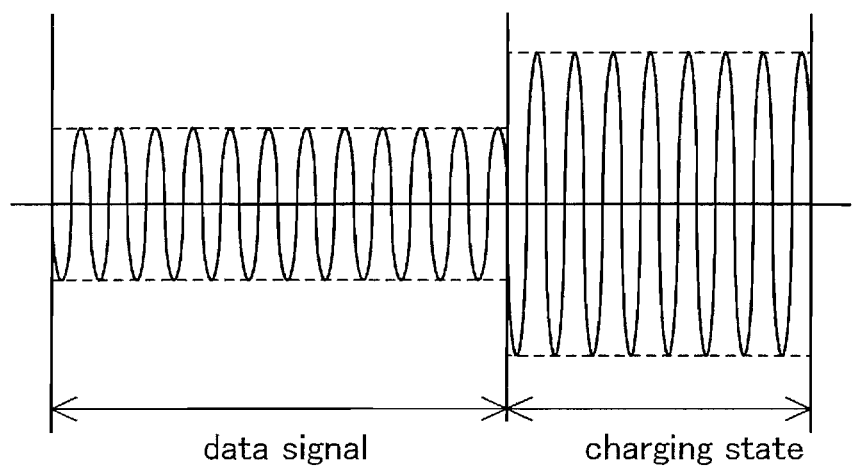
FIG. 8 is a diagram explaining a structure of Embodiment Mode 1.

The determination circuit 109 determines whether charging of the battery 104 is completed by monitoring the voltage value of the battery 104. A data signal received by the antenna 101 when the charging is started or the charging is completed is inputted to the determination circuit 109 through the demodulation circuit 108, so that the determination circuit 109 determines whether the power storage device is in a charging state or a non-charging state based on the a signal waveform of the data signal. In addition, a signal for being outputted to the power feeder 151 is outputted to the modulation circuit 111 based on a signal with a constant period from the counter circuit 110. A typical waveform of a data signal when charging is started and an electromagnetic wave during charging is shown in FIG. 8. As amplitude of a data signal and amplitude of an electromagnetic wave in a charging state, the amplitude of the electromagnetic wave is made large. The amplitude of the electromagnetic wave is made large, so that voltage of a signal received by the power storage device 100 in a charging state can be made high, and accordingly, charging can be performed more surely.

In the power storage device 100 in FIG. 1, the counter circuit 110 is a circuit for counting time from when the charging state of the power storage device 100 is started. The counter circuit 110 generates a reset signal based on a signal for stating charging from the power feeder 151 (hereinafter, referred to as a charging starting signal), which is inputted to the demodulation circuit 108, so that a counter operates. Logic circuits such as flip flop circuits are combined for forming the counter circuit 110, and a clock signal is inputted from a clock generation circuit such as a ring oscillator or a crystal oscillator, so that the time is counted. It is to be noted that the clock generation circuit may be formed so as to be directly supplied with electric power from the battery 104.

Moreover, as described above, the counter circuit 110 outputs a signal with a constant period to the modulation circuit 111, which is for being outputted to the power feeder 151, to the determination circuit 109. The signal may be formed so as to be outputted when a counter value in the counter circuit 110 is carried. In addition, the counter circuit 110 counts a charging period of the power storage device 100 in a charging state and receives an electromagnetic wave with a certain amount or more of electric field intensity, magnetic field intensity, or power flux density even if the average of electric power from the power feeder 151 is the same. Then, after a charging state for a certain period, output of the signal with a constant period to the modulation circuit 111, which is for being outputted to the power feeder 151, to the determination circuit 109 is stopped. Then, charging of the power storage device 100 by an electromagnetic wave from the power feeder is stopped, so that the power storage device 100 can store an electromagnetic wave with a certain amount or more of electric field intensity, magnetic field intensity, or power flux density even if the average of electric power is the same.

Figure 6:
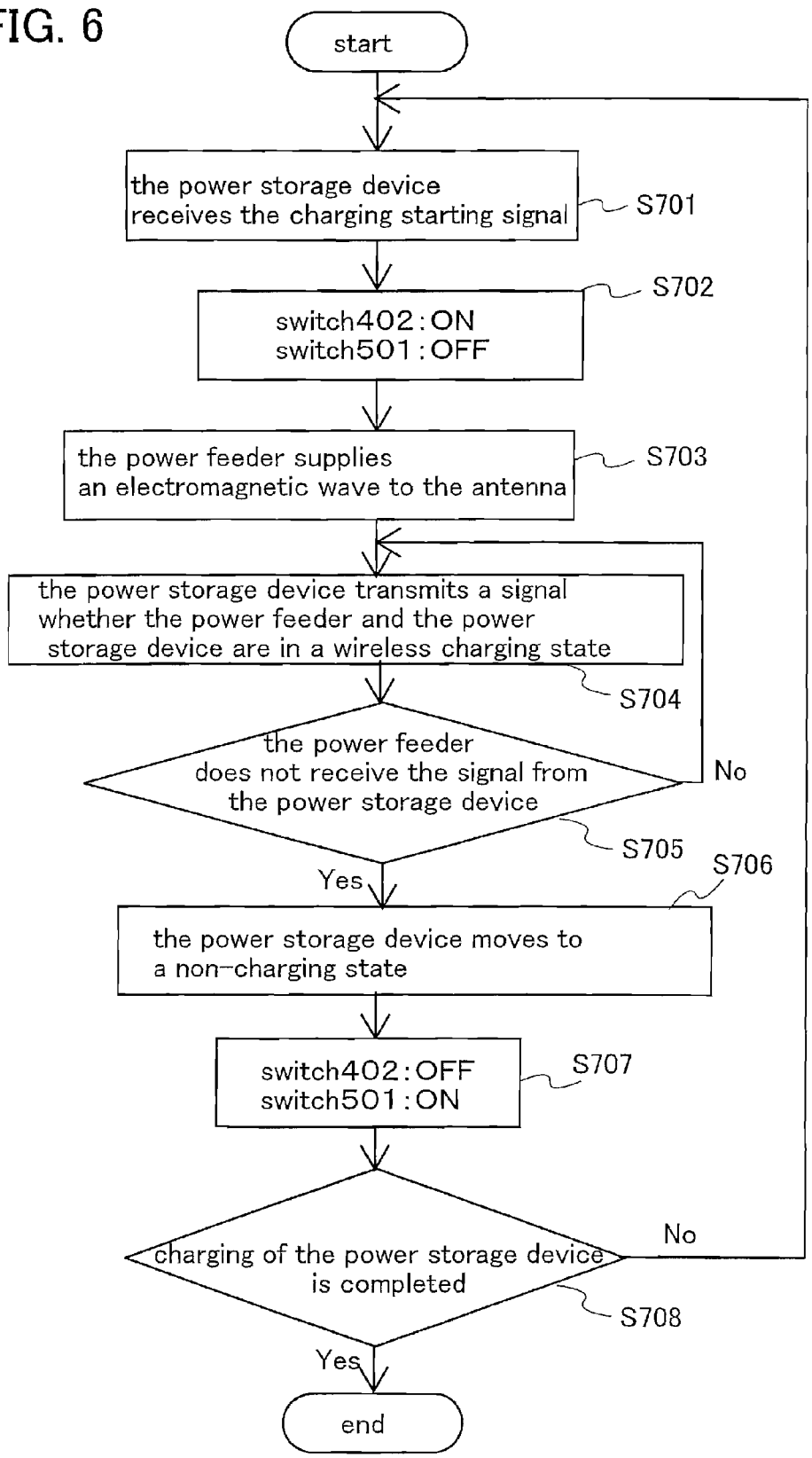
FIG. 6 is a flow chart explaining a structure of Embodiment Mode 1.

An operation of the determination circuit 109 is explained using a flow chart shown in FIG. 6.

In FIG. 6, as a simple example, the case where one power storage device 100 is provided within a space an electrimagnetic wave supplied by the power feeder 151 reaches is explained. In FIG. 6, first, the power feeder 151 transmits a charging starting signal to the power storage device 100, and the power storage device 100 receives the charging starting signal (S701).

Next, the power storage device 100 which has received the charging starting signal switches on and off of each switch in the power storage device 100 in order to be switched from a non-charging state to a charging state in the determination circuit 109. Specifically, the power storage device 100 turns on the switch 402 in the charging control circuit 106 and turns off the switch 501 in the power supply circuit 107 (S702).

Next, the power feeder 151 supplies an electromagnetic wave for charging the battery 104 to the antenna 101 of the power storage device 100 (S703).

In addition, in the power storage device 100, the counter circuit 110 counts a period in which the electromagnetic wave for charging the battery 104, which is outputted from the power feeder 151, is inputted. In the period in which the battery 104 of the power storage device 100 is charged, the power storage device 100 regularly transmits a signal for informing the power feeder 151 side whether the power feeder 151 and the power storage device 100 are in a wireless charging state (S704).

As described above, the determination circuit 109 determines whether the power storage device 100 is in a charging state or a non-charging state. The determination circuit 109 outputs a periodic signal to the modulation circuit 111 in accordance with a counter value from the counter circuit 110. Then, the power storage device 100 in the charging state regularly transmits the signal to the power feeder 151. It is to be noted that in the counter circuit 110, in the case where the determination circuit 109 monitors voltage of the battery 104 in a counting period and determines that charging of the battery 104 is completed (hereinafter, referred to as full charging), output of the signal to the power feeder 151, which is described above, is stopped. Then, in the case where the power feeder 151 receives the signal from the power storage device 100 (NO in S705), the power feeder 151 continuously supplies an electromagnetic wave for charging the battery 104 to the power storage device 100.

Moreover, in the case where the power feeder 151 does not receive the signal from the power storage device 100 (YES in S705), the power feeder 151 stops supplying an electromagnetic wave for charging the battery 104. That is, the power storage device 100 does not receive the signal for charging the battery 104; thus, the power storage device 100 moves to a non-charging state (S706). It is to be noted that also in the case where the power storage device 100 outputs a signal indicating a charging state, when the signal indicating the charging state is not supplied to the power feeder 151 side due to communication conditions or the like, the power storage device 100 moves to a non-charging state even if the battery 104 is not fully charged.

Next, the power storage device 100 which has moved to the non-charging state is changed from a charging state to a non-charging state in the determination circuit 109, and the power storage device 100 switches on and off of each switch. Specifically, the power storage device 100 turns off the switch 402 in the charging control circuit 106 and turns on the switch 501 in the power supply circuit 107 (S707).

Then, in the case where the battery 104 in the power storage device 100 is not fully charged, the power feeder 151 outputs a charging starting signal again, so that the power storage device 100 is charged (NO in S708). In addition, in the case where the battery 104 in the power storage device 100 is fully charged, charging of the power storage device 100 is completed (YES in S708).

Subsequently, a signal for controlling on and off of the switch 402 in the charging control circuit 106 and the switch 501 in the power supply circuit 107, which is outputted from the determination circuit 109, and an output signal, which is for being outputted to the power feeder 151, to the modulation circuit 111 are explained using a timing chart. It is to be noted that explanation is given under the condition that each switch is an N-channel transistor, and the switch is turned on when a high potential signal is outputted and it is turned off when a low potential signal is outputted. In addition, explanation is given under the condition that, output from the determination circuit 109 to the modulation circuit 111 starts when a high potential signal is outputted to the switch 402.

Figure 9:
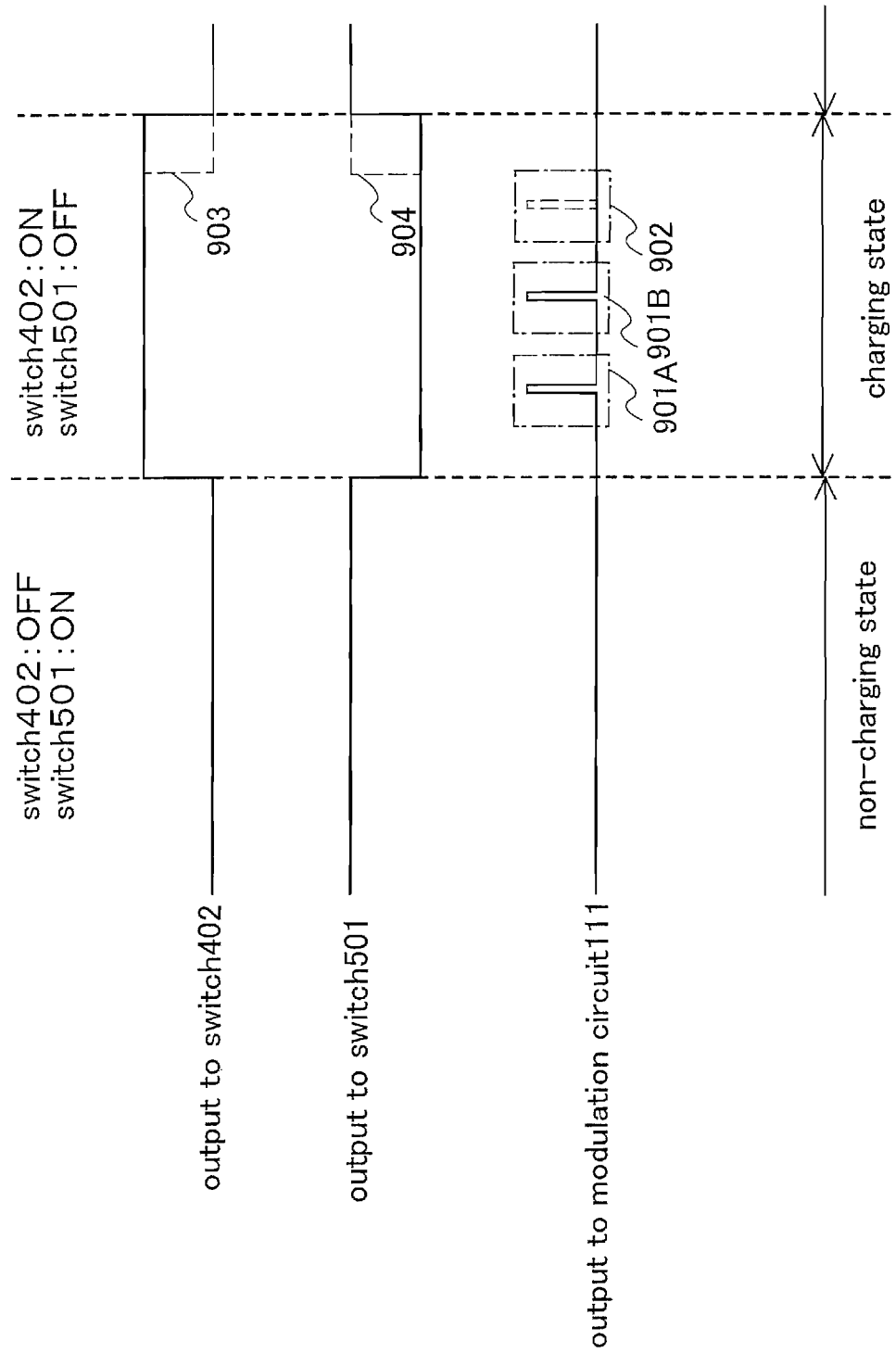
FIG. 9 is a diagram explaining a structure of Embodiment Mode 1.

In FIG. 9, in the non-charging state, as described above, the switch 402 is turned off and the switch 501 is turned on, and an output signal, which is for output indicating a charging state to the power feeder 151, to the modulation circuit 111 is stopped. Therefore, in the non-charging state, output from the determination circuit 109 to the switch 402 becomes a low potential signal, output from the determination circuit 109 to the switch 501 becomes a high potential signal, and output from the determination circuit 109 to the modulation circuit 111 becomes a low potential signal. In the charging state, as described above, the switch 402 is turned on, the switch 501 is turned off, and the output signal, which is for output indicating a charging state to the power feeder 151, to the modulation circuit 111 is outputted at a constant period. Therefore, in the charging state, output from the determination circuit 109 to the switch 402 becomes a high potential signal, output from the determination circuit 109 to the switch 501 becomes a low potential signal, and a high potential signal (a high potential signal 901A and a high potential signal 901B in FIG. 9) is outputted from the determination circuit 109 to the modulation circuit 111 at a constant period, based on a signal from the counter circuit.

In the timing chart in FIG. 9, when charging of the power storage device 100 is completed or the charging thereof is interrupted due to some cause, the determination circuit 109 stops output of a high potential signal to the modulation circuit 111 at a constant period (a high frequency signal 902 shown by dotted lines). Therefore, the power feeder 151 stops output of an electromagnetic wave for charging the battery 104 in the power storage device 100. Since the power storage device 100 does not receive the electromagnetic wave for charging the battery 104 at this time, the determination circuit 109 determines that the power storage device 100 is in a non-charging state and each switch is controlled as shown by dotted lines 903 and dotted lines 904 in FIG. 9. In the structure of the present invention, as described above, the charging state and the non-charging state are determined and switched by the inputted signal, so that unnecessary supply of electric power by the electromagnetic wave can be stopped and automatic return to the non-charging state can be performed.

Figure 10:
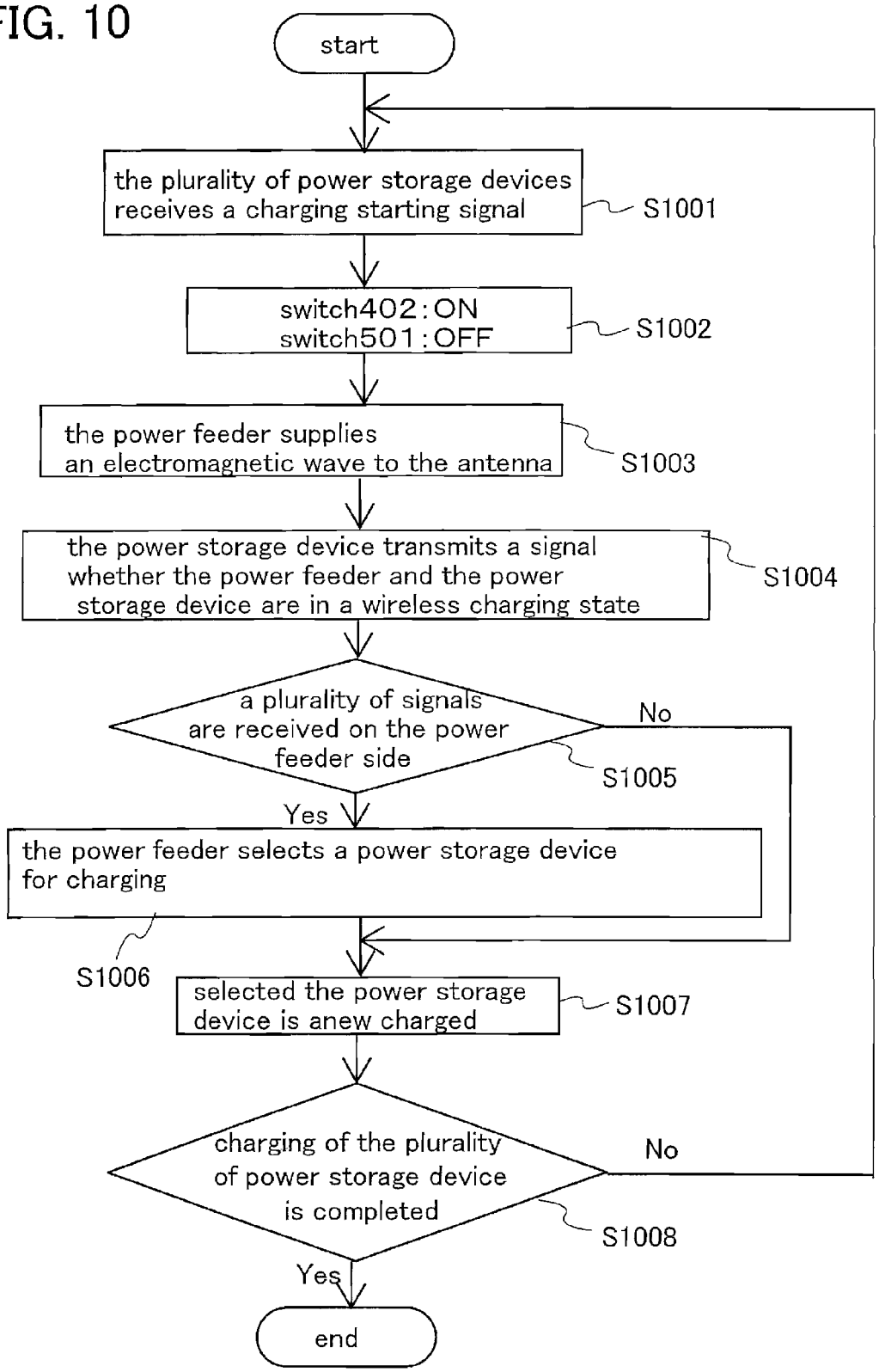
FIG. 10 is a flow chart explaining a structure of Embodiment Mode 1.

In FIG. 10, the case where a plurality of power storage devices 100 is provided within a space an electromagnetic wave supplied by the power feeder 151 reaches is explained using a flow chart. In FIG. 10, first, the power feeder 151 transmits a charging starting signal to the power storage device 100, and the plurality of power storage devices 100 receives a charging starting signal (S1001).

Next, each of the plurality of power storage devices 100 that has received the charging starting signal switches on and off of each switch in order to be switched from a non-charging state to a charging state by the determination circuit 109. Specifically, the power storage device 100 turns on the switch 402 in the charging control circuit 106 and turns off the switch 501 in the power supply circuit 107 (S1002).

Next, the power feeder 151 supplies an electromagnetic wave for charging the battery 104 to the antenna 101 in each of the plurality of power storage devices 100 (S1003).

In addition, in each of the plurality of power storage devices 100, the counter circuit 110 counts a period in which the electromagnetic wave for charging the battery 104 outputted from the power feeder 151 is inputted. In the period in which the battery 104 of each of the plurality of power storage devices 100 is charged, each of the power storage devices 100 regularly transmits a signal for informing the power feeder 151 side whether the power feeder 151 and the power storage device 100 are in a wireless charging state (S1004).

In the case where the plurality of power storage devices 100 is provided within the space the electromagnetic wave supplied by the power feeder 151 reaches, a plurality of signals for informing the power feeder 151 side whether the power feeder 151 and the power storage device 100 in S1004 are in a wireless charging state are received on the power feeder 151 side (S1005). In the case where the plurality of power storage devices 100 is provided within the space the electromagnetic wave supplied by the power feeder 151 reaches (YES in S1005), the power feeder 151 selects a power storage device for charging (S1006). That is, a charging stopping signal is transmitted to power feeders except for the power feeder for charging. The power storage device to which the charging stopping signal has been transmitted is not charged by the power feeder 151 during a period in which the counter circuit 110 counts.

It is to be noted that, in S1006, an identification number may be given to each of the plurality of power storage devices in order to identify the plurality of power storage devices and the identification number may be stored in memory or the like in advance, so that the power storage device to be charged or not to be charged is selected.

Next, the power storage device selected in S1006 is anew charged (S1007). The power storage device may be charged at this time in accordance with the flow chart shown in FIG. 6. It is to be noted that, in S1005, S1007 starts after S1005, in the case where the plurality of power storage devices 100 is not provided within the space the electromagnetic wave supplied by the power feeder 151 reaches (NO in S1005).

Then, after charging of the given power storage device is completed, another power storage device is charged. In the case where a power storage device in which charging is not performed is provided within the space the electromagnetic wave supplied by the power feeder 151 reaches (NO in S1008), S1001 starts again. In addition, in the case where the power storage device in which charging is not performed is not provided within the space the electromagnetic wave supplied by the power feeder 151 reaches (YES in S1008), charging of the plurality of power storage devices is determined to be completed.

As described above, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds whether the power storage device is in a charging state or a non-charging state to the power feeder that supplies an electromagnetic wave for charging the battery; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that the plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

It is to be noted that the technical components of this embodiment mode can be combined with other technical components in this specification.

Embodiment Mode 2

In this embodiment mode, a structure in which a charging management circuit is included in the power storage device described in above Embodiment Mode 1 will be explained with reference to drawings. It is to be noted that, in the drawings used in this embodiment mode, same parts as those in Embodiment Mode 1 are denoted by the same reference numerals.

It is to be noted that a "charging management circuit" in this embodiment mode refers to a circuit that is dedicated to managing charging/discharging of a battery when using the battery. When using a battery, it is generally necessary to manage the charging/discharging of the battery. When charging a battery, it is necessary to perform charging while at the same time monitoring the charged state of the battery in order to prevent overcharging. For the battery used in the present invention, a dedicated circuit is necessary when conducting management of charging.

The power storage device in this embodiment mode will be explained with reference to a block diagram shown in FIG. 11.

Figure 11:
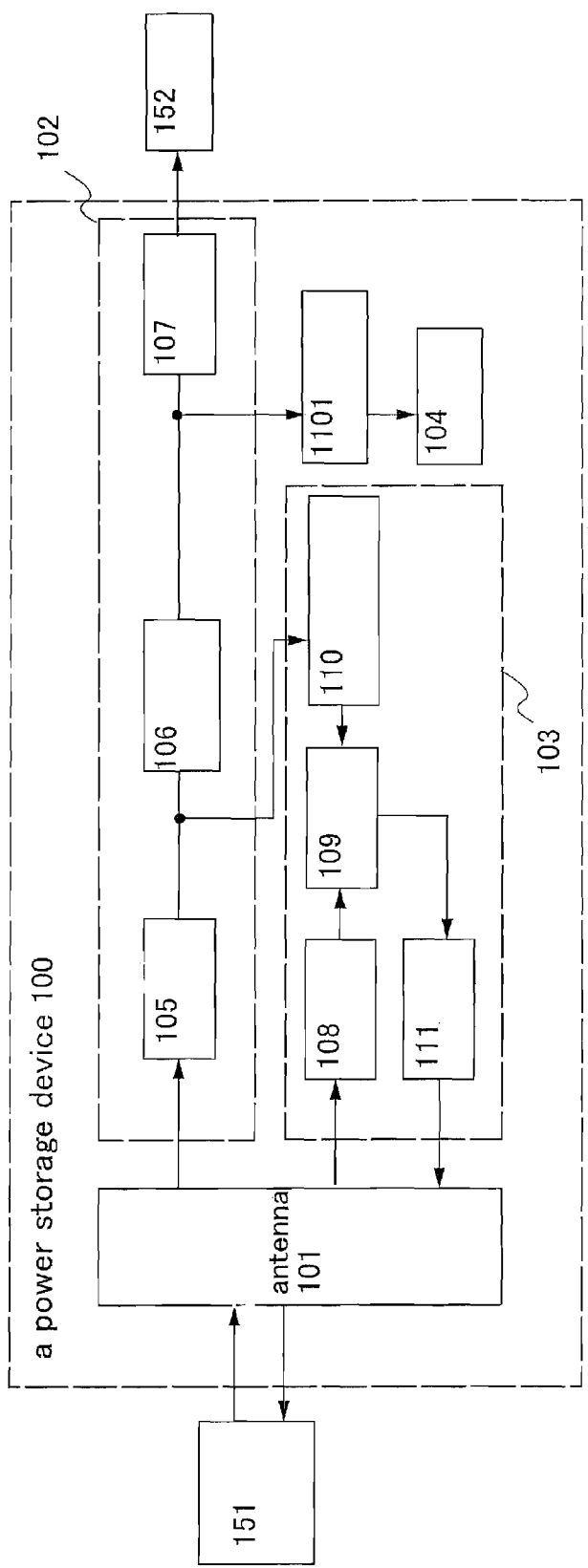
FIG. 11 is a diagram explaining a structure of Embodiment Mode 2.

A power storage device 100 in FIG. 11 includes an antenna 101, a power supply portion 102, a charging determination portion 103, a battery 104, and a charging management circuit 1101. Electric power is supplied from the power feeder 151 to the power storage device 100, and power stored in the battery 104 inside the power storage device 100 is supplied to a load 152. The power supply portion 102 includes a rectifier circuit 105 that rectifies an electromagnetic wave inputted to the antenna 101, a charging control circuit 106 that controls charging of output from the rectifier circuit 105 to the battery 104, and a power supply circuit 107 for controlling supply of the power charged by the battery 104 to the load 152. The charging determination portion 103 includes a demodulation circuit 108 for demodulating a signal inputted to the antenna 101, a determination circuit 109 for determining whether the battery 104 is in a charging state or in a non-charging state and outputting a signal for switching the charging state and the non-charging state, a counter circuit 110 for counting charging time of the battery 104 and outputting the counted time to the determination circuit 109, and a modulation circuit 111 for modulating a signal to be outputted to an external portion in accordance with the charging state or the non-charging state determined by the determination circuit 109. It is to be noted that the structure shown in FIG. 11 differs from the structure in FIG. 1 of Embodiment Mode 1 in that the charging management circuit 1101 is provided between the charging control circuit 106 and the battery 104. Therefore, in this embodiment mode, explanation will be given for the charging management circuit 1101 and the explanation given in Embodiment Mode 1 will be used for other structures.

Next, a structure of the charging management circuit 1101 in this embodiment mode will be explained with reference to FIG. 12.

Figure 12:
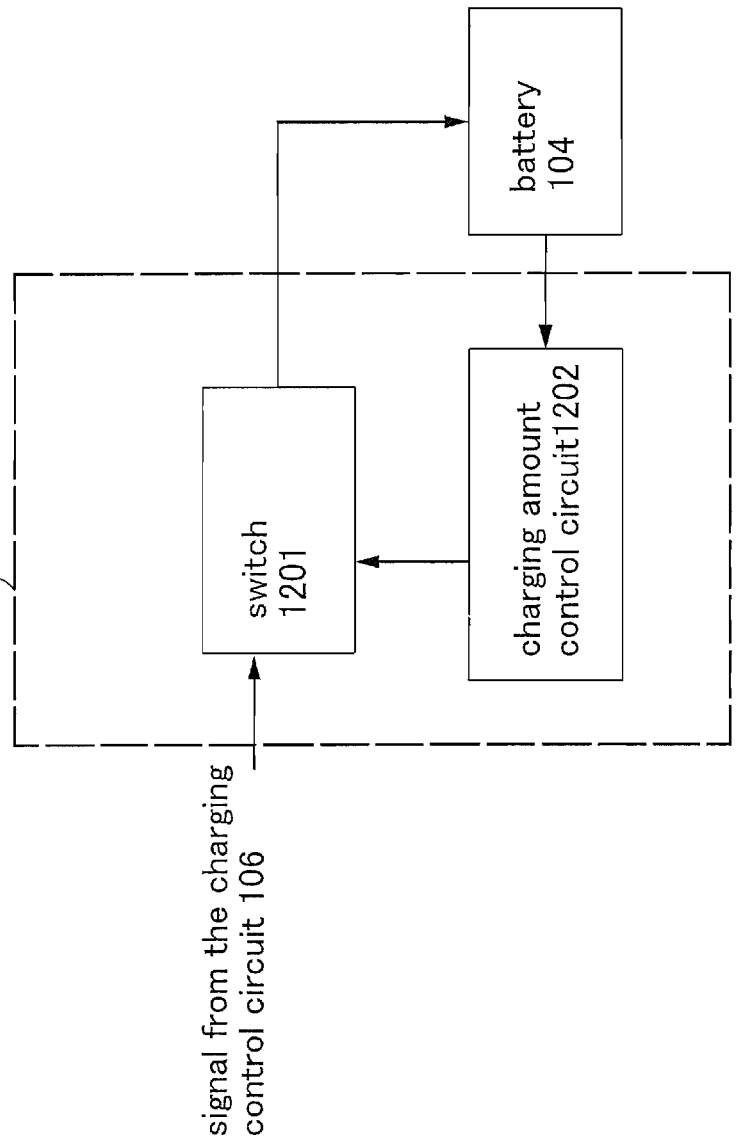
FIG. 12 is a diagram explaining a structure of Embodiment Mode 2.

The charging management circuit 1101 shown in FIG. 12 includes a switch 1201 and a charging amount control circuit 1202. The charging amount circuit 1202 controls on and off of the switch 1201.

The charging management circuit described here is just an example, and the present invention may employ another structure without being limited to this structure. In addition, transistors included in a circuit shown in a circuit diagram of FIG. 13, which are described below, may be any of thin film transistors, transistors using a single crystal substrate, or organic transistors.

Figure 13:
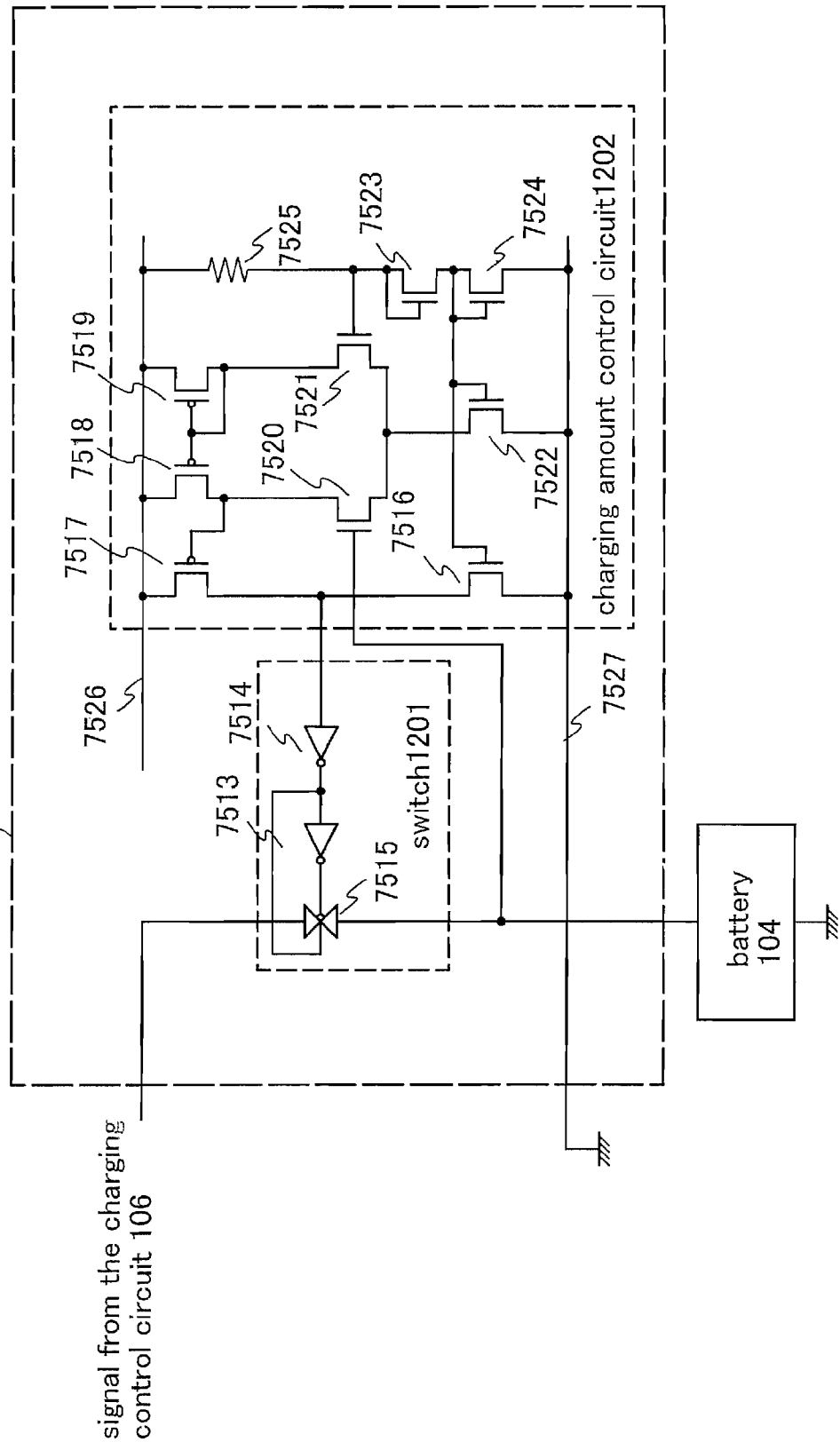
FIG. 13 is a diagram explaining a structure of Embodiment Mode 2.

FIG. 13 is a detailed diagram of the block diagram shown in FIG. 12. The operation of the circuit is explained below.

In the structure shown in FIG. 13, each of the switch 1201 and the charging amount control circuit 1202 uses a high potential power supply line 7526 and a low potential power supply line 7527 as power supply lines. In FIG. 13, the low potential power supply line 7527 is used as a GND line. It is to be noted that the potential of the low potential power supply line 7527 is not limited to GND and may be a different potential.

The switch 1201 includes a transmission gate 7515 and inverters 7513 and 7514, and controls, by an input signal of the inverter 7514, whether to supply an output signal of the charging control circuit 106 to the battery 104. The switch 1201 is not limited to this structure and may employ another structure.

The charging amount control circuit 1202 includes transistors 7516 to 7524 and a resistor 7525. A current flows into the transistors 7523 and 7524 from the high potential power supply line 7526 through a resistor 7525, so that the transistors 7523 and 7524 are turned on. The transistors 7518 to 7522 form a differential comparator. When the gate potential of the transistor 7520 is lower than the gate potential of the transistor 7521, the drain potential of the transistor 7518 has almost the same value as the potential of the high potential power supply line 7526, whereas when the gate potential of the transistor 7520 is higher than the gate potential of the transistor 7521, the drain potential of the transistor 7518 has almost the same value as the source potential of the transistor 7520.

When the drain potential of the transistor 7518 has almost the same value as the potential of the high potential power supply line 7526, the charging amount control circuit 1202 outputs a low potential signal through a buffer including the transistors 7516 and 7517.

When the drain potential of the transistor 7518 has almost the same value as the source potential of the transistor 7520, the charging amount control circuit 1202 outputs a high potential signal through the buffer including the transistors 7516 and 7517.

When the charging amount control circuit 1202 outputs a low-level potential, current is supplied to the battery through the switch 1201. Meanwhile, when the charging amount control circuit 1202 outputs a high-level potential, the switch 1201 is turned off and an output signal of the charging control circuit 106 is not supplied to the battery 104.

A gate of the transistor 7520 is connected to the battery 104; therefore, charging stops when the battery 104 is charged and the potential of the battery exceeds the threshold value of the comparator of the charging amount control circuit 1202. Although the threshold value of the comparator in this embodiment mode is set at the gate potential of the transistor 7523, a different potential may be set without limitation to this value. In general, the set potential is appropriately determined in accordance with the intended use and the performance of the battery.

As described above, the structure of the charging management circuit to the battery is explained in this embodiment mode; however, the present invention is not limited to this structure.

With the above structure, the power storage device of the present invention can additionally have a function of managing charging of the battery 104 in the power storage device 100. In addition, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

It is to be noted that the technical components of this embodiment mode can be combined with other technical components in this specification.

Embodiment Mode 3

In this embodiment mode, a structure in which a signal processing circuit is provided as a load in the power storage device described in above Embodiment Mode 1 will be explained with reference to a drawing. It is to be noted that, in some cases, in the drawing used in this embodiment mode, same parts as those in Embodiment Mode 1 are denoted by the same reference numerals.

One structural example of a power storage device of the present invention in this embodiment mode will be explained with reference to a block diagram shown in FIG. 14. It is to be noted that, in this embodiment mode, a signal processing circuit is included in the power storage device. Therefore, in this embodiment mode, the case in which the power storage device is used as a semiconductor device and the semiconductor device is used as an RFID will be explained.

Figure 14:
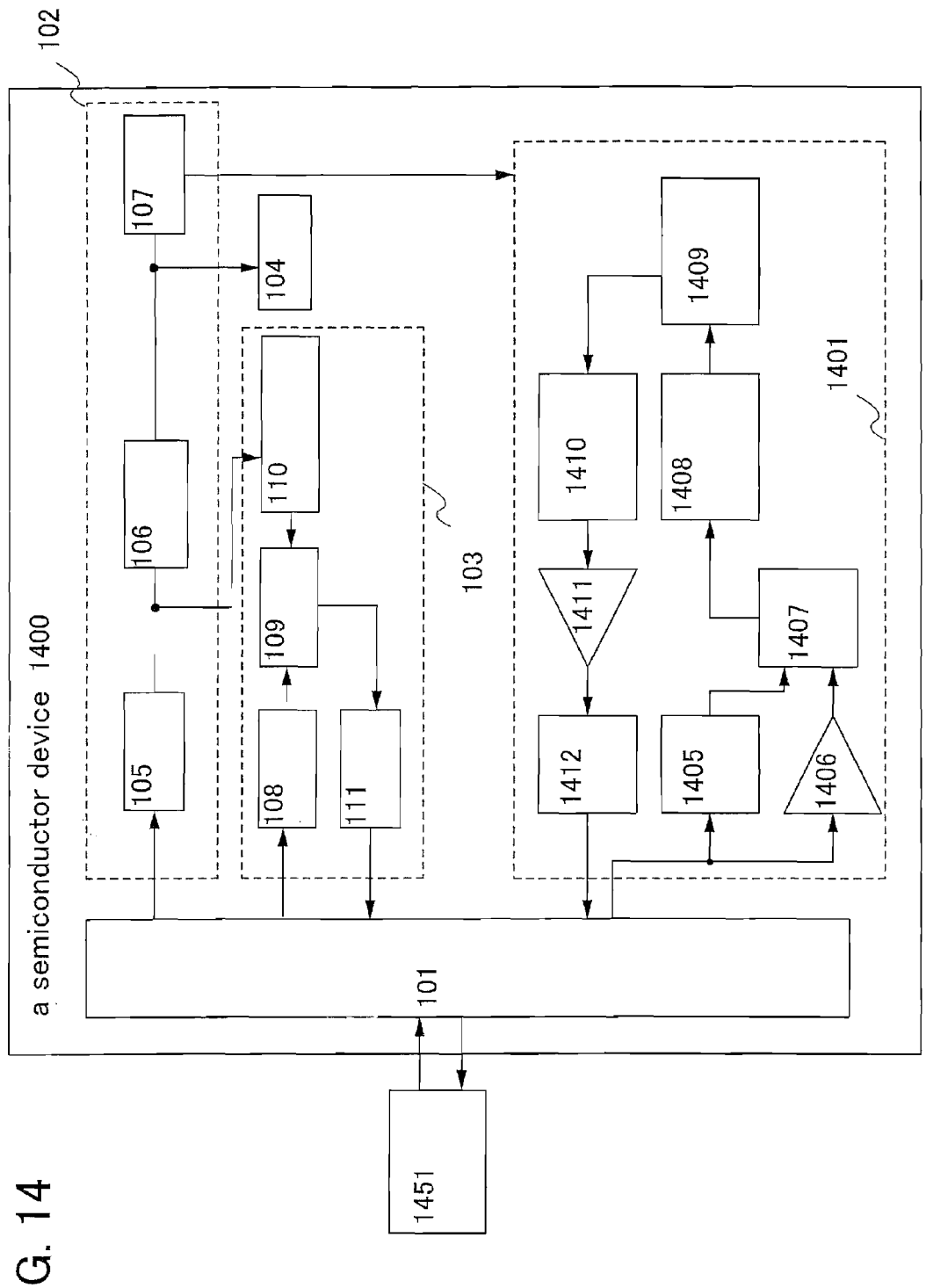
FIG. 14 is a diagram explaining a structure of Embodiment Mode 3.

A semiconductor device 1400 in FIG. 14 includes an antenna 101, a power supply portion 102, a charging determination portion 103, a battery 104, and a signal processing circuit 1401. Electric power is supplied to the semiconductor device 1400 from a reader/writer 1451, and electric power stored in the battery 104 inside the semiconductor device 1400 is supplied to the signal processing circuit 1401. The power supply portion 102 includes a rectifier circuit 105 that rectifies an electromagnetic wave inputted to the antenna 101, a charging control circuit 106 that controls charging of output from the rectifier circuit 105 to the battery 104, and a power supply circuit 107 for controlling supply of the electric power charged by the battery 104 to the load 152. The charging determination portion 103 includes a demodulation circuit 108 for demodulating a signal inputted to the antenna 101, a determination circuit 109 for determining whether the battery 104 is in a charging state or a non-charging state in accordance with the signal inputted from the antenna 101 and outputting a signal that switches the charging state and the non-charging state, a counter circuit 110 for counting charging time of the battery 104 and outputting the counted time to the determination circuit 109, and a modulation circuit for modulating a signal to be outputted to an external portion in accordance with the charging state or the non-charging state determined by the determination circuit 109. The signal processing circuit 1401 includes an amplifier 1406 (also referred to as an amplifier circuit), a demodulation circuit 1405, a logic circuit 1407, a memory control circuit 1409, a memory circuit 1409, a logic circuit 1410, an amplifier 1411, and a modulation circuit 1412. It is to be noted that the structure in FIG. 14 differs from the structure in FIG. 1 of Embodiment Mode 1 in that the power feeder is replaced with the reader/writer 1451, and the signal processing circuit 1401 is connected to the power supply circuit 107. Therefore, in this embodiment mode, an explanation is given for the signal processing circuit 1401 and the explanation given in Embodiment Mode 1 is used for another structure.

In the signal processing circuit 1401, a communication signal transmitted from the reader/writer 1451 and received by the antenna 101 is inputted to the demodulation circuit 1405 and the amplifier 1406. Communication signals of 13.56 MHz, 915 MHz, and the like are usually transmitted after being processed using ASK modulation, PSK modulation, or the like. Here, in FIG. 14, an example of a communication signal of 13.56 MHz carrier is shown. In FIG. 14, when a communication signal has a 13.56 MHz carrier, an electromagnetic wave from the reader/writer, which is for charging the battery 104 desirably, has the same frequency as the communication signal. It is to be noted that a signal for charging and a signal for communication are made in the same frequency band, so that the antenna 101 can be commonly used. The antenna is commonly used, whereby the size of the semiconductor device can be reduced.

In FIG. 14, a clock signal that is a reference is needed for processing a signal, and a 13.56 MHz carrier is used as a clock here. The amplifier 1406 amplifies the 13.56 MHz carrier and supplies it to the logic circuit 1407 as the clock. The ASK modulated communication signal or the PSK modulated communication signal is demodulated by the demodulation circuit 1405. The signal which has been demodulated is also transmitted to the logic circuit 1407 to be analyzed. The signal analyzed by the logic circuit 1407 is transmitted to the memory control circuit 1408, and in accordance with the signal, the memory control circuit 1408 controls the memory circuit 1409, extracts data stored in the memory circuit 1409, and transmits the data to the logic circuit 1410. The signal stored in the memory circuit 1409 is encoded by the logic circuit 1410 and then amplified by the amplifier 1411, so that the carrier is modulated by the modulation circuit 1412 with the signal.

Here, power supply voltage in FIG. 14 is supplied by the battery 104 through the power supply circuit 107. The power supply circuit 107 supplies power to the amplifier 1406, the demodulation circuit 1405, the logic circuit 1407, the memory control circuit 1408, the memory circuit 1409, the logic circuit 1410, the amplifier circuit 1411, the modulation circuit 1412, and the like. In such a manner, the RFID of the semiconductor device 1400 operates.

With the above-described structure, the semiconductor device of the present invention can additionally have a function dedicated to processing of a signal with an external portion by the signal processing circuit. In addition, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

It is to be noted that the technical components of this embodiment mode can be combined with other technical components in this specification.

Embodiment 1

In this embodiment, an example of a battery in the power storage device of the present invention will be explained. In this specification, a "battery" refers to a battery that can restore its continuous use time by being charged. It is preferable to use a battery with a sheet-like form as the battery. For example, reduction in size is possible with the use of a lithium battery, preferably a lithium polymer battery that uses a gel electrolyte, a lithium ion battery, or the like. Needless to say, any battery may be used as long as it is chargeable, and a battery that is chargeable and dischargeable, such as a nickel metal hydride battery or a nickel cadmium battery may be used. Alternatively, a high-capacity capacitor or the like can be used.

In this embodiment, a lithium ion battery is explained as an example of the battery. A lithium ion battery is widely used because of its advantageous properties in that it has no memory effects and can discharge a large amount of current unlike a nickel-cadmium battery, a lead battery, and the like. In recent years, research has been focused on reduction in thickness of a lithium battery, and there has been a thin lithium ion battery that is formed with a thickness of 1 µm to several µm (hereinafter referred to as a thin-film secondary battery). When such a thin-film secondary battery is attached to an RFID or the like, the battery can be utilized as a flexible battery.

Figure 15:
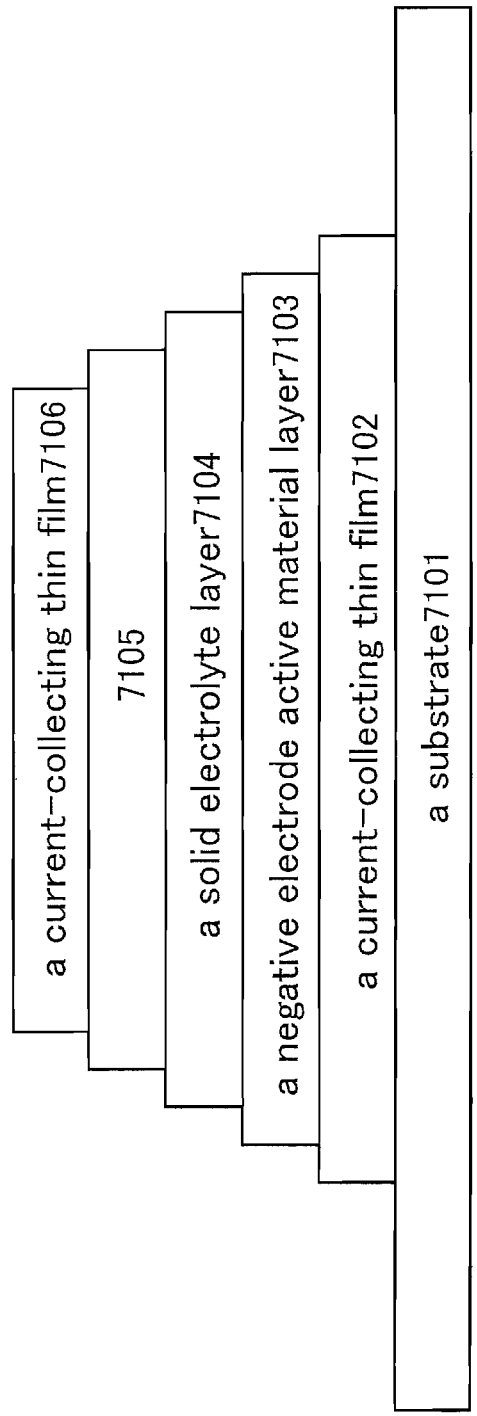
FIG. 15 is a diagram explaining a structure of Embodiment 1.

FIG. 15 illustrates an example of a thin-film secondary battery that can be used as the battery of the present invention. An example shown in FIG. 15 is an example of a cross section of a thin-film lithium ion battery.

A stacked structure in FIG. 15 is explained. A current-collecting thin film 7102 to serve as an electrode is formed over a substrate 7101 in FIG. 15. It is necessary that current-collecting thin film 7102 has high adhesion to a negative electrode active material layer 7103 and also has low resistance. For example, aluminum, copper, nickel, vanadium, or the like can be used. Next, the negative electrode active material layer 7103 is formed over the current-collecting thin film 7102. In general, vanadium oxide ($V_2O_5$) or the like is used. Next, a solid electrolyte layer 7104 is formed over the negative electrode active material layer 7103. In general, lithium phosphate ($Li_3PO_4$) or the like is used. Next, a positive electrode active material layer 7105 is formed over the solid electrolyte layer 7104. In general, lithium manganate ($LiMn_2O_4$) or the like is used. Lithium cobaltate ($LiCoO_2$) or lithium nickel oxide ($LiNiO_2$) may also be used. Next, a current-collecting thin film 7106 to serve as an electrode is formed over the positive electrode active material layer 7105. It is necessary that current-collecting thin film 7106 has high adhesion to the positive electrode active material layer 7105 and also has low resistance. For example, aluminum, copper, nickel, vanadium, or the like can be used.

It is to be noted that each of the above-described thin layers of the current-collecting thin film 7102, the negative electrode active material layer 7103, the solid electrolyte layer 7104, the positive electrode active material layer 7105, and the current-collecting thin film 7106 may be formed by a sputtering technique or a vapor-deposition technique. In addition, each thickness of the current-collecting thin film 7102, the negative electrode active material layer 7103, the solid electrolyte layer 7104, the positive electrode active material layer 7105, and the current-collecting thin film 7106 is desirably 0.1 to 3 μm.

Next, the operation in charging and discharging the battery is explained. In charging the battery, lithium ions are desorbed from the positive electrode active material layer. Then, the lithium ions are absorbed into the negative electrode active material layer through the solid electrolyte layer. At this time, electrons are released to outside from the positive electrode active material layer.

In discharging the battery, on the other hand, lithium ions are desorbed from the negative electrode active material layer. Then, the lithium ions are absorbed into the positive electrode active material layer through the solid electrolyte layer. At this time, electrons are released to outside from the negative electrode active material layer. The thin-film secondary battery operates in this manner.

It is to be noted that it is preferable to stack another set of thin layers of the current-collecting thin film 7102, the negative electrode active material layer 7103, the solid electrolyte layer 7104, the positive electrode active material layer 7105, and the current-collecting thin film 7106, because charging and discharging with a large amount of electric power become possible.

A thin-film secondary battery is formed in the above manner, so that a battery in a sheet-form that is chargeable and dischargeable can be provided.

This embodiment can be implemented in combination with the technical components of the above-described embodiment modes and other embodiment. That is, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

Embodiment 2

An example of a method for manufacturing the power storage device shown in the above-described embodiment modes will be explained with reference to drawings. In this embodiment, a structure in which an antenna, a power supply portion, a charging determination portion, and a battery are formed over the same substrate will be explained. It is to be noted that when an antenna, a power supply portion, a charging determination portion, and a battery are formed over the same substrate, and also when thin film transistors are used as transistors included in the power supply portion and a charge determination portion, reduction in size of the power storage device can be achieved, which is advantageous. In addition, in this embodiment, an example will be explained, in which the thin-film secondary battery explained in the preceding embodiment is used as the battery included in the power supply portion.

Figure 18A:
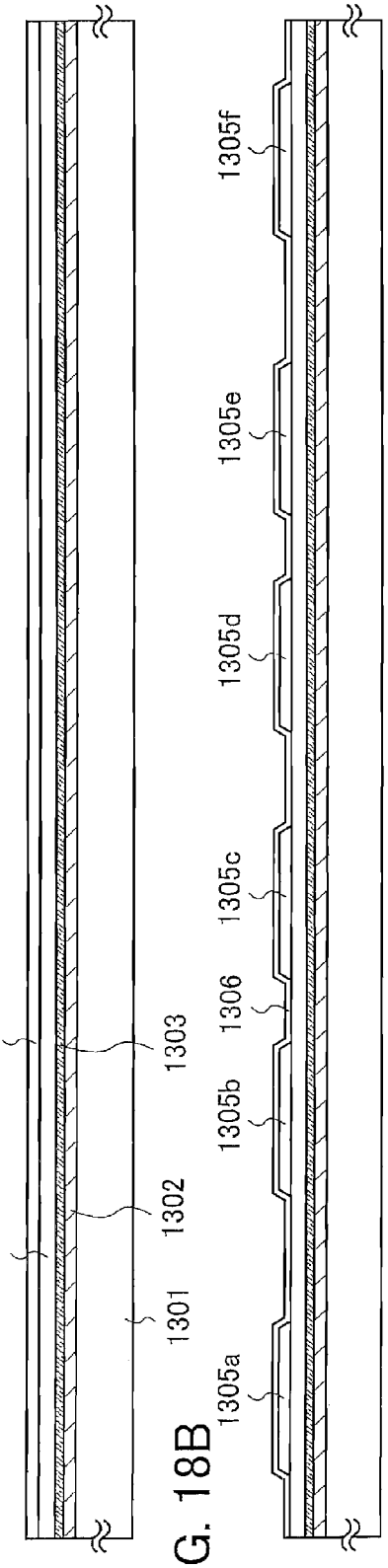
FIGS. 18A to 18D are diagrams each explaining a structure of Embodiment 2.

First, a peeling layer 1303 is formed over one surface of a substrate 1301 with an insulating film 1302 interposed therebetween, and then an insulating film 1304 functioning as a base film and a semiconductor film (e.g., a film containing amorphous silicon) 1305 are formed thereover (see FIG. 18A). It is to be noted that the insulating film 1302, the peeling layer 1303, the insulating film 1304, and the semiconductor film 1305 can be formed consecutively.

The substrate 1301 is selected from a glass substrate, a quartz substrate, a metal substrate (e.g., a stainless steel substrate), a ceramic substrate, a semiconductor substrate such as a Si substrate, or the like. Alternatively, a plastic substrate made of polyethylene terephthalate (PET), polyethylene naphthalate (PEN), polyether sulfone (PES), acrylic, or the like can be used. In a step shown in FIG. 18A, although the peeling layer 1303 is provided over the entire surface of the substrate 1301 with the insulating film 1302 interposed therebetween the peeling layer 1303 can also be selectively provided by photolithography after being provided over the entire surface of the substrate 1301.

The insulating films 1302 and 1304 are formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when each of the insulating films 1302 and 1304 is formed to have a two-layer structure, a silicon nitride oxide film may be formed as a first insulating film and a silicon oxynitride film may be formed as a second insulating film. In addition, a silicon nitride film may be formed as a first insulating film and a silicon oxide film may be formed as a second insulating film. The insulating film 1302 functions as a blocking layer which prevents an impurity element contained in the substrate 1301 from being mixed into the peeling layer 1303 or elements formed thereover. The insulating film 1304 functions as a blocking layer which prevents an impurity element contained in the substrate 1301 or the peeling layer 1303 from being mixed into elements formed over the insulating film 1304. In this manner, providing the insulating films 1302 and 1304 which function as the blocking layers can prevent adverse effects on the elements formed over the peeling layer 1303 or the insulating film 1304, which would otherwise be caused by an alkali metal such as Na or an alkaline earth metal contained in the substrate 1301 or by the impurity element contained in the peeling layer 1303. It is to be noted that when quartz is used for the substrate 1301, for example, the insulating films 1302 and 1304 may be omitted.

The peeling layer 1303 may be formed using a metal film, a stacked structure of a metal film and a metal oxide film, or the like. As a metal film, either a single layer or stacked layers are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the element as its main component. In addition, such materials can be formed by a sputtering method, various CVD methods such as a plasma CVD method, or the like. A stacked structure or a metal film and a metal oxide film can be obtained by the steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the surface of the metal film. For example, when a tungsten film is provided as a metal film by a sputtering method, a CVD method, or the like, a metal oxide film formed of tungsten oxide can be formed on the surface of the tungsten film by application of plasma treatment to the tungsten film. In that case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When forming tungsten oxide, there is no particular limitation on the value of x, and thus, which of the above oxides is to be formed may be determined base on the etching rate of the like. In addition, after a metal film (e.g., tungsten) is formed, an insulating film formed of silicon oxide ($SiO_2$) or the like may be formed over the metal film by a sputtering method, and also metal oxide (e.g., tungsten oxide over tungsten) may be formed over the metal film. Moreover, high-density-plasma treatment may be applied as the plasma treatment, for example. Besides, metal nitride or metal oxynitride may also be formed. In that case, plasma treatment or heat treatment may be applied to the metal film under a nitrogen atmosphere or an atmosphere containing nitrogen and oxygen.

The amorphous semiconductor film 1305 is formed with a thickness of 25 to 200 nm (preferably, 30 to 150 nm) by a sputtering method, an LPCVD method, a plasma CVD method, or the like.

Figure 18B:
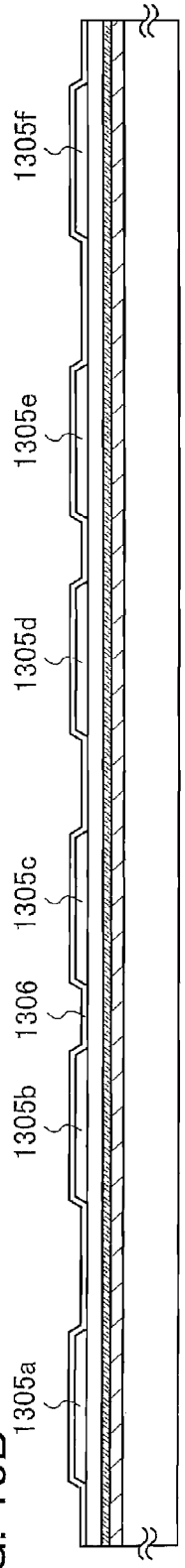

Next, the amorphous semiconductor film 1305 is crystallized by laser light irradiation. It is to be noted that the crystallization of the amorphous semiconductor film 1305 may also be performed by a method combining the laser crystallization with a thermal crystallization method using RTA or an annealing furnace or with a thermal crystallization method using a metal element that promotes the crystallization. After that, the crystalline semiconductor film is etched into a desired shape, whereby crystalline semiconductor films 1305a to 1305f are formed. Then, a gate insulating film 1306 is formed so as to cover the semiconductor films 1305a to 1305f (see FIG. 18B).

The gate insulating film 1306 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 1306 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film.

An example of a formation step of the crystalline semiconductor films 1305a to 1305f is briefly explained below. First, an amorphous semiconductor film with a thickness of 50 to 60 nm is formed by a plasma CVD method. Then, a solution containing nickel which is a metal element that promotes crystallization is retained on the amorphous semiconductor film, which is followed by dehydrogenation treatment (500° C. for one hour) and thermal crystallization treatment (550° C. for four hours). Thus, a crystalline semiconductor film is formed. Thereafter, the crystalline semiconductor film is irradiated with laser light by a photolithography method and etched, whereby the crystalline semiconductor films 1305a to 1305f are formed. It is to be noted that crystallization of the amorphous semiconductor film may be performed only by laser light irradiation, not by thermal crystallization which uses a metal element that promotes crystallization.

As a laser oscillator used for crystallization, either a continuous wave laser (a CW laser) or a pulsed laser can be used. As a laser that can be used here, there are gas lasers such as an Ar laser, a Kr laser, and an excimer laser; a laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of approximately 0.01 to 100 MW/cm$^2$ (preferably, 0.1 to 10 MW/cm$^2$) is needed, and irradiation is performed with a scanning rate of approximately 10 to 2000 cm/sec. It is to be noted that the laser in which single crystal YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; an Ar ion laser, or a Ti:sapphire laser can be used as a CW laser, whereas it can also be used as pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film is melted by the previous laser and solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1306 may be formed by oxidization or nitridation of the surfaces of the semiconductor films 1305a to 1305f by the above-described high-density plasma treatment. For example, plasma treatment with a mixed gas of a rare gas such as He, Ar, Kr, or Xe, and oxygen, nitrogen oxide ($NO_2$), ammonia, nitrogen, or hydrogen is used. When plasma is excited by the introduction of microwaves, plasma with a low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film with a thickness of 1 to 20 nm, typically 5 to 10 nm, is formed on the semiconductor films. Since the reaction in this case is a solid-phase reaction, interface state density between the insulating film and the semiconductor films can be quite low. Since such high-density plasma treatment directly oxidizes (or nitrides) the semiconductor films (crystalline silicon or polycrystalline silicon), the insulating film can be formed with extremely little unevenness, which is ideal. In addition, since crystal grain boundaries of crystalline silicon are not strongly oxidized, an excellent state is obtained. That is, by the solid-phase oxidation of the surfaces of the semiconductor films by high-density plasma treatment which is described in this embodiment mode, an insulating film with a uniform thickness and low interface state density can be formed without excessive oxidation reaction at the crystal grain boundaries.

As the gate insulating film, only an insulating film formed by high-density plasma treatment may be used, or a stacked layer which is obtained by deposition of an insulating film such as silicon oxide, silicon oxynitride, or silicon nitride on the insulating film by a CVD method using plasma or thermal reaction. In either case, a transistor which includes an insulating film formed by high-density plasma treatment in a part or the whole of its gate insulating film can have small characteristic variations.

In addition, the semiconductor films 1305a to 1305f, which are obtained by irradiation of a semiconductor film with a continuous wave laser beam oscillated with a repetition rate of 10 MHz or more and scanning of the semiconductor film in one direction to crystallize the semiconductor film, have a characteristic in that their crystals grow in the beam scanning direction. A transistor is arranged so that its channel length direction (direction in which carriers move when a channel formation region is formed) is aligned with the scanning direction, and the above-described gate insulating film is combined with the semiconductor film, whereby a thin film transistor (TFTs) with high electron field effect mobility and few variations in characteristics can be obtained.

Next, a first conductive film and a second conductive film are stacked over the gate insulating film 1306. Here, the first conductive film is formed to a thickness of 20 to 100 nm by a CVD method, a sputtering method, or the like. The second conductive film is formed to a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its main component. Alternatively, the first conductive film and the second conductive film are formed of a semiconductor material typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film, thermal treatment for the purpose of heat activation can be applied thereto. In addition, in the case where a two-layer structure is not employed, but a three-layer structure is employed, it is preferable to use a stacked structure of a molybdenum film, an aluminum film, and a molybdenum film.

Next, a resist mask is formed by photolithography, and etching treatment for forming gate electrodes and gate lines is applied. Thus, gate electrodes 1307 are formed above the semiconductor films 1305a to 1305f. Here, a stacked structure of a first conductive film 1307a and a second conductive film 1307b is shown as an example of the gate electrode 1307.

Figure 18C:
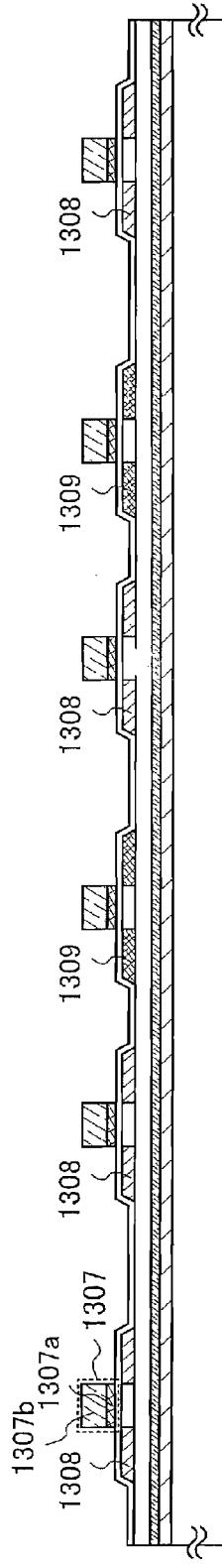

Next, the semiconductor films 1305a, 1305b, 1305d, and 1305f are doped with an n-type impurity element at low concentration, using the gate electrodes 1307 as masks by an ion doping method or an ion implantation method. Then, a resist mask is selectively formed by photolithography, and the semiconductor films 1305c and 1305e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1305a, 1305b, 1305d, and 1305f so as to be contained at concentrations of $1\times10^{15}$ to $1\times10^{19}/cm^3$. Thus, n-type impurity regions 1308 are formed. In addition, boron (B) is used as a p-type impurity element, and is selectively introduced into the semiconductor films 1305c and 1305e so as to be contained at concentrations of $1\times10^{19}$ to $1\times10^{20}/cm^3$. Thus, n-type impurity regions 1309 are formed (see FIG. 18C).

Subsequently, an insulating film is formed so as to cover the gate insulating film 1306 and the gate electrodes 1307. The insulating film is formed to have either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching (mainly in the perpendicular direction), so that insulating films 1310 (also referred to as sidewalls) which is in contact with the side surfaces of the gate electrodes 1307 are formed. The insulating films 1310 are used as doping masks for forming LDD (Lightly Doped Drain) regions.

Next, the semiconductor films 1305a, 1305b, 1305d, and 1305f are doped with an n-type impurity element at high concentration, using the gate electrodes 1307 and the insulating films 1310 as masks. Thus, n-type impurity regions 1311 are formed. Here, phosphorus (P) is used as an n-type impurity element, and is selectively introduced into the semiconductor films 1305a, 1305b, 1305d, and 1305f so as to be contained at concentrations of $1\times10^{19}$ to $1\times10^{20}/cm^3$. Thus, the n-type impurity regions 1311 with higher concentration of impurity than that of the impurity regions 1308 are formed.

Figure 18D:
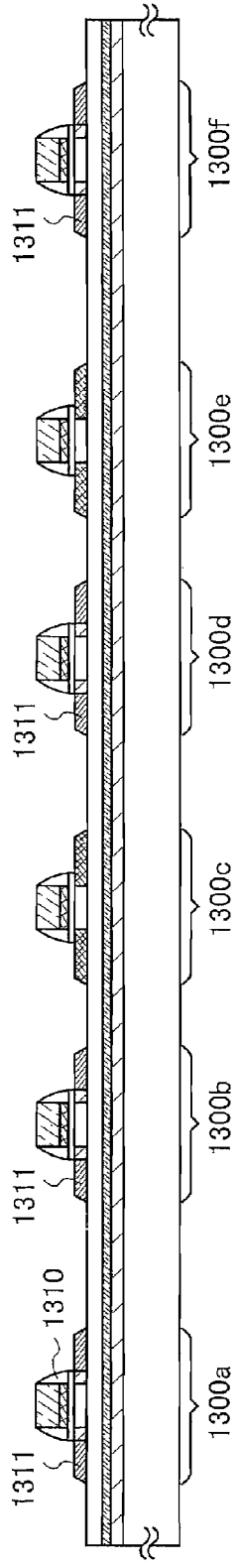

Through the above steps, n-channel transistors 1300a, 1300b, 1300d, and 1300f, and p-channel thin film transistors 1300c and 1300e are formed (see FIG. 18D).

In the n-channel thin film transistor 1300a, a channel formation region is formed in a region of the semiconductor film 1305a which overlaps with the gate electrode 1307; the impurity region 1311 which forms a source region or a drain region is formed in a region of the semiconductor film 1305a which does not overlap with the gate electrode 1307 and the insulating film 1310; and a low concentration impurity region (LDD region) is formed in a region of the semiconductor film 1305*a* which overlaps with the insulating film 1310 and between the channel formation region and the impurity region 1311. Similarly, channel formation regions, low concentration impurity regions, and the impurity regions 1311 are formed in the n-channel thin film transistors 1300*b*, 1300*d*, and 1300*f*.

In the p-channel thin film transistor 1300*c*, a channel formation region is formed in a region of the semiconductor film 1305*c* which overlaps with the gate electrode 1307, and the impurity region 1309 which forms a source region or a drain region is formed in a region of the semiconductor film 1305*c* which does not overlap with the gate electrode 1307. Similarly, a channel formation region and the impurity region 1309 are formed in the p-channel thin film transistor 1300*e*. Here, although LDD regions are not formed in the p-channel thin film transistors 1300*c* and 1300*e*, LDD regions may be provided in the p-channel thin film transistors or a structure without LDD regions may be applied to the n-channel thin film transistors.

Figure 19A:
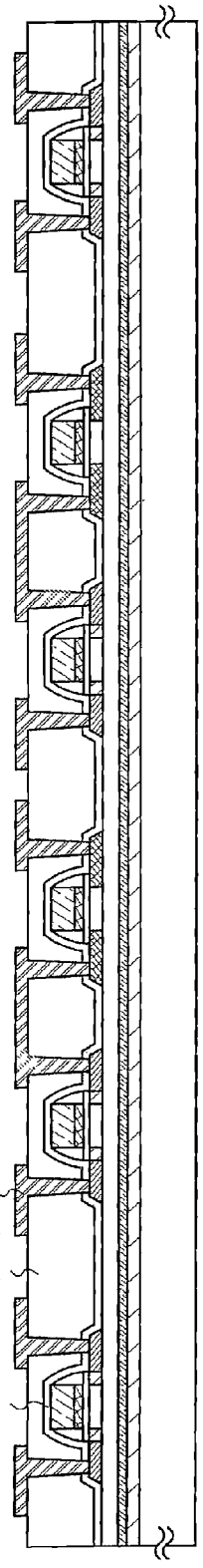
FIGS. 19A to 19C are diagrams each explaining a structure of Embodiment 2.

Next, an insulating film with a single layer or stacked layers is formed so as to cover the semiconductor films 1305*a* to 1305*f*, the gate electrodes 1307, and the like. Then, conductive films 1313 electrically connected to the impurity regions 1309 and 1311 which form the source and drain regions of the thin film transistors 1300*a* to 1300*f* are formed over the insulating film (see FIG. 19A). The insulating film is formed of a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. Here, the insulating film is formed to have two layers, and a silicon nitride oxide film is formed as a first insulating film 1312*a* and a silicon oxynitride film is formed as a second insulating film 1312*b*. In addition, the conductive films 1313 can form the source and drain electrodes of the thin film transistors 1300*a* o 1300*f*.

It is to be noted that before the insulating films 1312*a* and 1312*b* are formed or after one or both of them is/are formed, heat treatment is preferably applied for recovery of the crystallinity of the semiconductor films, activation of the impurity element which has been added into the semiconductor films, or hydrogenation of the semiconductor films. As the heat treatment, thermal annealing, laser annealing, RTA, or the like is preferably applied.

The conductive films 1313 are formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, a material which contains aluminum as its main component and also contains nickel, or a material which contains aluminum as its main component and also contains nickel and one or both of carbon and silicon. The conductive films 1313 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are the most suitable material for forming the conductive films 1313 because they have low resistance value and are inexpensive. When barrier layers are provided as the top layer and the bottom layer, generation of hillocks of aluminum or aluminum silicon can be prevented. In addition, when a barrier film formed of titanium which is an element having a high reducing property is formed, even when there is a thin natural oxide film formed on the crystalline semiconductor film, the natural oxide film can be chemically reduced, and a favorable contact between the conductive film 1313 and the crystalline semiconductor film can be obtained.

Next, an insulating film 1314 is formed so as to cover the conductive films 1313, and conductive films 1315*a* and 1315*b* electrically connected to the conductive films 1313 which form the source electrode or the drain electrode of the thin film transistors 1300*a* and 1300*f* are formed. In addition, a conductive film 1316 electrically connected to the conductive film 1313 which forms the source electrode or drain electrode of the thin film transistor 1300*b* is formed. It is to be noted that the conductive films 1315*a* and 1315*b* and the conductive film 1316 may be formed using the same material. The conductive films 1315*a* and 1315*b* and the conductive film 1316 may be formed using any of the above-described material which has been described for the conductive film 1313.

Figure 19B:
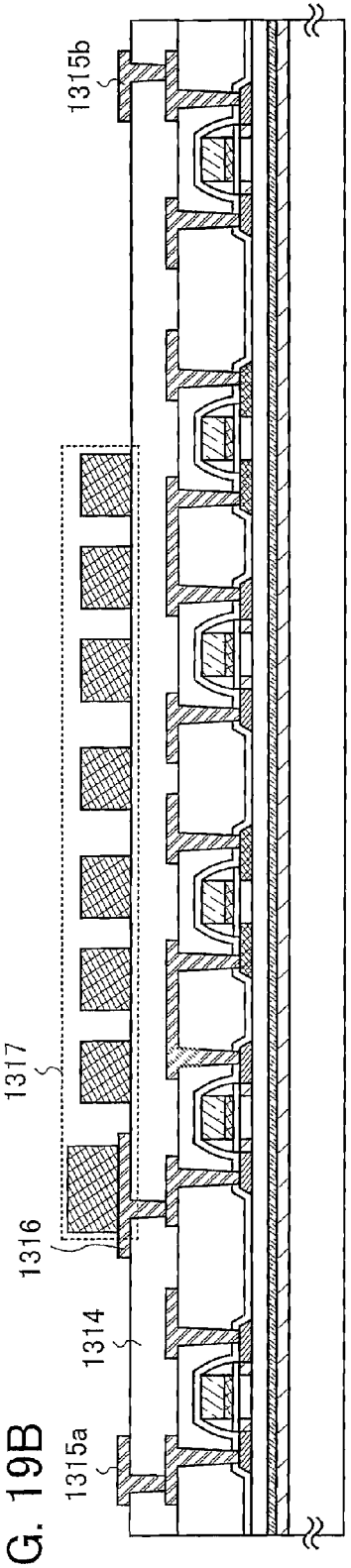

Next, a conductive film 1317 functioning as an antenna is formed so as to be electrically connected to the conductive film 1316 (see FIG. 19B).

The insulating film 1314 can be formed of a single layer or a stacked layer of an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. Further alternatively, both a fluoro group and an organic group containing at least hydrogen may be used as the substituent.

The conductive film 1317 can be formed of a conductive material by a CVD method, a sputtering method, a printing method such as screen printing or gravure printing, a droplet discharging method, a dispenser method, a plating method, or the like. The conductive film 1317 is formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

For example, when the conductive film 1317 functioning as an antenna is formed by a screen printing method, the antenna can be provided by selective printing of a conductive paste in which conductive particles with a grain diameter of several nm to several tens of µm are dissolved or dispersed in an organic resin. The conductive particles can be at least one or more of metal particles selected from silver (Ag), gold (Ag), copper (Cu), nickel (Ni), platinum (Pt), palladium (Pd), tantalum (Ta), molybdenum (Mo), titanium (Ti), and the like; fine particles of silver halide; and dispersive nanoparticles. In addition, the organic resin included in the conductive paste can be one or more of organic resins which function as a binder, a solvent, a dispersing agent, and a coating material of the metal particles. Typically, an organic resin such as an epoxy resin and a silicone resin can be given as examples. In addition, it is preferable to form the conductive film by the steps of providing a conductive paste and baking it. For example, in the case of using fine particles (e.g., a grain diameter of 1 to 100 nm) containing silver as its main component as a material of the conductive paste, the conductive paste is baked and hardened at temperatures in the range of 150 to 300° C., so that the conductive film can be obtained. Alternatively, it is also possible to use fine particles containing solder or lead-free solder as its main component. In that case, fine particles with a grain diameter of less than or equal to 20 µm are preferably used. Solder and lead-free solder have the advantage of low cost.

The conductive films 1315a and 1315b can function as wirings which are electrically connected to the battery included in the power storage device of the present invention in a later step. In addition, in forming the conductive film 1317 which functions as an antenna, another set of conductive films may be separately formed so as to be electrically connected to the conductive films 1315a and 1315b, so that the conductive films can be utilized as the wirings connected to the battery.

Figure 19C:
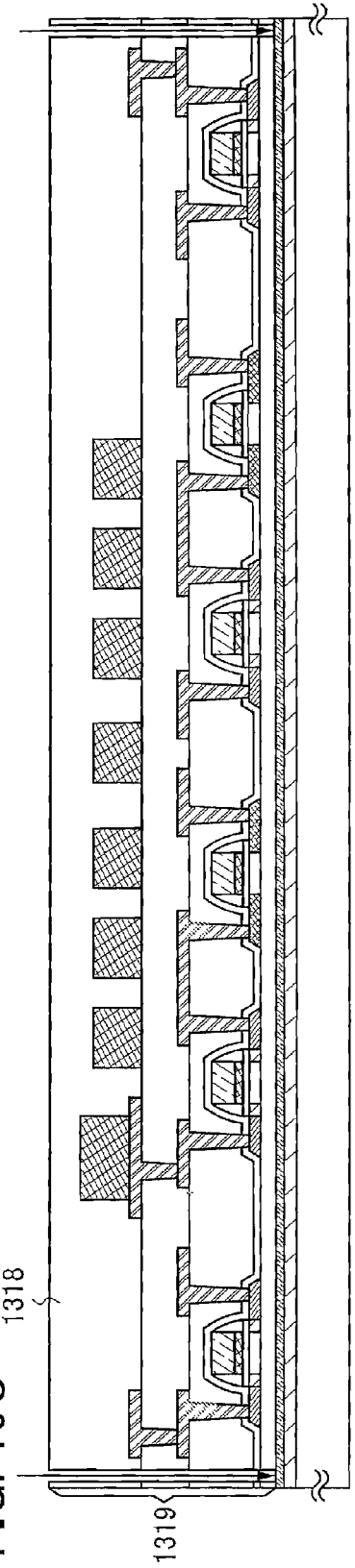
Figure 21A:
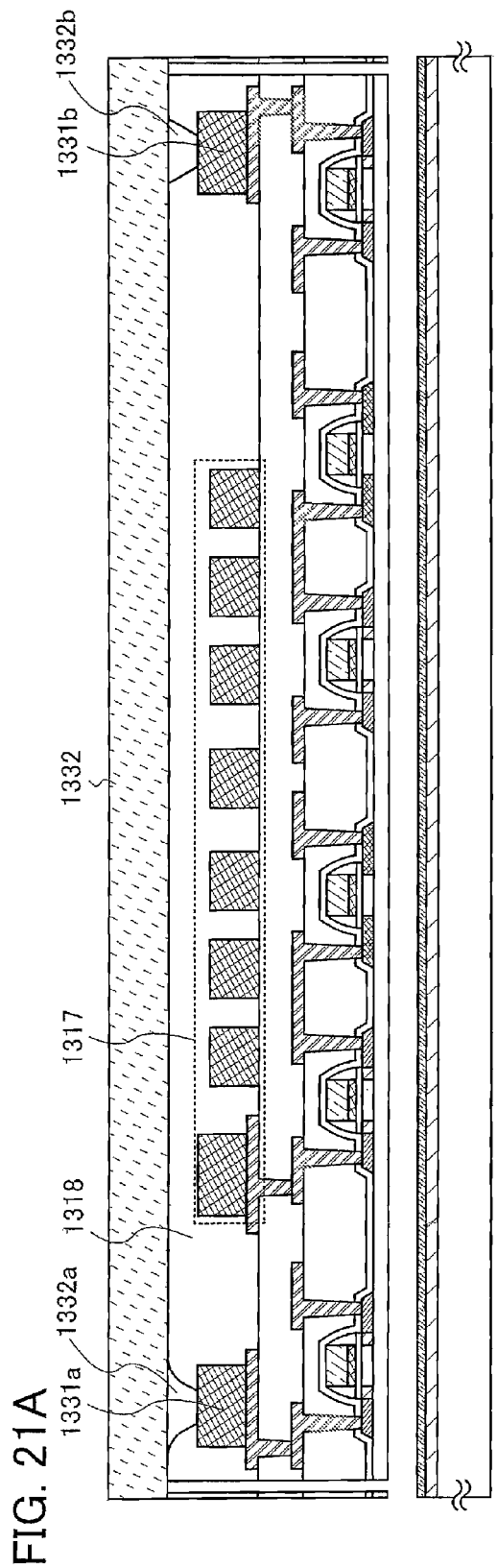
FIGS. 21A and 21B are diagrams each explaining a structure of Embodiment 2.
Figure 21B:
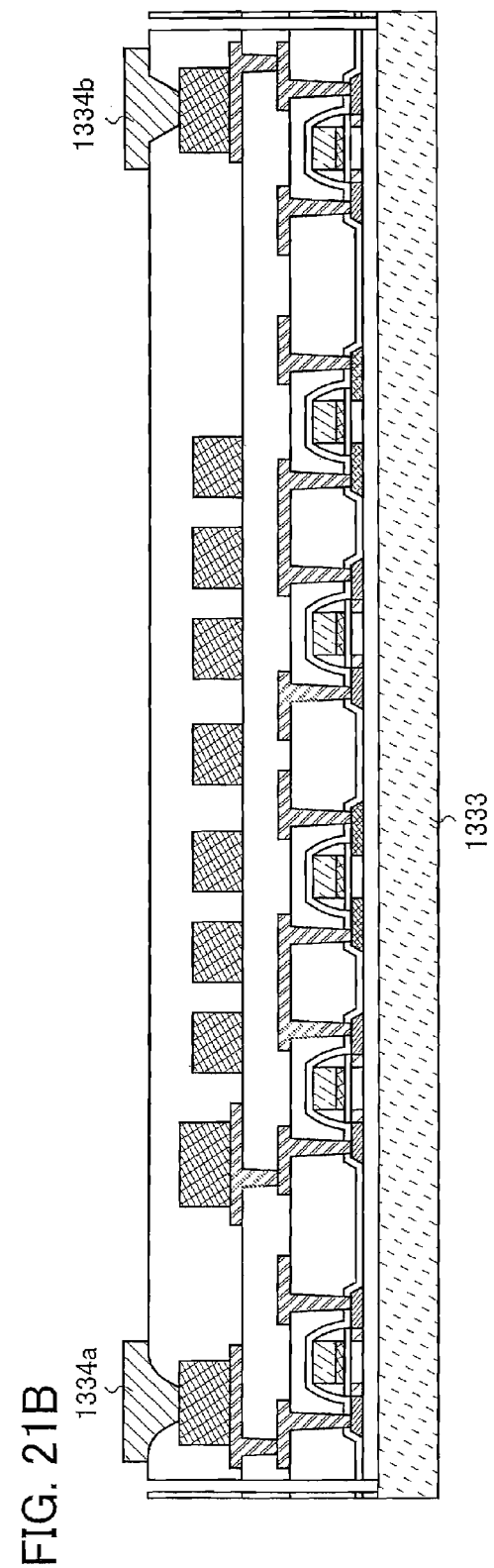

Next, after forming an insulating film 1318 so as to cover the conductive film 1317, layers including the thin film transistors 1300a to 1300f, the conductive film 1317, and the like (hereinafter referred to as an "element formation layer 1319") are peeled off the substrate 1301. Here, after forming openings in the element formation layer 1319 excluding the region of the thin film transistors 1300a to 1300f by laser light irradiation (e.g., UV light) (see FIG. 19C), the element formation layer 1319 can be peeled off the substrate 1301 with a physical force. The peeling layer 1303 may be selectively removed by introduction of an etchant into the openings before peeling the element formation layer 1319 off the substrate 1301. As the etchant, a gas or a liquid containing halogen fluoride or an interhalogen compound is used. For example, when chlorine trifluoride ($ClF_3$) is used as the gas containing halogen fluoride, the element formation layer 1319 is peeled off the substrate 1301. It is to be noted that the whole peeling layer 1303 is not removed but part thereof may be left. Accordingly, the consumption of the etchant can be suppressed and process time for removing the peeling layer can be shortened. In addition, even after removing the peeling layer 1301, the element formation layer 1319 can be held above the substrate 1301. In addition, by reuse of the substrate 1301 over which the element formation layer 1319 has been peeled off, cost reduction can be achieved.

The insulating film 1318 can be formed of a single layer or a stacked layer of an insulating film containing oxygen or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as DLC (Diamond-Like Carbon); an organic material such as epoxy, polyimide, polyimide, polyvinyl phenol, benzocyclobutene, or acrylic; or a siloxane material such as a siloxane resin by a CVD method, a sputtering method, or the like.

In this embodiment, after forming the openings in the element formation layer 1319 by laser light irradiation, a first seat material 1320 is attached to one surface of the element formation layer 1319 (the surface where the insulating film 1318 is exposed), and then the element formation layer 1319 is peeled off the substrate 1301 (see FIG. 20A).

Next, a second seat material 1321 is attached to the other surface of the element formation layer 1319 (the surface exposed by peeling), followed by one or both of heat treatment and pressurization treatment (see FIG. 20B). As the first seat material 1320 and the second seat material 1321, a hot-melt film or the like can be used.

As the first sheet material 1320 and the second sheet material 1321, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided over one of its surfaces, or a film with an antistatic material provided over each of its surfaces. The film with an antistatic material provided over one of its surfaces may be attached to the layer so that the antistatic material is placed on the inner side of the film or the outer side of the film. The antistatic material may be provided over the entire surface of the film, or over a part of the film. As an antistatic material, a metal, indium tin oxide (ITO), or a surfactant such as an amphoteric surfactant, a cationic surfactant, or a nonionic surfactant can be used. In addition, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be prevented from adverse effects such as external static electricity when dealt with as a commercial product.

It is to be noted that the thin-film secondary battery described in Embodiment 1 is connected to the conductive films 1315a and 1315b, so that the battery is formed. Connection between the battery and the conductive films 1315a and 1315b may be conducted before the element formation layer 1319 is peeled off the substrate 1301 (at the stage shown in FIG. 19B or FIG. 19C), after the element formation layer 1319 is peeled off the substrate 1301 (at the stage shown in FIG. 20A), or after the element formation layer 1319 is sealed with the first sheet material and the second sheet material (at the stage shown in FIG. 20B). An example where the element formation layer 1319 and the battery are formed to be connected is explained below with reference to FIGS. 21A and 21B and FIGS. 22A and 22B.

In FIG. 19B, conductive films 1331a and 1331b which are electrically connected to the conductive films 1315a and 1315b, respectively are formed at the same time as the conductive film 1317 which functions as an antenna. Then, the insulating film 1318 is formed so as to cover the conductive films 1317, 1331a, and 1331b, followed by formation of openings 1332a and 1332b so that the surfaces of the conductive films 1331a and 1331b are exposed. After that, openings are formed in the element formation layer 1319 by laser light irradiation, and the first seat material 1332 is attached to one surface of the element formation layer 1319 (the surface where the insulating film 1318 is exposed), so that the element formation layer 1319 is peeled off the substrate 1301 (see FIG. 21A).

Next, the second seat material 1333 is attached to the other surface of the element formation layer 1319 (the surface exposed by peeling), and the element formation layer 1319 is peeled off the first seat material 1332. Therefore, a material with low viscosity is used as the first seat material 1320. Then, conductive films 1334a and 1334b which are electrically connected to the conductive films 1331a and 1331b respectively through the openings 1332a and 1332b are selectively formed (see FIG. 21B).

The conductive films 1334a and 1334b are formed of a conductive material by a CVD method, a sputtering method, a printing method such as screen printing or gravure printing, a droplet discharging method, a dispenser method, a plating method, or the like. The conductive films 1334a and 1334b are formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

It is to be noted that although the example shown here is the case where the conductive films 1334a and 1334b are formed after peeling the element formation layer 1319 off the substrate 1301, the element formation layer 1319 may be peeled off the substrate 1301 after the formation of the conductive films 1334a and 1334b.

Next, in the case where a plurality of elements is formed over the substrate, the element formation layer 1319 is cut into individual elements (see FIG. 22A). A laser irradiation apparatus, a dicing apparatus, a scribing apparatus, or the like can be used for the cutting. Here, the plurality of elements formed over one substrate is separated from one another by laser light irradiation.

Next, the separated elements are electrically connected to the battery (see FIG. 22B). In this embodiment mode, the thin-film secondary battery described in Embodiment 1 is used as the battery, in which a current-collecting thin film, a negative electrode active material layer, a solid electrolyte layer, a positive electrode active material layer, and a current-collecting thin film are sequentially stacked.

Conductive films 1336a and 1336b are formed of a conductive material by a CVD method, a sputtering method, a printing method such as screen printing or gravure printing, a droplet discharging method, a dispenser method, a plating method, or the like. The conductive films 1336a and 1336b are formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component. It is to be noted that the conductive films 1336a and 1336b correspond to the current-collecting thin film 7102 described in Embodiment 1. Therefore, it is necessary that the conductive material has high adhesion to a negative electrode active material layer and also has low resistance. In particular, aluminum, copper, nickel, vanadium, or the like is preferably used.

The structure of the thin-film secondary battery is described next. A negative electrode active material layer 1381 is formed over the conductive film 1336a. In general, vanadium oxide ($V_2O_5$) or the like is used. Next, a solid electrolyte layer 1382 is formed over the negative electrode active material layer 1381. In general, lithium phosphate ($Li_3PO_4$) or the like is used. Next, a positive electrode active material layer 1383 is formed over the solid electrolyte layer 1382. In general, lithium manganate ($LiMn_2O_4$) or the like is used. Lithium cobaltate ($LiCoO_2$) or lithium nickel oxide ($LiNiO_2$) may also be used. Next, a current-collecting thin film 1384 to serve as an electrode is formed over the positive electrode active material layer 1383. It is necessary that the current-collecting thin film 1384 has high adhesion to the positive electrode active material layer 1383 and also has low resistance. For example, aluminum, copper, nickel, vanadium, or the like can be used.

Each of the above thin layers of the negative electrode active material layer 1381, the solid electrolyte layer 1382, the positive electrode active material layer 1383, and the current-collecting thin film 1384 may be formed by a sputtering technique or a vapor-deposition technique. In addition, the thickness of each layer is preferably 0.1 to 3 µm.

Next, an interlayer film 1385 is formed by application of a resin. The interlayer film 1385 is etched to form a contact hole. The interlayer film 1385 is not limited to a resin, and other films such as a CVD oxide film may be used as well; however, a resin is preferably used in teens of flatness. In addition, the contact hole may be formed without using etching, but using a photosensitive resin. Next, a wiring layer 1386 is formed over the interlayer film 1385 and connected to the conductive film 1334b. Thus, an electrical connection between the thin-film secondary battery and the element formation layer 1319 is secured.

Here, the conductive films 1334a and 1334b which are provided in the element formation layer 1319 are connected to the conductive films 1336a and 1336b respectively, which serve as the connecting terminals of the thin-film secondary battery 1389 which is the battery stacked in advance. Here, an example is shown in which an electrical connection between the conductive films 1334a and 1336a or an electrical connection between the conductive films 1334b and 1336b is performed by pressure bonding with an adhesive material such as an anisotropic conductive film (ACF) or an anisotropic conductive paste (ACP). The example shown here is the case where the connection is performed using conductive particles 1338 included in an adhesive resin 1337. Alternatively, a conductive adhesive such as a silver paste, a copper paste, or a carbon paste; solder joint; or the like can be used.

It is to be noted that the structure of a transistor can be various without being limited to the specific structure shown in this embodiment. For example, a multi-gate structure having two or more gate electrodes may be employed. When a multi-gate structure is employed, a structure in which channel regions are connected in series is provided; therefore, a structure in which a plurality of transistors is connected in series is provided. When a multi-gate structure is employed, various advantages can be obtained in that off-current can be reduced; withstand voltage of the transistor can be increased, so that the reliability is increased; and even if drain-source voltage changes when the transistor operates in the saturation region, a drain-source current does not change very much, and thus flat characteristics can be obtained. In addition, a structure in which gate electrodes are formed above and below a channel may also be employed. When a structure in which gate electrodes are formed above and below a channel is employed, the channel region is enlarged and the amount of current flowing therethrough can be increased. Thus, a depletion layer can be easily formed and the S value can be decreased. When gate electrodes are formed above and below a channel, a structure in which a plurality of transistors is connected in parallel is provided.

In addition, any of the following structures may be employed: a structure in which a gate electrode is formed above a channel; a structure in which a gate electrode is formed below a channel; a staggered structure; an inversely staggered structure; and a structure in which a channel region is divided into a plurality of regions and the divided regions are connected in parallel or in series. In addition, a channel (or part thereof) may overlap with a source electrode or a drain electrode. However, when a structure in which a channel (or part thereof) does not overlap with a source electrode or a drain electrode is employed, electric charge can be prevented from being accumulated in part of the channel and an unstable operation can be prevented. In addition, an LDD (Lightly Doped Drain) region may be provided. When an LDD region is provided, off-current can be reduced; the withstand voltage of the transistor can be increased, so that the reliability is increased; and even if drain-source voltage changes when the transistor operates in the saturation region, drain-source current does not change very much, and thus flat characteristics can be obtained.

This embodiment can be implemented in combination with the technical components of the above-described embodiment modes and other embodiment. That is, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some causes, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

Embodiment 3

An example of a method for manufacturing a power storage device described in the above embodiment modes will be explained with reference to drawings. In this embodiment, a structure in which an antenna, a power supply portion, a charging determination portion, and a battery are formed over the same substrate will be explained. It is to be noted that when an antenna, a power supply portion, a charging determination portion, and a battery are formed over a substrate at a time, and also when transistors formed using a single crystal substrate are used as the transistors included in the power supply portion and the charging determination portion, a power storage device having transistors with few characteristic variations can be formed, which is preferable. In addition, in this embodiment, an example is explained in which the thin-film secondary battery described in the above-described embodiment is used as the battery included in the power supply portion.

Figure 23A:
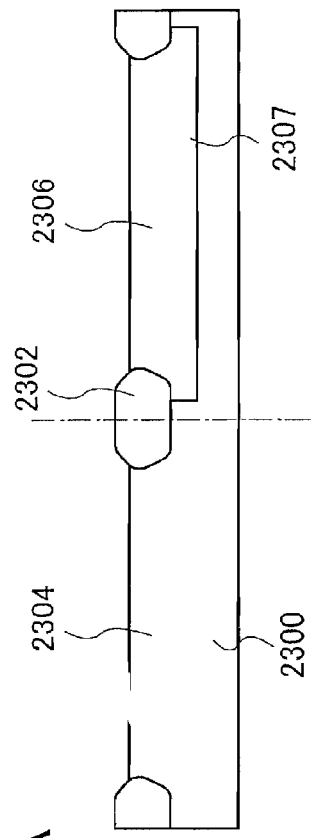
FIGS. 23A to 23C are diagrams each explaining a structure of Embodiment 3.

First, element separation regions 2304 and 2306 (hereinafter simply referred to as regions 2304 and 2306) are formed in a semiconductor substrate 2300 (see FIG. 23A). The regions 2304 and 2306 provided in the semiconductor substrate 2300 are insulated from each other by an insulating film (also referred to as a field oxide film) 2302. The example shown here is the case where a single crystal Si substrate having n-type conductivity is used as the semiconductor substrate 2300, and a p well 2307 is formed in the region 2306 of the semiconductor substrate 2300.

Any substrate can be used as the substrate 2300 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by IMplanted OXygen) method, or the like can be used.

The element separation regions 2304 and 2306 can be formed by a selective oxidation (LOCOS: LOCal Oxidation of Silicon) method, a trench isolation method, or the like.

In addition, the p well 2307 formed in the region 2306 of the semiconductor substrate 2300 can be formed by selective doping of the semiconductor substrate 2300 with a p-type impurity element. As a p-type impurity element, boron (B), aluminum (Al), gallium (Ga), or the like can be used.

In this embodiment, although the region 2304 is not doped with an impurity element because an n-type semiconductor substrate is used as the semiconductor substrate 2300, an n well may be formed in the region 2304 by introduction of an n-type impurity element. As an n-type impurity element, phosphorus (P), arsenic (As), or the like can be used. When a p-type semiconductor substrate is used, on the other hand, a structure may be employed in which the region 2304 is doped with an n-type impurity element to form an n well, whereas the region 2306 is not doped with an impurity element.

Figure 23B:
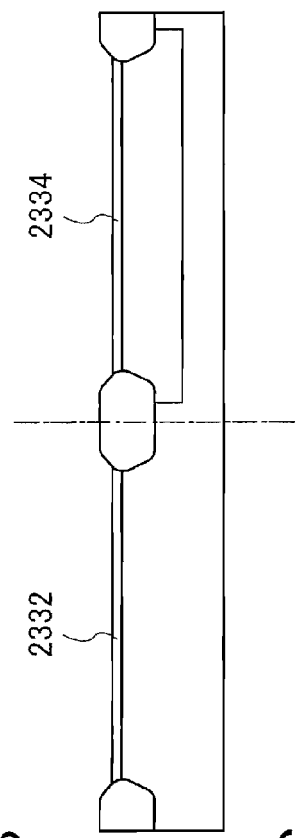

Next, insulating films 2332 and 2334 are formed so as to cover the regions 2304 and 2306, respectively (see FIG. 23B).

For example, surfaces of the regions 2304 and 2306 provided in the semiconductor substrate 2300 are oxidized by heat treatment, so that the insulating films 2332 and 2334 can be formed of a silicon oxide film. Alternatively, the insulating films 2332 and 2334 can be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 2332 and 2334 can be formed by plasma treatment. For example, the insulating films 2332 and 2334 can be formed using a silicon oxide ($SiO_x$) film or a silicon nitride ($SiN_x$) film which is obtained by application of high-density plasma oxidation or high-density plasma nitridation treatment to the surfaces of the regions 2304 and 2304 provided in the semiconductor substrate 2300. Furthermore, after applying high-density plasma oxidation treatment to the surfaces of the regions 2304 and 2306, high-density plasma nitridation treatment may be performed. In that case, silicon oxide films are formed on the surfaces of the regions 2304 and 2306, and then silicon oxynitride films are formed on the silicon oxide films. Thus, the insulating films 2332 and 2334 are each formed to have a stacked structure of the silicon oxide film and the silicon oxynitride film. In addition, high-density plasma oxidation or high-density nitridation treatment may be applied to the silicon oxide films after silicon oxide films are formed on the surfaces of the regions 2304 and 2306 by a thermal oxidation method.

The insulating films 2332 and 2334 formed over the regions 2304 and 2306 of the semiconductor substrate 2300 respectively function as the gate insulating films of transistors which are completed later.

Figure 23C:
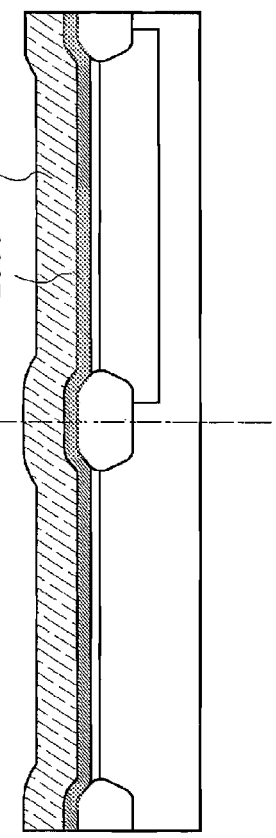

Next, a conductive film is formed so as to cover the insulating films 2332 and 2334 which are formed over the regions 2304 and 2306, respectively (see FIG. 23C). Here, an example is shown in which conductive films 2336 and 2338 are sequentially stacked as the conductive film. Needless to say, the conductive film may be formed to have a single layer or a stacked structure of three or more layers.

As a material of the conductive films 2336 and 2338, an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its main component can be used. Alternatively, a metal nitride film obtained by nitridation of the above element can be used. Besides, a semiconductor material typified by polycrystalline silicon doped with an impurity element such as phosphorus can be used.

Here, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and form the conductive film 2338 using a single-layer film or a stacked film of tantalum, molybdenum, and/or titanium.

Next, the stacked conductive films 2336 and 2338 are selectively removed by etching, so that the conductive films 2336 and 2338 remain above part of the regions 2304 and 2306, respectively. Thus, gate electrodes 2340 and 2342 are formed (see FIG. 24A).

Next, a resist mask 2348 is selectively formed so as to cover the region 2304, and the region 2306 is doped with an impurity element using the resist mask 2348 and the gate electrode 2342 as masks, so that impurity regions are formed (see FIG. 24B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 24B, by introduction of the impurity element, impurity regions 2352 which form source and drain regions and a channel formation region 2350 are formed in the region 2306.

Next, a resist mask 2366 is selectively formed so as to cover the region 2306, and the region 2304 is doped with an impurity element using the resist mask 2366 and the gate electrode 2340 as masks, so that impurity regions are formed (see FIG. 24C). As the impurity element, an n-type impurity region or a p-type impurity region is used. As an n-type impurity element, phosphorus (P), arsenic (As), or the like can be used. As a p-type impurity element, boron (B), aluminum (Al), gallium (Ga), or the like can be used. Here, an impurity element (e.g., boron (B)) of a conductivity type opposite to that of the impurity element introduced into the region 2306 in FIG. 24B is used. As a result, impurity regions 2370 which form source and drain regions and a channel formation region 2368 are formed in the region 2304.

Figure 25A:
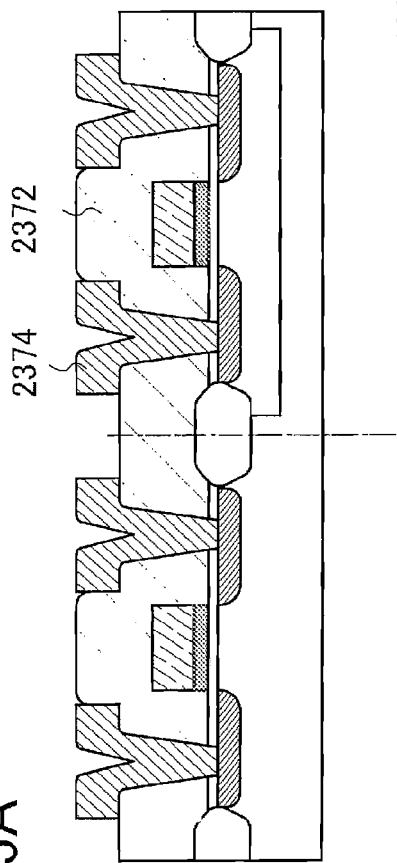
FIGS. 25A and 25B are diagrams each explaining a structure of Embodiment 3.

Next, a second insulating film 2372 is formed so as to cover the insulating films 2332 and 2334 and the gate electrodes 2340 and 2342. Then, wirings 2374, which are electrically connected to the impurity regions 2352 and 2370 formed in the regions 2306 and 2304 respectively, are formed over the second insulating film 2372 (see FIG. 25A).

The second insulating film 2372 can be formed of a single layer or a stacked layer of an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used.

The wirings 2374 are formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, a material which contains aluminum as its main component and also contains nickel, or a material which contains aluminum as its main component and also contains nickel and one or both of carbon and silicon. The wirings 2374 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are the most suitable material for forming the wirings 2374 because they have high resistance values and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the wirings 2374 and the crystalline semiconductor film can be obtained.

It is to be noted that the structure of the transistor included in the power storage device of the present invention is not limited to the one shown in the drawing. For example, a transistor with an inversely staggered structure, a FinFET structure, or the like can be used. A FinFET structure is preferable because it can suppress a short channel effect which occurs with reduction in transistor size.

The power storage device of the present invention includes a battery. As the battery, the thin-film secondary battery shown in the above-described embodiment is preferably used. In this embodiment, a connection between the transistor formed in this embodiment and a thin-film secondary battery is explained.

Figure 25B:
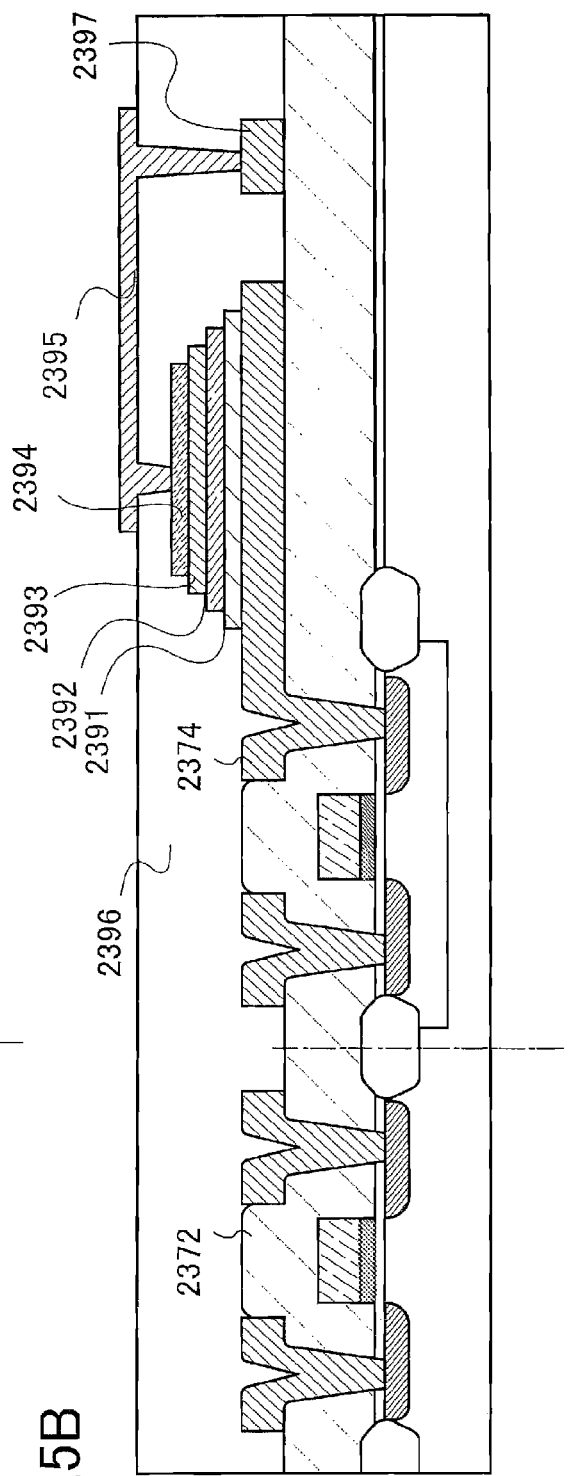

In this embodiment, a thin-film secondary battery is stacked over the wiring 2374 connected to the transistor. The thin-film secondary battery has a structure in which a current-collecting thin film, a negative electrode active material layer, a solid electrolyte layer, a positive electrode active material layer, and a current-collecting thin film are sequentially stacked (see FIG. 25B). Therefore, it is necessary that the material of the wiring 2374 which also has a function of the current-collecting thin film of the thin-film secondary battery has high adhesion to the negative electrode active material layer and also has low resistance. In particular, aluminum, copper, nickel, vanadium, or the like is preferably used.

Subsequently, the structure of the thin-film secondary battery is described. A negative electrode active material layer 2391 is formed over the wiring 2374. In general, vanadium oxide ($V_2O_5$) or the like is used. Next, a solid electrolyte layer 2392 is formed over the negative electrode active material layer 2391. In general, lithium phosphate ($Li_3PO_4$) or the like is used. Next, a positive electrode active material layer 2393 is formed over the solid electrolyte layer 2392. In general, lithium manganate ($LiMn_2O_4$) or the like is used. Lithium cobaltate ($LiCoO_2$) or lithium nickel oxide ($LiNiO_2$) can also be used. Next, a current-collecting thin film 2394 to serve as an electrode is formed over the positive electrode active material layer 2393. It is necessary that the current-collecting thin film 2394 has high adhesion to the positive electrode active material layer 2393 and also has low resistance. For example, aluminum, copper, nickel, vanadium, or the like can be used.

Each of the above-described thin layers of the negative electrode active material layer 2391, the solid electrolyte layer 2392, the positive electrode active material layer 2393, and the current-collecting thin film 2394 may be formed by a sputtering technique or a vapor-deposition technique. In addition, the thickness of each layer is preferably 0.1 to 3 μm.

Next, an interlayer film 2396 is formed by application of a resin. The interlayer film 2396 is etched to form a contact hole. The interlayer film is not limited to a resin, and other films such as a CVD oxide film may also be used; however, a resin is preferably used in terms of flatness. In addition, the contact hole may be formed without using etching, but using a photosensitive resin. Next, a wiring layer 2395 is formed over the interlayer film 2396 and connected to the wiring 2397. Thus, an electrical connection between the thin-film secondary battery and the transistor is secured.

With the above-described structure, the power storage device of the present invention can have a structure in which transistors are formed using a single crystal substrate and a thin-film secondary battery is formed thereover. Thus, the power storage device of the present invention can be provided as a thin, compact, and flexible power storage device.

This embodiment can be implemented in combination with the technical components of the above-described embodiment modes and other embodiment. That is, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of storage power devices are charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

Embodiment 4

In this embodiment, an example of a method for manufacturing a power storage device, which differs from that described in Embodiment Mode 3 will be explained with reference to drawings. In this embodiment mode, a structure in which an antenna, a power supply portion, a charging determination portion, and a battery are formed over the same substrate will be explained. It is to be noted that when an antenna, a power supply portion, a charging determination portion, and a battery are formed over a substrate at a time, and also when transistors formed over a single crystal substrate are used as the transistors included in the power supply portion and the charging determination portion, a power storage device having transistors with few characteristic variations can be formed, which is advantageous. In addition, in this embodiment, an example is explained where the thin-film secondary battery described in the above-described embodiment is used as the battery in the power supply portion.

Figure 26A:
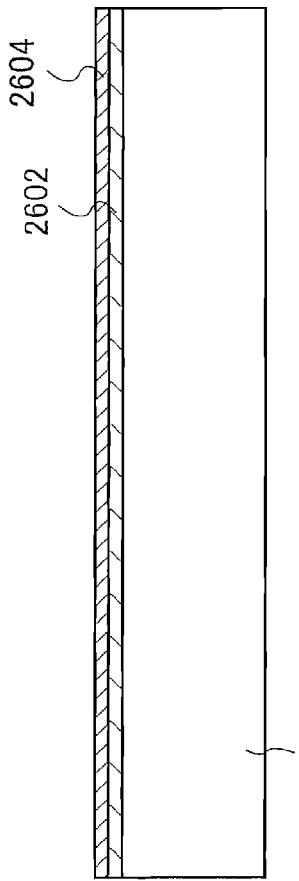
FIGS. 26A to 26C are diagrams each explaining a structure of Embodiment 4.

First, an insulating film is formed over a substrate 2600. Here, a single crystal Si having n-type conductivity is used as the substrate 2600, and insulating films 2602 and 2604 are formed over the substrate 2600 (see FIG. 26A). For example, silicon oxide ($SiO_x$) is formed as the insulating film 2602 by application of heat treatment to the substrate 2600, and then silicon nitride ($SiN_x$) is formed over the insulating film 2602 by a CVD method.

Any substrate can be used as the substrate 2600 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by IMplanted OXygen), or the like can be used.

Alternatively, after forming the insulating film 2602, the insulating film 2604 may be formed by nitridation of the insulating film 2602 by high-density plasma treatment. It is to be noted that the insulating film provided over the substrate 2600 may have a single-layer structure or a stacked structure of three or more layers.

Figure 26B:
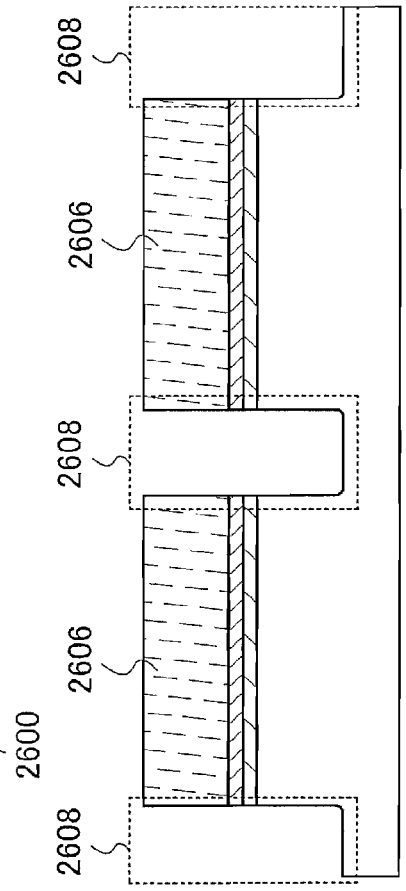

Next, patterns of a resist mask 2606 are selectively formed over the insulating film 2604, and selective etching is performed using the resist mask 2606 as a mask, so that recessed portions 2608 are selectively formed in the substrate 2600 (see FIG. 26B). For the etching of the substrate 2600 and the insulating films 2602 and 2604, plasma dry etching can be used.

Figure 26C:
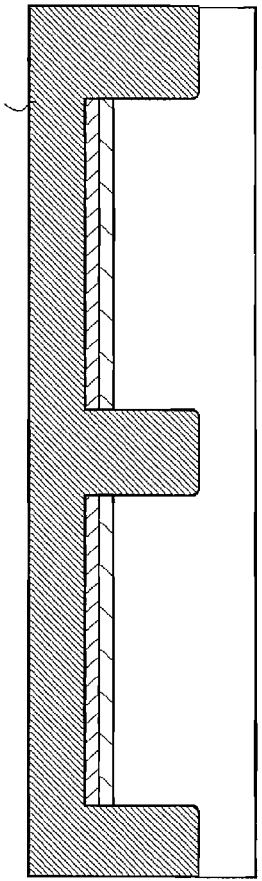

Next, the patterns of the resist mask 2606 are removed, and then an insulating film 2610 is formed so as to fill the recessed portions 2608 formed in the substrate 2600 (see FIG. 26C).

The insulating film 2610 is formed of an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. Here, a silicon oxide film is formed by an atmospheric pressure CVD method or a low-pressure CVD method using a TEOS (tetraethyl orthosilicate) gas.

Next, the surface of the substrate 2600 is exposed by grinding treatment or polishing treatment such as CMP (Chemical Mechanical Polishing). Here, by exposure of the surface of the substrate 2600, regions 2612 and 2613 are formed between insulating films 2611 which are formed in the recessed portions 2608 of the substrate 2600. It is to be noted that by the insulating film 2610 formed over the surface of the substrate 2600 is removed by grinding treatment or polishing treatment such as CMP, so that the insulating films 2611 are obtained. Subsequently, by selective introduction of a p-type impurity element, a p well 2615 is formed in the region 2613 of the substrate 2600 (see FIG. 27A).

As a p-type impurity element, boron (B), aluminum (Al), gallium (Ga), or the like can be used. Here, boron (B) is introduced into the region 2613 as the impurity element.

It is to be noted that, in this embodiment, although the region 2612 is not doped with an impurity element because an n-type semiconductor substrate is used as the substrate 2600, an n well may be formed in the region 2612 by introduction of an n-type impurity element. As an n-type impurity element, phosphorus (P), arsenic (As), or the like can be used.

When a p-type semiconductor substrate is used, on the other hand, a structure may be used in which the region 2612 is doped with an n-type impurity element to form an n well, whereas the region 2613 is not doped with an impurity element.

Next, insulating films 2632 and 2634 are formed over the surfaces of the regions 2612 and 2613 in the substrate 2600, respectively (see FIG. 27B).

For example, surfaces of the regions 2612 and 2613 provided over the substrate 2600 are oxidized by heat treatment, so that the insulating films 2632 and 2634 can be formed of a silicon oxide film. Alternatively, the insulating films 2632 and 2634 can be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 2632 and 2634 may be formed by plasma treatment as described above. For example, the insulating films 2632 and 2634 can be formed using a silicon oxide ($SiO_x$) film or a silicon nitride ($SiN_x$) film which is obtained by application of high-density plasma oxidation or high-density nitridation treatment to the surfaces of the regions 2612 and 2613 provided in the substrate 2600. In addition, after application of high-density plasma oxidation treatment to the surfaces of the regions 2612 and 2613, high-density plasma nitridation treatment may be conducted. In that case, silicon oxide films are formed on the surfaces of the regions 2612 and 2613 and then silicon oxynitride films are formed on the silicon oxide films. Thus, the insulating films 2632 and 2634 are each formed to have a stacked structure of the silicon oxide film and the silicon oxynitride film. In addition, after silicon oxide films are formed on the surfaces of the regions 2612 and 2613 by a thermal oxidation method, and then high-density plasma oxidation treatment or high-density plasma nitridation treatment may be performed to the silicon oxide films.

It is to be noted that the insulating films 2632 and 2634 formed over the regions 2612 and 2613 of the substrate 2600 respectively function as the gate insulating films of transistors which are completed later.

Next, a conductive film is formed so as to cover the insulating films 2632 and 2634 which are formed over the regions 2612 and 2613 provided in the substrate 2600, respectively (see FIG. 27C). Here, an example is shown where conductive films 2636 and 2638 are sequentially stacked as the conductive film. Needless to say, the conductive film may be formed to have a single layer or a stacked structure of three or more layers.

As a material of the conductive films 2636 and 2638, an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its main component can be used. Alternatively, a metal nitride film obtained by nitridation of the element can also be used. Furthermore, a semiconductor material typified by polycrystalline silicon doped with an impurity element such as phosphorus can also be used.

Here, a stacked structure is employed in which the conductive film 2636 is formed using tantalum nitride and the conductive film 2638 is formed thereover using tungsten. Alternatively, it is also possible to form the conductive film 2636 using a single-layer film or a stacked film of tungsten nitride, molybdenum nitride, and/or titanium nitride and form the conductive film 2638 using a single-layer film or a stacked film of tantalum, molybdenum, and/or titanium.

Next, the stacked conductive films 2636 and 2638 are selectively removed by etching, so that the conductive films 2636 and 2638 remain above part of the regions 2612 and 2613 of the substrate 2600. Thus, conductive films 2640 and 2642 functioning as gate electrodes are formed (see FIG. 28A). Here, surfaces of the regions 2612 and 2613 of the substrate 2600 which does not overlap with the conductive films 2640 and 2642 respectively are exposed.

Specifically, in the region 2612 of the substrate 2600, a part of the insulating film 2632 formed below the conductive film 2640, which does not overlap with the conductive film 2640, is selectively removed, so that the ends of the conductive film 2640 and the ends of the insulating film 2632 approximately correspond to each other. In addition, in the region 2613 of the substrate 2600, a part of the insulating film 2634 formed below the conductive film 2642, which does not overlap with the conductive film 2642, is selectively removed, so that the ends of the conductive film 2642 and the ends of the insulating film 2634 approximately correspond to each other.

In this case, the part of the insulating films or the like which do not overlap with the conductive films 2640 and 2642 may be removed at the same time as the formation of the conductive films 2640 and 2642. Alternatively, the part of the insulating films which do not overlap with the conductive films 2640 and 2642 may be removed using resist masks which are left after the formation of the conductive films 2640 and 2642 as masks, or using the conductive films 2640 and 2642 as masks.

Then, the regions 2612 and 2613 of the substrate 2600 are selectively doped with an impurity element (see FIG. 28B). Here, a region 2650 is selectively doped with an n-type impurity element at low concentration, using the conductive film 2642 as a mask, whereas a region 2648 is selectively doped with a p-type impurity element at low concentration, using the conductive film 2640 as a mask. As an n-type impurity element, phosphorus (P), arsenic (As), or the like can be used. As a p-type impurity element, boron (B), aluminum (Al), gallium (Ga), or the like can be used.

Next, sidewalls 2654 which are in contact with the side surfaces of the conductive films 2640 and 2642 are formed. Specifically, the sidewalls are formed of a single layer or a stacked layer of a film containing an inorganic material such as silicon, silicon oxide, or silicon nitride, or an insulating film such as a film containing an organic material such as an organic resin. Then, the insulating film is selectively etched by anisotropic etching mainly in the perpendicular direction, so that the sidewalls 2654 can be formed so as to be in contact with the side surfaces of the conductive films 2640 and 2642. The sidewalls 2640 are used as doping masks for forming LDD (Lightly Doped Drain) regions. In addition, here, the sidewalls 2654 are formed to be in contact with the insulating films formed below the conductive films 2640 and 2642 and the side surfaces of the conductive films 2640 and 2642.

Next, the regions 2612 and 2613 of the substrate 2600 are doped with an impurity element, using the sidewalls 2654 and the conductive films 2640 and 2642 as masks, so that impurity regions which function as source and drain regions are formed (see FIG. 28C). Here, the region 2613 of the substrate 2600 is doped with an n-type impurity element at high concentration, using the sidewalls 2654 and the conductive film 2642 as masks, whereas the region 2612 is doped with a p-type impurity element at high concentration, using the sidewalls 2654 and the conductive film 2640 as masks.

As a result, impurity regions 2658 which form source and drain regions, low concentration impurity regions 2660 which form LDD regions, and a channel formation region 2656 are formed in the region 2612 of the substrate 2600. Meanwhile, impurity regions 2664 which form source and drain regions, low concentration impurity regions 2666 which form LDD regions, and a channel formation region 2662 are formed in the region 2613 of the substrate 2600.

It is to be noted that in this embodiment, the impurity elements are introduced under the condition that parts of the regions 2612 and 2613 of the substrate 2600 which do not overlap with the conductive films 2640 and 2642 respectively are exposed. Accordingly, the channel formation regions 2656 and 2662 which are formed in the regions 2612 and 2613 of the substrate 2600 respectively can be formed in a self-aligned manner with respect to the conductive films 2640 and 2642.

Next, a second insulating film 2677 is formed so as to cover the insulating films, the conductive films, and the like which are provided over the regions 2612 and 2613 of the substrate 2600, and openings 2678 are formed in the second insulating film 2677 (see FIG. 17A).

The second insulating film 2677 can be formed of a single layer or a stacked layer of an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. Further alternatively, a fluoro group and an organic group containing at least hydrogen may be used as the substituent.

Next, conductive films 2680 are formed in the openings 2678 by a CVD method. Then, conductive films 2682a to 2682d are selectively formed over the insulating film 2677 so as to be electrically connected to the conductive films 2680 (see FIG. 17B).

The conductive films 2680 and 2682a to 2682d are formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, a material which contains aluminum as its main component and also contains nickel, or a material which contains aluminum as its main component and also contains nickel and one or both of carbon and silicon. For example, each of the conductive films 2680 and 2682a to 2682d is preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are the most suitable material for forming the conductive films 2680 and 2682a to 2682d because they have high resistance values and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the conductive film 2680 and 2682a to 2682d, and the crystalline semiconductor film can be obtained. Here, the conductive films 2680 and 2682a to 2682d can be formed by selective growth of tungsten (W) by a CVD method.

Through the above steps, a p-channel transistor formed in the region 2612 of the substrate 2600 and an n-channel transistor knitted in the region 2613 of the substrate 2600 can be obtained.

It is to be noted that the structure of the transistor of the present invention is not limited to the one shown in the drawings. For example, a transistor with an inversely staggered structure, a FinFET structure, or the like can be used. A FinFET structure is preferable because it can suppress a short channel effect which occurs with reduction in transistor size.

The power storage device of the present invention is provided with a battery. As the battery, the thin-film secondary battery shown in the above-described embodiment is preferably used. In this embodiment, a connection between the transistor formed in this embodiment and a thin-film secondary battery will be described.

In this embodiment, a thin-film secondary battery is stacked over the conductive film 2682d connected to the transistor. The thin-film secondary battery has a structure in which a current-collecting thin film, a negative electrode active material layer, a solid electrolyte layer, a positive electrode active material layer, and a current-collecting thin film are sequentially stacked (see FIG. 17B). Therefore, it is necessary that the material of the conductive film 2682d which is also the material of the current-collecting thin film of the thin-film secondary battery has high adhesion to the negative electrode active material layer and also has low resistance. In particular, aluminum, copper, nickel, vanadium, or the like is preferably used.

Subsequently, the structure of the thin-film secondary battery is described. A negative electrode active material layer 2691 is formed over the conductive film 2682d. In general, vanadium oxide ($V_2O_5$) or the like is used. Next, a solid electrolyte layer 2692 is formed over the negative electrode active material layer 2691. In general, lithium phosphate ($Li_3PO_4$) or the like is used. Next, a positive electrode active material layer 2693 is formed over the solid electrolyte layer 2692. In general, lithium manganate ($LiMn_2O_4$) or the like is used. Lithium cobaltate ($LiCoO_2$) or lithium nickel oxide ($LiNiO_2$) can also be used. Next, a current-collecting thin film 2694 to serve as an electrode is formed over the positive electrode active material layer 2693. It is necessary that the current-collecting thin film 2694 has high adhesion to the positive electrode active material layer 2693 and also has low resistance. For example, aluminum, copper, nickel, vanadium, or the like can be used.

Each of the above-described thin layers of the negative electrode active material layer 2691, the solid electrolyte layer 2692, the positive electrode active material layer 2693, and the current-collecting thin film 2694 may be formed by a sputtering technique or a vapor-deposition technique. In addition, the thickness of each layer is preferably 0.1 to 3 µm.

Next, an interlayer film 2696 is formed by application of a resin. The interlayer film 2696 is etched to form a contact hole. The interlayer film 2696 is not limited to a resin, and other films such as a CVD oxide film may also be used; however, a resin is preferably used in terms of flatness. In addition, the contact hole may be formed without using etching, but using a photosensitive resin. Next, a wiring layer 2695 is formed over the interlayer film 2696 and is connected to the wiring 2697. Thus, an electrical connection between the thin-film secondary battery and the transistor is obtained.

With the above-described structure, the power storage device of the present invention can have a structure in which transistors are formed using a single crystal substrate and a thin-film secondary battery is formed thereover. Thus, the power storage device of the present invention can be provided as a thin, compact, and flexible power storage device.

This embodiment can be implemented in combination with the technical components of the above-described embodiment modes and other embodiment. That is, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

Embodiment 5

In this embodiment, application of the power storage device of the present invention in which a battery is charged by radio signals. The power storage device of the present invention can be applied to, for example, electronic devices such as digital video cameras, computers, portable information terminals (e.g., mobile computers, portable telephones, portable game machines, or e-book readers), or image reproducing devices provided with recording media (specifically, a device which reproduces the content of a recording medium such as a digital versatile disc (DVD) and which has a display for displaying the reproduced image), or so-called IC labels, IC tags, or IC cards which are attached to bills, coins, securities, bearer bonds, certificates (e.g., drivers' licenses or residents' cards), packaging containers (e.g., wrapping paper or plastic bottles), recording media (e.g., DVD software or video tapes), means of transportation (e.g., bicycles), personal belongings (e.g., bags or glasses), foods, plants, animals, human bodies, clothes, daily articles, or electronic appliances.

It is to be noted that in this specification, an "IC card" refers to a card which is formed by embedding a thin semiconductor integrated circuit (an IC chip) in a plastic card so as to store data. IC cards can be classified into a "contact type" or a "non-contact type" depending on the method of reading/writing data. A non-contact type card has a built-in antenna and can communicate with a terminal, utilizing a weak electromagnetic wave. In addition, an IC tag refers to a small IC chip used for identification of objects, which stores data such as its own identification code, and is capable of communicating data with a management system via an electromagnetic wave. The IC tag has a size of several tens of millimeters and can communicate with a reader via an electromagnetic wave. An IC tag of the present invention that is applied to an RFID which performs wireless data communication can be used in various applications such as card-form objects, labels (called IC labels), or certificates.

In this embodiment, examples is explained in which an RFID having the power storage device of the present invention is applied to an IC label, an IC tag, or an IC card, and some examples of products having the IC label, the IC tag, or the IC card.

FIG. 16A illustrates an example of an IC label with a built-in RFID which includes the power storage device of the present invention. A plurality of IC labels 3003 with a built-in RFID 3002 is formed on a label sheet (separate sheet) 3001. The IC labels 3003 are stored in a box 3004. In addition, information on a product or service related to them (e.g., product names, brands, trademarks, owners of the trademarks, sellers, and manufacturers) are written on the IC label 3003, while an ID number that is unique to the product (or the kind of the product) is assigned to the built-in RFID in order to easily figure out forgery, infringement of intellectual property rights such as trademarks and patents, and illegality such as unfair competition. In addition, a large volume of information that cannot be written on a container of the product or the label, for example, the production area, selling area, quality, raw material, efficacy, intended use, quantity, shape, price, production method, directions for use, time of the production, time of the use, expiration date, instructions of the product, information on the intellectual property of the product and the like can be input into the RFID, so that traders and consumers can access the information using a simple reader. Although producers can easily rewrite or delete the information, traders and consumers are not allowed to rewrite or delete the information.

FIG. 16B shows a label-form IC tag 3011 with a built-in RFID 3012 which includes the power storage device of the present invention. The IC tag 3011 is attached to a product, so that management of the product becomes easier. For example, when a product is stolen, the stealer can be easily found out by follow of a path of the product. In this manner, by provision of IC tags on products, products that are highly traceable can be distributed in the market. In addition, in the present invention, the IC tag employs a structure provided with a thin-film secondary battery or a high-capacity capacitor as a battery. Therefore, the present invention is effective even when attached to a product with a curved shape as shown in FIG. 16B.

FIG. 16C shows an example of a completed product of an IC card 3021 with a built-in RFID 3022 provided with the power storage device of the present invention. As the IC card 3021, various kinds of cards can be used, such as cash cards, credit cards, prepaid cards, electronic tickets, electronic money, telephone cards, and membership cards.

It is to be noted that in the IC card shown in FIG. 16C which is provided with the power storage device of the present invention, a thin-film secondary battery or a high-capacity capacitor can be used as a battery. Therefore, the present invention is quite effective because it can be used even when bent as shown in FIG. 16D.

FIG. 16E shows a completed product of a bearer bond 3031. The bearer bond 3031 is embedded with an RFID 3032 provided with the power storage device of the present invention, and the periphery of the RFID 3032 is covered with a resin, so that the RFID is protected. Here, a filler is dispersed in the resin. The bearer bond 3031 can be formed in the same way as IC labels, IC tags, and IC cards of the present invention. It is to be noted that the bearer bonds include stamps, tickets, admission tickets, merchandise coupons, book coupons, stationery coupons, beer coupons, rice coupons, various gift coupons, various service coupons, and the like. However, needless to say, the present invention is not limited to these. In addition, when the RFID 3032 of the present invention is provided in bills, coins, securities, bearer bonds, certificates, or the like, an authentication function can be provided. With the authentication function, forgery can be prevented.

As described above, the RFID provided with the power storage device of the present invention can be provided for any objects (including creatures).

This embodiment can be implemented in combination with technical components of the above-described embodiment modes and other embodiment. That is, the power storage device of the present invention employs the structure with the power storage means; therefore, electric power can be supplied to the load without checking remaining capacity of the battery or changing batteries with deterioration over time of the battery for drive power supply voltage. In addition, the power storage device of the present invention is provided with the circuit that responds to the power feeder that supplies an electromagnetic wave for charging the battery whether the power storage device is in a charging state or a non-charging state; therefore, when charging of the power storage device is completed or the charging thereof is interrupted due to some cause, unnecessary supply of electric power by an electromagnetic wave can be stopped. Moreover, the power storage device is provided with the circuit that responds to the power feeder whether the power storage device is in a charging state or a non-charging state, so that the circuit can inform that a plurality of power storage devices is charged by the power feeder, and a power storage device to be charged can be selected to perform charging. That is, even when charging of a plurality of power storage devices is not sufficiently performed due to electromagnetic wave attenuation, the plurality of power storage devices can be separately charged. Furthermore, since the power storage device of the present invention is provided with the counter circuit inside, the power storage device can receive an electromagnetic wave with a certain amount or more of electric field intensity, magnetic field intensity, or power flux density even if the average of electric power is the same.

This application is based on Japanese Patent Application serial no. 2006-236229 filed in Japan Patent Office on Aug. 31, in 2006, the entire contents of which are hereby incorporated by reference.

What is claimed is:

1. A semiconductor device comprising:
   a conductive film;
   a power supply portion operationally connected to the conductive film;
   a flexible battery with a sheet-like form operationally connected to the power supply portion; and
   a counter circuit operationally connected to the power supply portion,
   wherein the power supply portion is configured to output electric power,
   wherein the flexible battery is configured to be input with the electric power output from the power supply portion,
   wherein the counter circuit counts charging time of the flexible battery, and
   wherein the counter circuit includes flip flop circuits.

2. The semiconductor device according to claim 1, wherein the conductive film is an antenna.

3. The semiconductor device according to claim 1, wherein the power supply portion includes a rectifier circuit that rectifies an electromagnetic wave being input to the conductive film.

4. The semiconductor device according to claim 1, wherein the power supply portion includes a rectifier circuit and a charging control circuit, and
   wherein the charging control circuit is configured to output the electric power.

5. The semiconductor device according to claim 1, wherein the power supply portion includes a power supply circuit, and
   wherein the power supply circuit controls a voltage level of an electric signal being output from the flexible battery.

6. The semiconductor device according to claim 1, further comprising a sheet material,
   wherein the conductive film, the power supply portion, the flexible battery, and the counter circuit are provided over the sheet material.

7. The semiconductor device according to claim 6, wherein the sheet material comprises a hot-melt film.

8. The semiconductor device according to claim 6, wherein the sheet material is an antistatic film.

9. A semiconductor device comprising:
   a conductive film;
   a rectifier circuit operationally connected to the conductive film;
   a determination circuit operationally connected to the conductive film;
   a flexible battery with a sheet-like form;
   a counter circuit operationally connected to the rectifier circuit and the determination circuit, and
   wherein the determination circuit determines whether the flexible battery is in a charging state or in a non-charging state in accordance with a signal being input from the conductive film and outputs a signal for switching the charging state and the non-charging state,
   wherein the counter circuit counts charging time of the flexible battery and outputs the counted time to the determination circuit.

10. The semiconductor device according to claim 9, wherein the conductive film is an antenna.

11. The semiconductor device according to claim 9, further comprising:
    a power supply circuit operationally connected to the flexible battery, and
    wherein the power supply circuit controls a voltage level of an electric signal being output from the flexible battery.

12. The semiconductor device according to claim 9, wherein the counter circuit includes flip flop circuits.

13. The semiconductor device according to claim 9, further comprising:
   a modulation circuit operationally connected to the conductive film, and
   wherein the modulation circuit modulates a signal to be output to an external portion in accordance with the charging state or the non-charging state determined by the determination circuit.

14. The semiconductor device according to claim 9, further comprising a sheet material,
   wherein the conductive film, the rectifier circuit, the determination circuit, the flexible battery, and the counter circuit are provided over the sheet material.

15. The semiconductor device according to claim 14, wherein the sheet material comprises a hot-melt film.

16. The semiconductor device according to claim 14, wherein the sheet material is an antistatic film.

* * * * *